United States Patent
Inoue et al.

(10) Patent No.: US 6,344,283 B1
(45) Date of Patent: Feb. 5, 2002

(54) ORGANIC ELECTROLUMINESCENT ELEMENTS

(75) Inventors: Tetsushi Inoue; Junji Aotani; Tetsuji Fujita; Hiroyuki Endo, all of Chiba (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/125,791

(22) PCT Filed: Dec. 26, 1997

(86) PCT No.: PCT/JP97/04904
§ 371 Date: Aug. 28, 1998
§ 102(e) Date: Aug. 28, 1998

(87) PCT Pub. No.: WO98/30071
PCT Pub. Date: Jul. 9, 1998

(30) Foreign Application Priority Data

Dec. 28, 1996 (JP) .............................................. 8-358416

(51) Int. Cl.$^7$ ............................................... H05B 33/12
(52) U.S. Cl. ........................ 428/690; 428/704; 428/917; 313/504; 313/506
(58) Field of Search ................................ 428/690, 704, 428/917; 313/504, 506

(56) References Cited

U.S. PATENT DOCUMENTS

| | | | |
|---|---|---|---|
| 4,720,432 A | | 1/1988 | Vanslyke et al. ........... 428/457 |
| 5,281,489 A | * | 1/1994 | Mori et al. .................. 428/690 |
| 5,792,597 A | | 8/1998 | Kawai ........................ 430/363 |

FOREIGN PATENT DOCUMENTS

| | | | |
|---|---|---|---|
| EP | A1 0 439 627 | | 8/1991 |
| EP | 0 517 542 A1 | * | 12/1992 |
| EP | 0 650 955 A1 | * | 5/1995 |
| JP | A 62-267749 | | 11/1987 |
| JP | A 4-308688 | | 10/1992 |
| JP | A 5-53349 | | 3/1993 |
| JP | A 6-203963 | | 7/1994 |
| JP | A 7-57875 | | 3/1995 |
| JP | B2 7-110940 | | 11/1995 |
| JP | A 8-48656 | | 2/1996 |
| JP | A 8-193191 | | 7/1996 |

* cited by examiner

Primary Examiner—Marie Yamnitzky
(74) Attorney, Agent, or Firm—Oblon, Spivak, McClelland, Maier & Neustadt, P.C.

(57) ABSTRACT

An organic EL device comprising a cathode, an anode, and at least one organic compound layer containing an organic compound represented by formula (I):

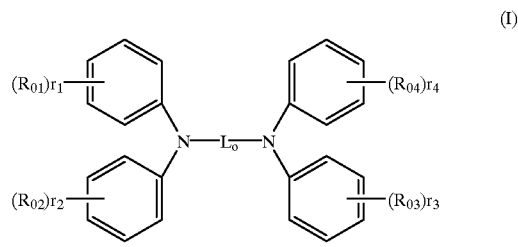

where $L_0$ is any one of o-, p-, and m-phenylene groups which have two, three or four rings and which have a substituent with the proviso that when $L_0$ is a phenylene group having four rings, the phenylene group may have an unsubstituted or substituted aminophenyl group somewhere therein, and at least one of $R_{01}$, $R_{02}$, $R_{03}$ and $R_{04}$ is any one of the following groups:

where $R_1$, $R_{12}$, $R_{13}$, $R_{14}$, $R_{15}$, $R_{16}$ and $R_{17}$ are each a substituted or unsubstituted aryl group, and $r_1$, $r_2$, $r_3$ and $r_4$ are each an integer of 0 to 5 with the proviso that $r_1 + r_2 + r_3 + r_4 \geq 1$.

10 Claims, 20 Drawing Sheets

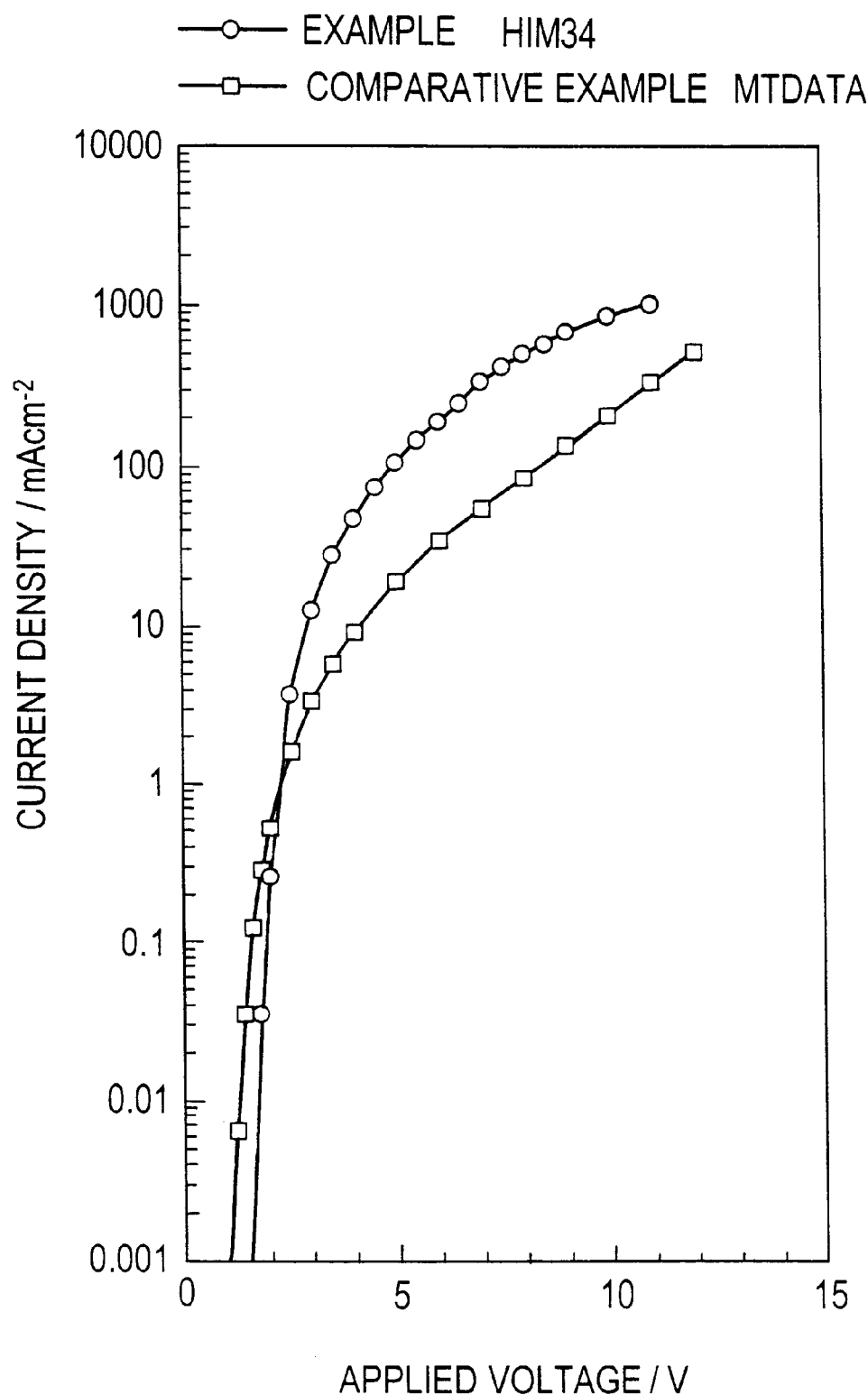

ORGANIC ELECTROLUMINESCENT ELEMENTS

TECHNICAL FIELD

The present invention relates generally to an organic EL (electroluminescent) device, and specifically to a device which emits light upon the application of an electric field to a thin film of multilayered structure. More specifically, the present invention is concerned with an organic electroluminescent light emission device including a hole injecting layer comprising a specific triarylamine polymer, so that low driving voltage, stable light emission, high quality display images and high heat resistance are achievable.

BACKGROUND TECHNIQUE

An organic EL device comprises a thin film containing a fluorescent organic compound interleaved between an electron injecting electrode (cathode) and a hole injecting electrode (anode), and emits light making use of light emissions (fluorescence and phosphorescence) upon deactivation of excitons which are generated by injecting electrons and holes in the thin film for their recombination.

Features of the organic EL device are that surface light emission of high luminance of the order of hundreds candelas/$m^2$ to scores of thousands of candelas/$m^2$ is achievable at a low voltage of up to 10 V, and blue to red light emissions are achievable by selecting the type of fluorescent material.

On the other hand, problems with the organic EL device are that its light emission life is short, and its storage robustness and reliability are low for the following reasons.

(1) Physical Changes of Organic Compound

An inhomogeneous organic thin film interface caused as by the growth of crystal domains is responsible for a drop of the ability of the device to inject holes, short-circuiting, and dielectric breakdown. Especially when a low-molecular compound having a molecular weight of 500 or less is used, crystal grains manifest themselves and grow greatly, resulting in a strikingly reduced film property. When an organic thin film interface with ITO or the like is roughened, too, crystal grains manifest themselves and grow greatly, resulting in a light emission efficiency drop and current leakage which eventually lead to non-emission. This is also a leading cause of local non-emitting spots, i.e., dark spots.

(2) Oxidation and Delamination of Electron Injecting Electrode

To facilitate injection of electrons, for instance, Na, K, Li, Mg, Ca, and Al has so far used as a metal having a low work function. However, when these metals react with atmospheric moisture or oxygen or the organic layer peels off the electron injecting electrode, it is impossible to inject holes. Especially when a high-molecular compound is formed into film as by spin coating, solvent residues after film formation, moisture and decomposed products accelerate the oxidation reaction of the electrode, and causes the delamination of the electrode, resulting in local non-emitting spots.

(3) Low Light Emission Efficiency and Generation of Much Heat

The generation of heat is unavoidable because a current is passed through the organic compound and so the organic compound must be placed in a high field strength. The heat then gives rise to the melting, crystallization, and thermal decomposition of the organic compound, resulting in a deterioration and breakdown of the device.

(4) Photochemical, and Electrochemical Changes of Organic Compound Layer

Upon passing a current through the organic material, the organic material degrades, resulting in defects such as current or exciton traps. These defects in turn cause a deterioration of the device such as a driving voltage increase or a luminance drop Practical light emitting devices are used in various environments. Especially when such a device is used in high-temperature environments, the quality of display images drops or the device breaks down because of the crystallization or physical change of the organic compound or the rearrangement, i.e., migration, dispersion, etc. of the organic molecules.

A hole or electron injecting electrode interface that is an interface between an organic material and an inorganic material, especially the hole injecting electrode interface has a great influence on the film property of the organic material layer during film formation. In some cases, several problems arise; an inhomogeneous organic layer is formed on the hole injecting electrode, and no good interface can be formed.

For this reason, it has so far been reported to use on the hole injecting electrode interface in an organic EL device materials such as phthalocyanine, polyphenylene-vinylene, evaporated polythiophene film, and amine polymer. However, it is found that the use of phthalocyanine (U.S. Pat. No. 4,720,432 or JP-A 63-295695) is not preferable because it yields a device which can be well operated in an initial state, but dark spots, light emission variations, etc. manifest themselves while it is operated over an extended period. This is because the phthalocyanine accelerates the crystallization of a material placed thereon due to its own microcrystalline nature. For polyphenylene-vinylene, it is required to use a wet process such as spin coating wherein atmospheric impurities such as moisture are entrained therein, or ionic impurities such as leaving groups are entrained therein upon conversion from its precursor. Thus, the oxidation of the electrode proceeds rapidly, causing a striking luminance drop or a noticeable driving voltage increase.

Problems with the evaporated polythiophene film are that the reproducibility of fabrication of good devices is low due to large variations in the degree of polymerization of polythiophene and large fluctuations in polythiophene during evaporation, and the surface of ITO cannot be fully denatured due to difficulty involved in making polythiophene thick because the polythiophene itself has light absorption in a visible light region. Regarding amine polymers, for instance, dendrimer materials (JP-A 4-308688), tetraamine materials European Patent Application 0 439 627 and triamine materials (JP-A 8-193191) have been reported. However, it is found that sufficient heat resistance is not obtained, and that a homogeneous and stable film cannot be obtained on a hole injecting electrode during high-temperature storage.

DISCLOSURE OF THE INVENTION

It is one object of the invention to provide an organic EL device which uses an optical and electronic non-structural material particularly less susceptible to physical changes, photochemical changes and electrochemical changes, and can give out light emissions of various colors with high reliability and high light emission efficiency.

Another object of the invention is to provide an organic EL device comprising an organic thin film formed by an evaporation technique of a compound that has high amorphism and high compatibility with a hole injecting electrode, said organic EL device being free from a driving voltage increase or a luminance drop and a current leakage with neither development nor growth of local non-emitting spots while it is driven, and so being capable of emitting light with high luminance, and high reliability such as high heat resistance.

Yet another object of the invention is to provide an organic EL device using a multilayered film, said organic EL device comprising a hole injecting electrode or an organic material combined therewith, to which the optimum work function is imparted, and having high heat resistance.

A further object of the invention is to provide an organic EL device capable of having high Hole mobility and so obtaining much higher current density.

Such objects are achievable by the inventions defined below as (1) to (10).

(1) An organic EL device comprising organic compound layers, at least one of which has a skeleton represented by formula (I):

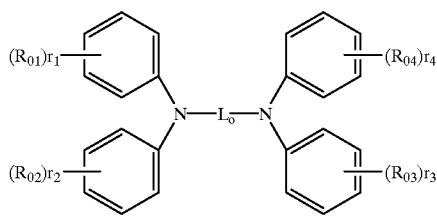

where $L_0$ is any one of o-, p-, and m-phenylene groups which have two, three or four rings and which may have a substituent with the proviso that when $L_0$ is a phenylene group having four rings, the phenylene group may have an unsubstituted or substituted aminophenyl group somewhere therein, $R_{01}$, $R_{02}$, $R_{03}$ and $R_{04}$ are each any one of the following groups:

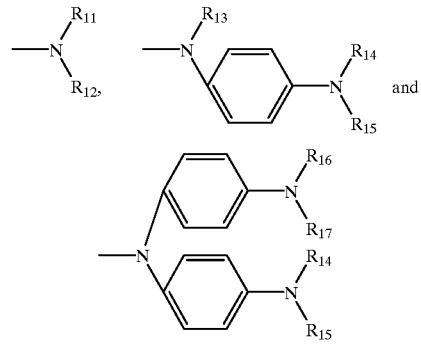

where $R_{11}$, $R_{12}$, $R_{13}$, $R_{14}$, $R_{15}$, $R_{16}$ and $R_{17}$ are each a substituted or unsubstituted aryl group, and $r_1$, $r_2$, $r_3$ and $r_4$ are each an integer of 0 to 5 with the proviso that $r_1+r_2+r_3+r_4 \geq 1$.

(2) The organic EL device of (1), wherein a set of phenylene groups represented by $L_0$ is a 4,4'-biphenylene group.

(3) An organic EL device comprising at least two organic compound layers, wherein the organic compound layer recited in (1) or (2) is an organic compound layer having a function of injecting and transporting holes.

(4) An organic EL device comprising three or more layers including at least an organic compound layer having a function of injecting holes and at least an organic compound layer having a function of transporting holes, wherein:

the organic compound layer recited in (1) or (2) is an organic compound layer having said function of injecting holes.

(5) The organic EL device of (3) or (4), wherein at least one layer of said organic compound layers includes a light emitting layer containing a hole transporting compound and an electron transporting compound.

(6) The organic EL device of (5), wherein said light emitting layer exists between the organic compound layer having a function of injecting holes and/or the organic compound layer having a function of transporting holes and the organic compound layer having a function of transporting electrons and/or an organic compound layer having a function of injecting electrons.

(7) An organic EL device comprising a hole injecting electrode, and including at least an organic compound layer having a function of injecting and transporting holes as recited in (3), an organic compound layer having a function of transporting holes, a light emitting layer, and an electron injecting electrode laminated on said hole injecting electrode in the described order.

(8) An organic EL device comprising a hole injecting electrode, and including at least an organic compound layer having a function of injecting holes as recited in (4), a light emitting layer, and an electron injecting electrode laminated on said hole injecting electrode in the described order.

(9) The organic EL device of any one of (3) to (8), wherein said organic compound layer having a function of injecting holes has a thickness of at least 100 nm.

(10) The organic EL device of any one of (5) to (9), wherein said layer containing said compound has a Hole mobility of at least $1.0 \times 10^{-3}$ cm$^2$/Vs.

ACTION AND EFFECT OF THE INVENTION

With the organic EL device of the invention wherein the compound represented by formula (I) is used for a hole injecting layer or a hole injecting and transporting layer, it is possible to achieve consistent and uniform light emission due to an improved thin film property. The organic EL device of the invention also remains stable or uncrystallized over a period of 1 year or longer in the air. The aforesaid compound is characterized by having in its molecular structure a phenylenediamine skeleton to optimize hole injection efficiency and a benzidine skeleton (biphenyldiamine) and a skeleton having diamines with respect to a plurality of phenylenes to improve Hole mobility. Further, the organic EL device of the invention can stand up to high-temperature driving, and can efficiently emit light at a low driving voltage and a small driving current. Furthermore, when the organic EL device of the invention is continuously driven, there is only a slight or limited increase in the driving voltage. It is here to be noted that the EL device of the invention has a light emission maximum wavelength of the order of 400 to 700 nm.

BRIEF DESCRIPTION OF THE DRAWINGS

FIG. 20 is a graph illustrative of the voltage vs. current density characteristics for HIM34 that is a hole injecting and transporting material according to the invention and MTDATA that is a conventional material.

BEST MODE FOR CARRYING OUT THE INVENTION

Figure 1:
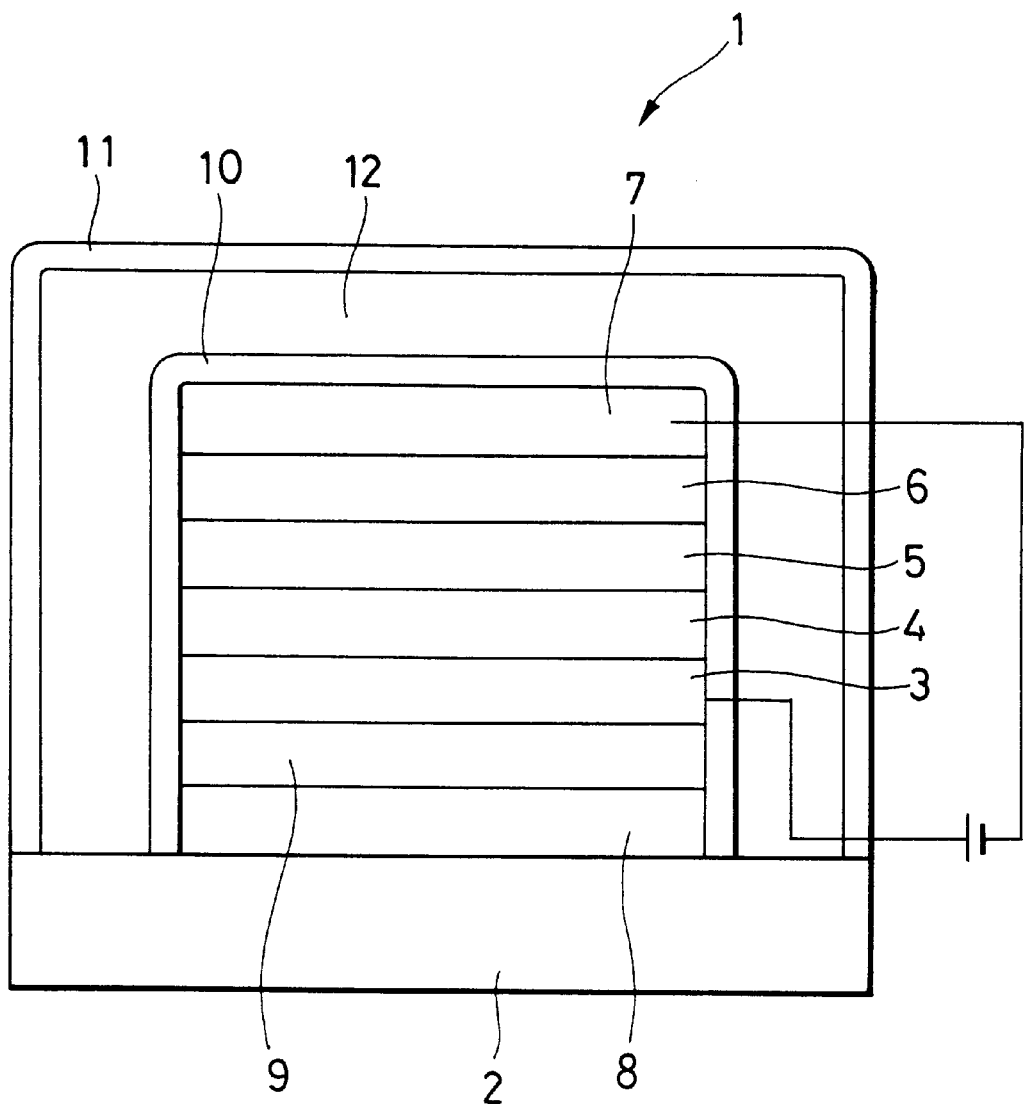
FIG. 1 is a general schematic illustrative of one exemplary architecture of the organic EL device of the invention.

The organic EL device of the invention comprises organic compound layers, at least one of which contains a compound having a skeleton represented by formula (1).

Referring now to formula (I), $L_0$ stands for a set of phenylene groups. Included in the set of phenylene groups represented by formula (I) are o-phenylene and/or p-phenylene and/or m-phenylene. These phenylene groups may have a substituent. For instance, a biphenylene group represented as a phenylene group having two rings may include 4,4'-biphenylene, 3,3'-biphenylene and 3,4'-biphenylene groups among which the 4,4'-biphenylene group is particularly preferred. A terphenylene group represented as a phenylene group having three rings may include o-, p- and m-terphenylene groups among which the p-terphenylene (4,4',4"-terphenylene) group is particularly preferred. A quaterphenylene group represented as a phenylene group having four rings may include o-, p- and m-quaterphenylene groups among which the p-quaterphenylene (4,4',4",4'''-quaterphenylene) group is particularly preferred. A phenylene group having four rings may have a substituted or unsubstituted phenylamino group somewhere therein. As the substituent in this case, the same substituents as mentioned in conjunction with the following $R_{11}$ and $R_{12}$ may be used.

$R_{01}$, $R_{02}$, $R_{03}$ and $R_{04}$ are each any one of the following groups:

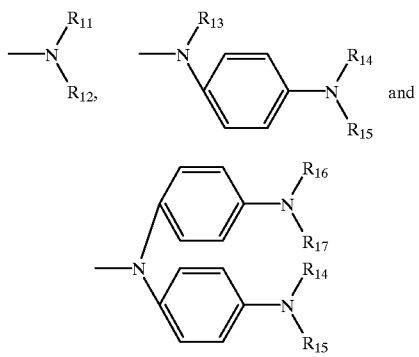

$R_{11}$, $R_{12}$, $R_{13}$, $R_{14}$, $R_{15}$, $R_{16}$ and $R_{17}$ are each a substituted or unsubstituted aryl group. The aryl groups represented by $R_{11}$, $R_{12}$, $R_{13}$, $R_{14}$, $R_{15}$, $R_{16}$ and $R_{17}$ may be a monocyclic or polycyclic aryl group, and have preferably 6 to 20 carbon atoms in all. For instance, phenyl, naphthyl, anthryl, phenanthryl, pyrenyl, perylenyl, o-biphenyl, m-biphenyl, and p-biphenyl groups are mentioned. These aryl groups may further be substituted by an alkyl group having 1 to 6 carbon atoms, an unsubstituted or substituted aryl or alkoxy group, an aryloxy group, and the following group:

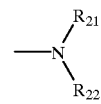

where $R_{21}$ and $R_{22}$ are each an unsubstituted or substituted aryl group.

The aryl group represented by $R_{21}$, and $R_{22}$ is preferably a monocyclic or polycyclic aryl group having 6 to 20 carbon atoms in all. For instance, phenyl, naphthyl, anthryl, phenanthryl, pyrenyl, perylenyl, o-biphenyl, m-biphenyl, and p-biphenyl groups are mentioned, with the phenyl group being most preferred. These aryl groups may have a substituent such as an alkyl group having 1 to 6 carbon atoms, and an unsubstituted or substituted aryl group. A methyl group is preferably mentioned for the alkyl group, and a phenyl group is preferably mentioned for the aryl group.

In the present disclosure, $r_1$, $r_2$, $r_3$, and $r_4$ represents an integer of preferably 0 to 5, especially 0, 1 and 2, and most especially 0 or 1. It is then preferred that $r_1+r_2+r_3+r4$ is at least 1, especially 1, 2, 3 or 4, and most especially 2, 3 or 4. $R_{01}$, $R_{02}$, $R_{03}$, and $R_{04}$ bonds to the meta- or para-position with respect to the N bond position; $R_{01}$, $R_{02}$, $R_{03}$ and $R_{04}$ may all bond to the meta-positions, $R_{01}$, $R_{02}$, $R_{03}$ and $R_{04}$ may all bond to the para-positions, or some of $R_{01}$, $R_{02}$, $R_{03}$ and $R_{04}$ may bond to the meta-positions while some may bond to the para-positions. When $r_1+r_2+r_3+r4$ is at least 2, $R_{01}$, $R_{02}$, $R_{03}$ and $R_{04}$ may be different from or identical with one another.

Preferable examples of such compounds are given by the following formulae (II) to (VII):

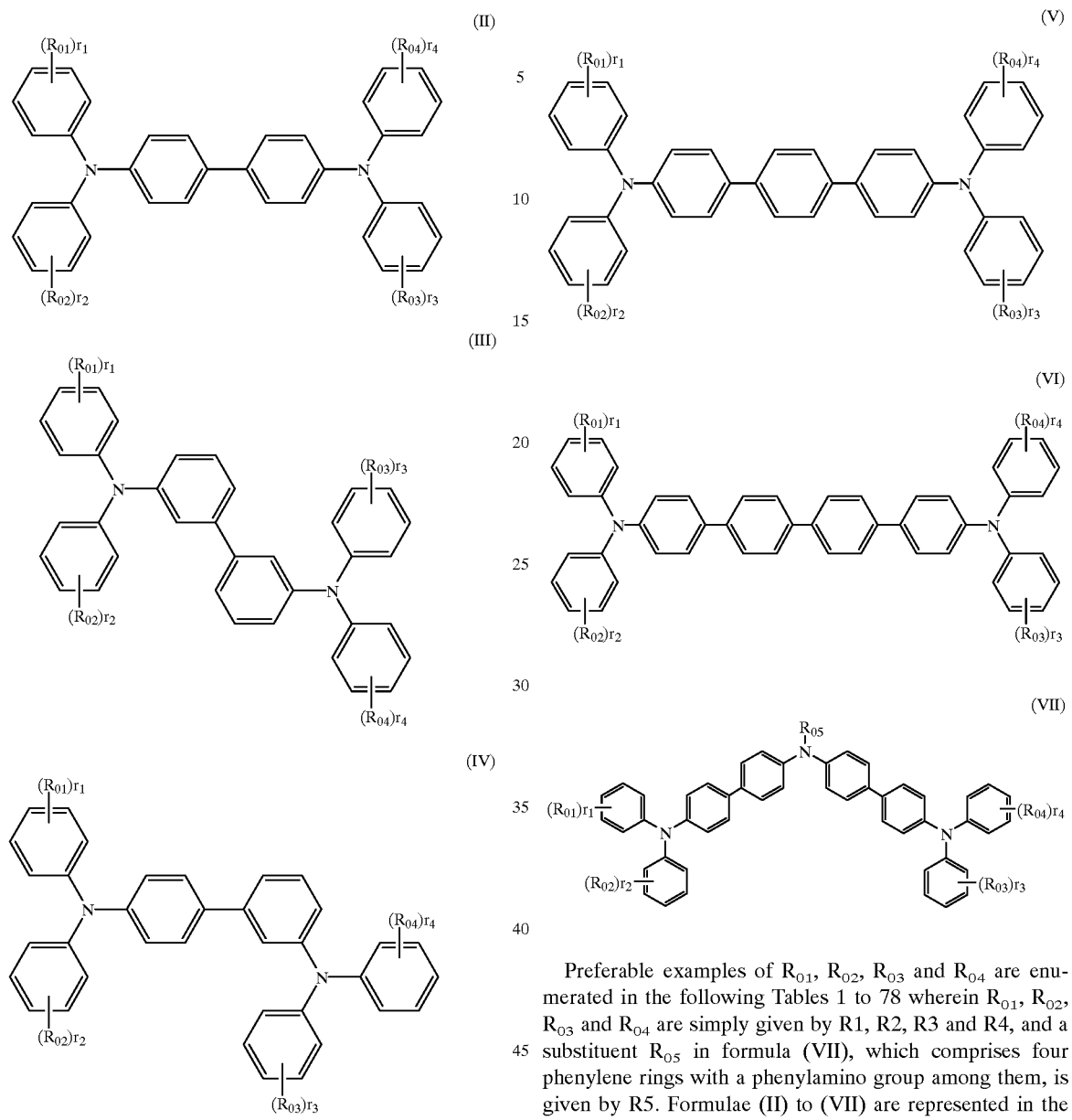

Preferable examples of $R_{01}$, $R_{02}$, $R_{03}$ and $R_{04}$ are enumerated in the following Tables 1 to 78 wherein $R_{01}$, $R_{02}$, $R_{03}$ and $R_{04}$ are simply given by R1, R2, R3 and R4, and a substituent $R_{05}$ in formula (VII), which comprises four phenylene rings with a phenylamino group among them, is given by R5. Formulae (II) to (VII) are represented in the form of general formulae.

TABLE 1

| Compound No. | General formula | $R_1$ | Substitution position | $R_2$ | $R_3$ | Substitution position | $R_4$ |
|---|---|---|---|---|---|---|---|
| 1 | (II) | (triphenylamine) | 4 | H— | (triphenylamine) | 4 | H— |

TABLE 1-continued
| Compound No. | General formula | R₁ | Substitution position | R₂ | R₃ | Substitution position | R₄ |
|---|---|---|---|---|---|---|---|
| 2 | (II) | 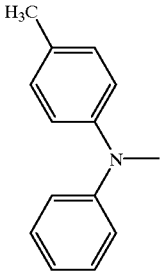 | 4 | H— | 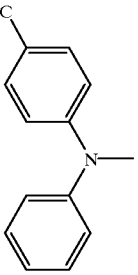 | 4 | H— |
| 3 | (II) | 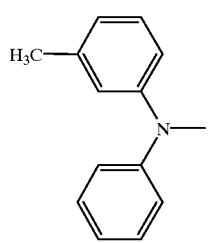 | 4 | H— | 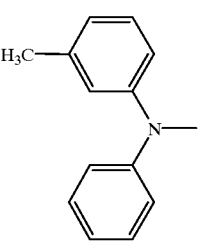 | 4 | H— |
| 4 | (II) | 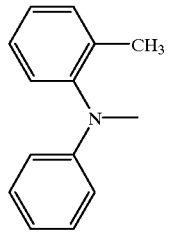 | 4 | H— | 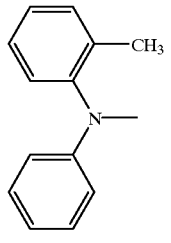 | 4 | H— |
| 5 | (II) | 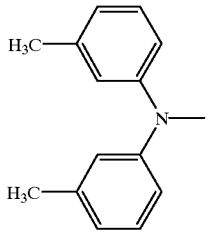 | 4 | H— | 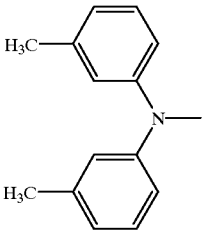 | 4 | H— |
| 6 | (II) | 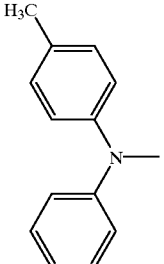 | 4 | H— | 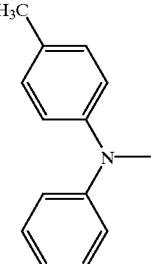 | 4 | H— |

TABLE 2

| Compound No. | General formula | R₁ | Substitution position | R₂ | R₃ | Substitution position | R₄ |
|---|---|---|---|---|---|---|---|
| 7 | (II) | N,N-bis(3-methylphenyl)(4-methylphenyl)amino group | 4 | H— | N,N-bis(3-methylphenyl)(4-methylphenyl)amino group | 4 | H— |
| 8 | (II) | N-(3-methylphenyl)-N-phenylamino group | 4 | H— | N-(4-methylphenyl)-N-phenylamino group | 4 | H— |
| 9 | (II) | N-(biphenyl-4-yl)-N-phenylamino group | 4 | H— | N-(biphenyl-4-yl)-N-phenylamino group | 4 | H— |
| 10 | (II) | N-(biphenyl-3-yl)-N-phenylamino group | 4 | H— | N-(biphenyl-3-yl)-N-phenylamino group | 4 | H— |
| 11 | (II) | N-(biphenyl-2-yl)-N-phenylamino group | 4 | H— | N-(biphenyl-2-yl)-N-phenylamino group | 4 | H— |

TABLE 2-continued

| Compound No. | General formula | R₁ | Substitution position | R₂ | R₃ | Substitution position | R₄ |
|---|---|---|---|---|---|---|---|
| 12 | (II) | N-(3-biphenylyl)(3-biphenylyl) | 4 | H— | N-(3-biphenylyl)(3-biphenylyl) | 4 | H— |

TABLE 3

| Compound No. | General formula | R₁ | Substitution position | R₂ | R₃ | Substitution position | R₄ |
|---|---|---|---|---|---|---|---|
| 13 | (II) | N-(4-biphenylyl)(4-biphenylyl) | 4 | H— | N-(4-biphenylyl)(4-biphenylyl) | 4 | H— |
| 14 | (II) | N-(3-biphenylyl)(4-biphenylyl) | 4 | H— | N-(3-biphenylyl)(4-biphenylyl) | 4 | H— |

TABLE 3-continued
| Compound No. | General formula | R₁ | Substitution position | R₂ | R₃ | Substitution position | R₄ |
|---|---|---|---|---|---|---|---|
| 15 | (II) | 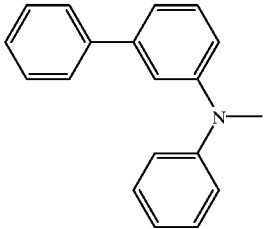 | 4 | H— | 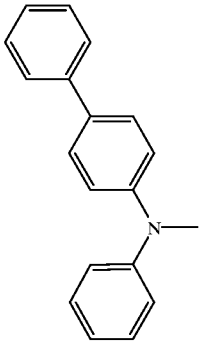 | 4 | H— |
| 16 | (II) | 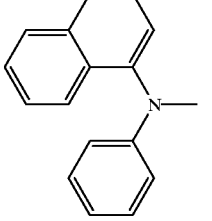 | 4 | H— | 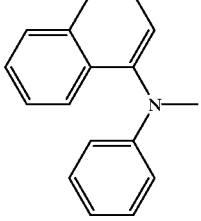 | 4 | H— |
| 17 | (II) | 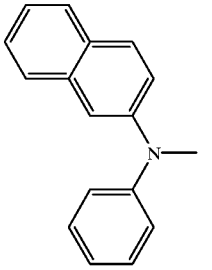 | 4 | H— | 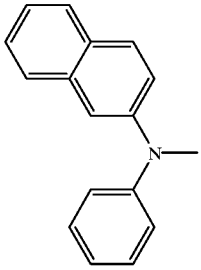 | 4 | H— |
| 18 | (II) | 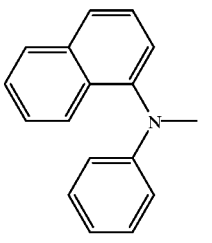 | 4 | H— | 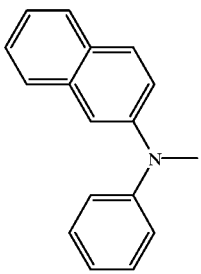 | 4 | H— |

TABLE 4

| Compound No. | General formula | R₁ | Substitution position | R₂ | R₃ | Substitution position | R₄ |
|---|---|---|---|---|---|---|---|
| 19 | (II) | 1,1'-dinaphthylamino | 4 | H— | 1,1'-dinaphthylamino | 4 | H— |
| 20 | (II) | 2,2'-dinaphthylamino | 4 | H— | 2,2'-dinaphthylamino | 4 | H— |
| 21 | (II) | 2,2'-dinaphthylamino | 4 | H— | 1,1'-dinaphthylamino | 4 | H— |
| 22 | (II) | N-phenyl-1-pyrenylamino | 4 | H— | N-phenyl-1-pyrenylamino | 4 | H— |

TABLE 4-continued

| Compound No. | General formula | R₁ | Substition position | R₂ | R₃ | Substition position | R₄ |
|---|---|---|---|---|---|---|---|
| 23 | (II) | [pyrenyl-N-phenyl group] | 4 | H— | [pyrenyl-N-phenyl group] | 4 | H— |
| 24 | (II) | [N,N-diphenyl-phenyl-N-phenyl group] | 4 | H— | [N,N-diphenyl-phenyl-N-phenyl group] | 4 | H— |

TABLE 5

| Compound No. | General formula | R₁ | Substition position | R₂ | R₃ | Substition position | R₄ |
|---|---|---|---|---|---|---|---|
| 25 | (II) | [N-phenyl-N-(4-methylphenyl)-phenyl-N-phenyl group] | 4 | H— | [N-phenyl-N-(4-methylphenyl)-phenyl-N-phenyl group] | 4 | H— |

TABLE 5-continued

| Compound No. | General formula | R₁ | Substitution position | R₂ | R₃ | Substitution position | R₄ |
|---|---|---|---|---|---|---|---|
| 26 | (II) | (structure: N-phenyl, N-(3-methylphenyl)amino-phenyl group with N-phenyl) | 4 | H— | (structure: N-phenyl, N-(3-methylphenyl)amino-phenyl group with N-phenyl) | 4 | H— |
| 27 | (II) | (structure: N-phenyl, N-(4-methylphenyl)amino-phenyl group with N-(4-methylphenyl)) | 4 | H— | (structure: N-phenyl, N-(4-methylphenyl)amino-phenyl group with N-(4-methylphenyl)) | 4 | H— |
| 28 | (II) | (structure: N-phenyl, N-(3-methylphenyl)amino-phenyl group with N-(3-methylphenyl)) | 4 | H— | (structure: N-phenyl, N-(3-methylphenyl)amino-phenyl group with N-(3-methylphenyl)) | 4 | H— |

TABLE 5-continued

| Compound No. | General formula | R₁ | Substition position | R₂ | R₃ | Substitution position | R₄ |
|---|---|---|---|---|---|---|---|
| 29 | (II) | (4-methylphenyl)(N-(4-methylphenyl))amino-phenyl-N-(4-methylphenyl) group | 4 | H— | (4-methylphenyl)(N-(4-methylphenyl))amino-phenyl-N-(4-methylphenyl) group | 4 | H— |

TABLE 6

| Compound No. | General formula | R₁ | Substition position | R₂ |
|---|---|---|---|---|
| 30 | (II) | phenyl-N-(phenyl)amino-phenyl-N-(3-biphenyl) group | 4 | H— |

TABLE 6-continued
| 31 | (II) | 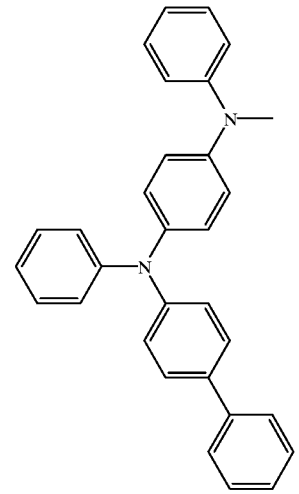 | 4 | H— |
| 32 | (II) | 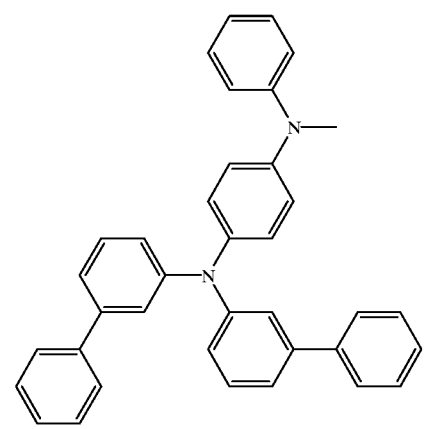 | 4 | H— |
| 33 | (II) | 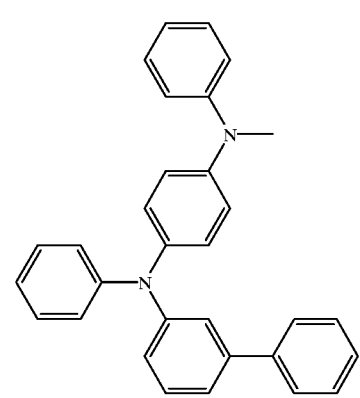 | 4 | H— |

TABLE 6-continued
| | | | Substition position | $R_4$ |
|---|---|---|---|---|
| 34 | (II) | 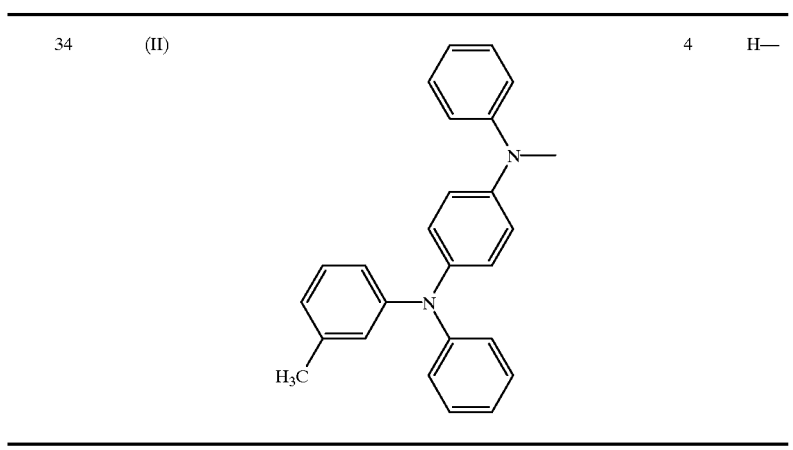 | 4 | H— |
| Compound No. | $R_3$ | Substition position | $R_4$ |
|---|---|---|---|
| 30 | 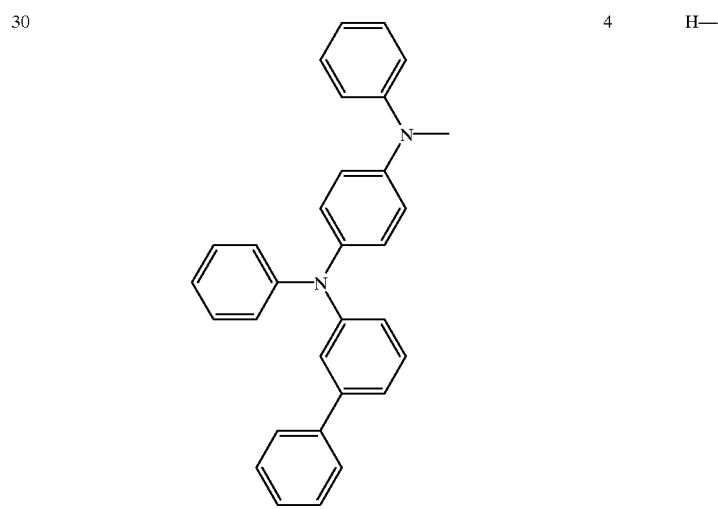 | 4 | H— |
| 31 | 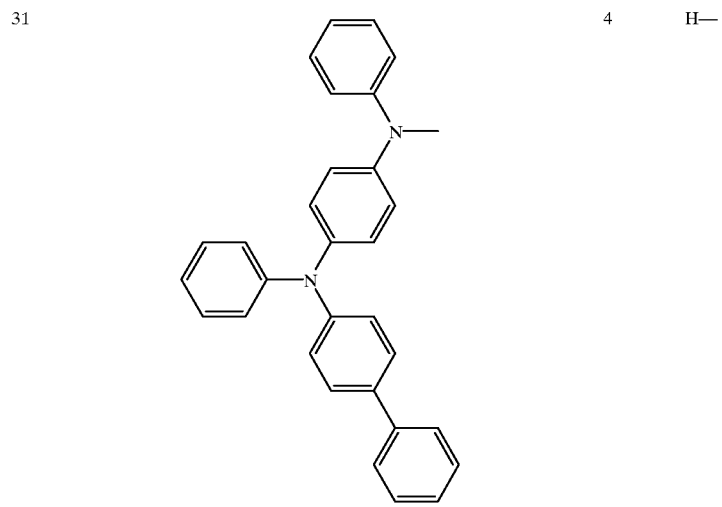 | 4 | H— |

TABLE 6-continued
| | | | |
|---|---|---|---|
| 32 | 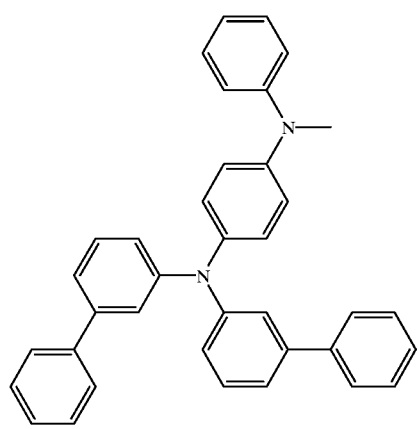 | 4 | H— |
| 33 | 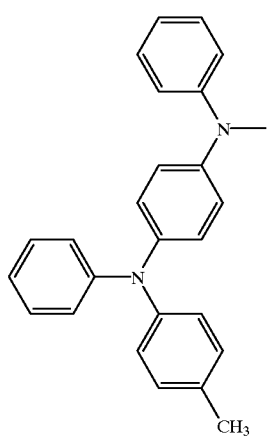 | 4 | H— |
| 34 | 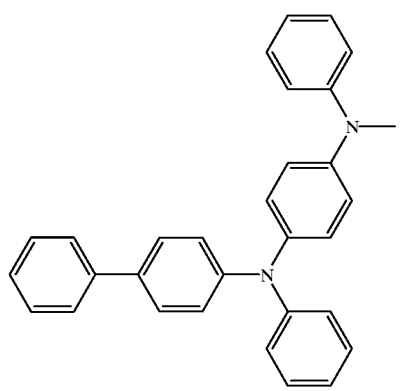 | 4 | H— |

TABLE 7
| Compound No. | General formula | R₁ | Substitution position | R₂ |
|---|---|---|---|---|
| 35 | (II) |  | 4 | H— |
| 36 | (II) | 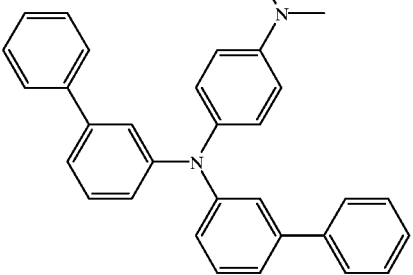 | 4 | H— |
| 37 | (II) | 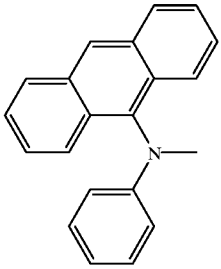 | 4 | H— |
| 38 | (II) | 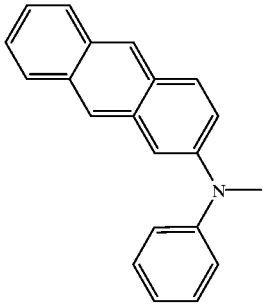 | 4 | H— |

TABLE 7-continued

| Compound No. | | R₃ | Substition position | R₄ |
|---|---|---|---|---|
| 39 | (II) | [phenanthrene-N(methyl)(phenyl) structure] | 4 | H— |
| 40 | (II) | [N,N'-diphenyl-N-naphthyl phenylenediamine structure] | 4 | H— |
| 35 | | [tris(biphenyl) substituted phenylenediamine structure] | 4 | H— |
| 36 | | [anthracene-N(methyl)(phenyl) structure] | 4 | H— |

TABLE 7-continued
| 37 | 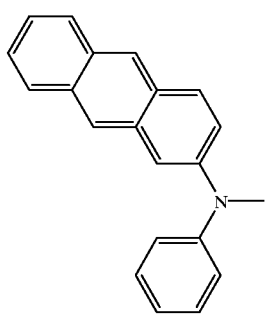 | 4 | H— |
| 38 | 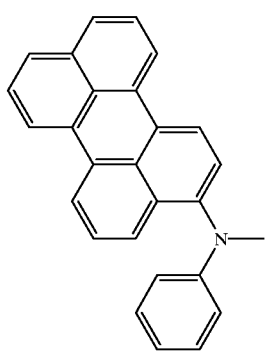 | 4 | H— |
| 39 | 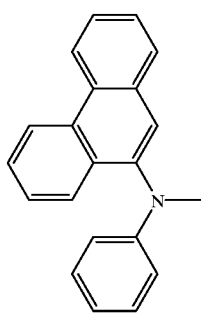 | 4 | H— |
| 40 | 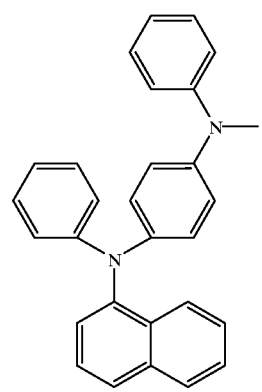 | 4 | H— |

TABLE 8

| Compound No. | General formula | R₁ | Substition position | R₂ | R₃ | Substition position | R₄ |
|---|---|---|---|---|---|---|---|
| 41 | (II) | diphenylamino group | 4 | H— | bis(4-(diphenylamino)phenyl)amino group | 4 | H— |
| 42 | (II) | diphenylamino group | 4 | H— | N-phenyl-N-(4-methylphenyl)amino-phenylamino group | 4 | H— |
| 43 | (II) | diphenylamino group | 4 | H— | N-phenyl-N-(3-biphenylyl)amino-phenylamino group | 4 | H— |

TABLE 8-continued

| Compound No. | General formula | R₁ | Substitution position | R₂ | R₃ | Substitution position | R₄ |
|---|---|---|---|---|---|---|---|
| 44 | (II) | N,N-bis(4-methylphenyl)amino | 4 | H— | 4-(N,N-diphenylamino)phenyl-N-phenylamino | 4 | H— |
| 45 | (II) | N,N-bis(biphenyl-3-yl)amino | 4 | H— | 4-(N,N-diphenylamino)phenyl-N-phenylamino | 4 | H— |

TABLE 9

| Compound No. | General formula | R₁ | Substitution position | R₂ | R₃ | Substitution position | R₄ |
|---|---|---|---|---|---|---|---|
| 46 | (II) | N-phenyl-N-(3-methylphenyl)amino | 4 | H— | 4-[N-phenyl-N-(3-methylphenyl)amino]phenyl-N-phenylamino | 4 | H— |

TABLE 9-continued
| Compound No. | General formula | $R_1$ | Substition position | $R_2$ | $R_3$ | Substition position | $R_4$ |
|---|---|---|---|---|---|---|---|
| 47 | (II) | H— | 4 | H— | 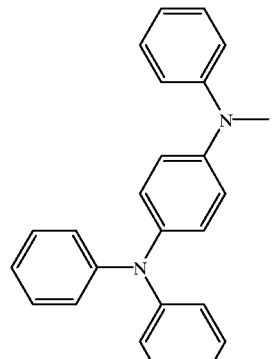 | 4 | H— |
| 48 | (II) | H— | 4 | H— | 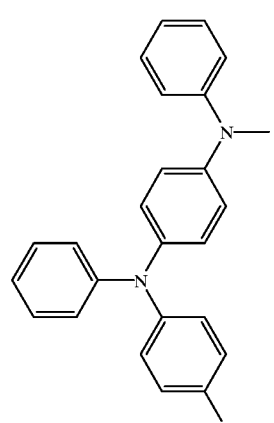 | 4 | H— |
| 49 | (II) | H— | 4 | H— | 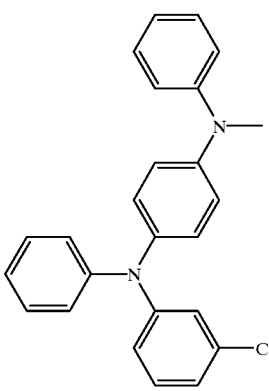 | 4 | H— |

TABLE 9-continued

| Compound No. | General formula | R₁ | Substition position | R₂ | R₃ | Substition position | R₄ |
|---|---|---|---|---|---|---|---|
| 50 | (II) | H— | 4 | H— | (structure) | 4 | H— |

TABLE 10

| Compound No. | General formula | R₁ | R₂ | R₃ | Substition position | R₄ |
|---|---|---|---|---|---|---|
| 51 | (II) | H— | H— | (structure) | 4 | H— |
| 52 | (II) | H— | H— | (structure) | 4 | H— |

TABLE 10-continued
| Compound No. | General formula | R₁ | R₂ | R₃ | Substition position | R₄ |
|---|---|---|---|---|---|---|
| 53 | (II) | H— | H— | 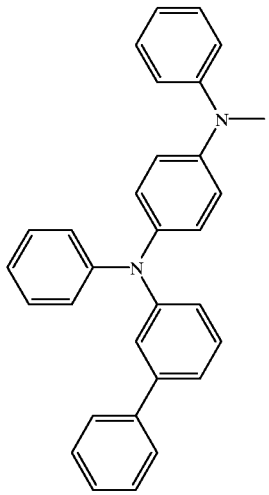 | 4 | H— |
| 54 | (II) | H— | H— | 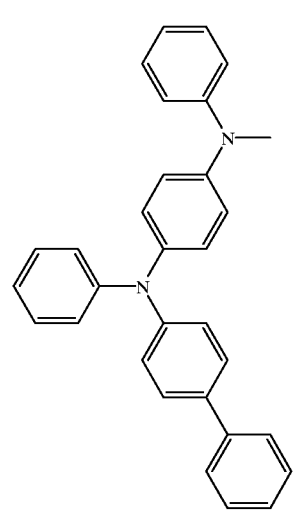 | 4 | H— |
| 55 | (II) | H— | H— | 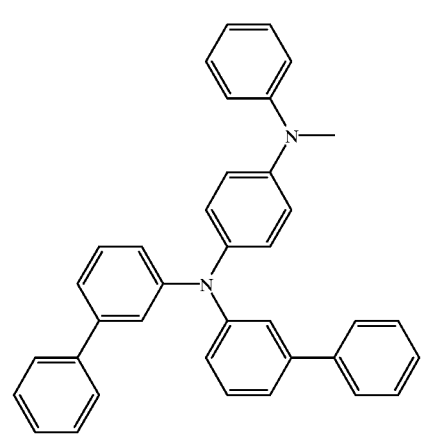 | 4 | H— |

TABLE 11

| Compound No. | General formula | R₁ | R₂ | R₃ | Substition position | R₄ |
|---|---|---|---|---|---|---|
| 56 | (II) | H— | H— | (structure) | 4 | H— |
| 57 | (II) | H— | H— | (structure) | 4 | H— |
| 58 | (II) | H— | H— | (structure) | 4 | H— |

TABLE 11-continued

| Compound No. | General formula | R₁ | R₂ | R₃ | Substition position | R₄ |
|---|---|---|---|---|---|---|
| 59 | (II) | H— | H— | *[structure: N-phenyl-N-(4-(N-phenyl-N-(naphthalen-1-yl)amino)phenyl)aniline]* | 4 | H— |
| 60 | (II) | H— | H— | *[structure: N-phenyl-N-(4-(N-phenyl-N-(naphthalen-2-yl)amino)phenyl)aniline]* | 4 | H— |

TABLE 12

| Compound No. | General formula | R₁ | R₂ | R₃ | Substition position | R₄ |
|---|---|---|---|---|---|---|
| 61 | (II) | H— | H— | *[structure: N-(4-(di(naphthalen-1-yl)amino)phenyl)-N-phenylaniline]* | 4 | H— |

TABLE 12-continued
| Compound No. | General formula | $R_1$ | $R_2$ | $R_3$ | Substition position | $R_4$ |
|---|---|---|---|---|---|---|
| 62 | (II) | H— | H— | 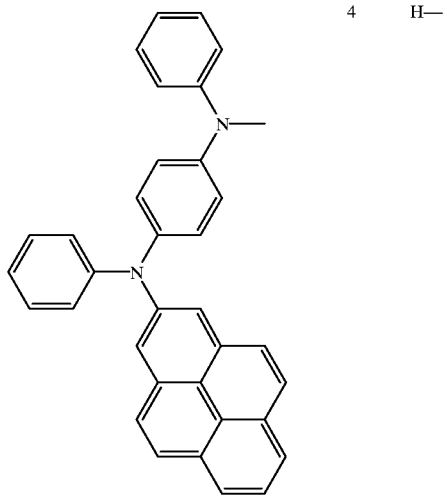 | 4 | H— |
| 63 | (II) | H— | H— | 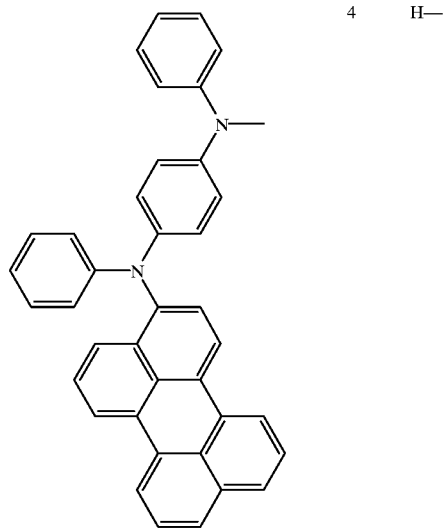 | 4 | H— |

TABLE 12-continued
| Compound No. | General formula | R1 | R2 | R3 | Substitution position | R4 |
|---|---|---|---|---|---|---|
| 64 | (II) | H— | H— | 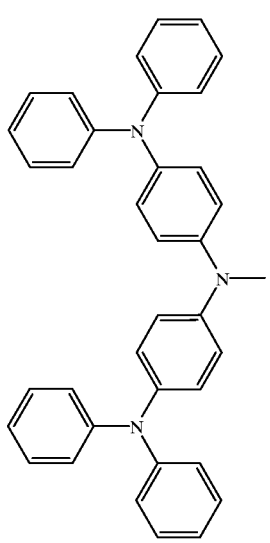 | 4 | H— |
TABLE 13
| Compound No. | General formula | R1 | R2 | R3 | Substitution position | R4 |
|---|---|---|---|---|---|---|
| 65 | (II) | H— | H— | 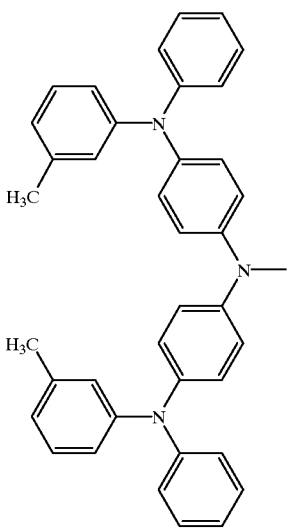 | 4 | H— |

TABLE 13-continued

| Compound No. | General formula | R₁ | R₂ | R₃ | Substitution position | R₄ |
|---|---|---|---|---|---|---|
| 66 | (II) | H— | H— | (structure with two N-phenyl-N-(4-methylphenyl)amino groups linked through phenylene) | 4 | H— |
| 67 | (II) | H— | H— | (structure with two N-phenyl-N-(biphenyl-3-yl)amino groups linked through phenylene) | 4 | H— |

TABLE 13-continued
| Compound No. | General formula | R₁ | R₂ | R₃ | Substition position | R₄ |
|---|---|---|---|---|---|---|
| 68 | (II) | H— | H— | 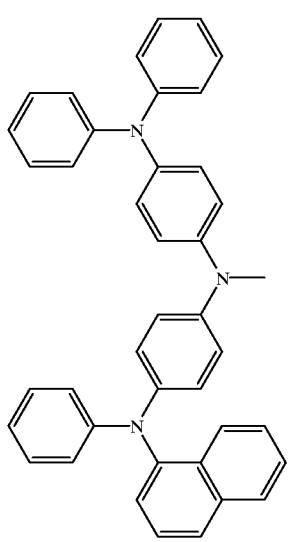 | 4 | H— |
TABLE 14
| Compound No. | General formula | R₁ | R₂ | R₃ | Substition position | R₄ |
|---|---|---|---|---|---|---|
| 69 | (II) | H— | H— | 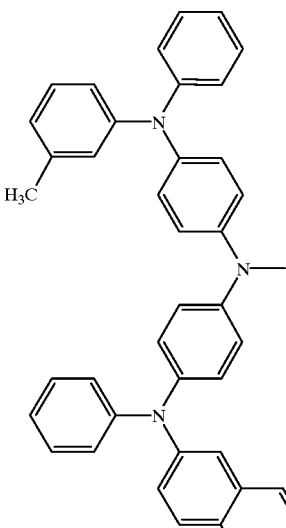 | 4 | H— |

TABLE 14-continued

| Compound No. | General formula | R₁ | R₂ | R₃ | Substition position | R₄ |
|---|---|---|---|---|---|---|
| 70 | (II) | H— | H— | *[structure: 4-(diphenylamino)phenyl-N-methyl-N-(4-(di-1-naphthylamino)phenyl)amine]* | 4 | H— |
| 71 | (II) | H— | H— | *[structure: N-methyl-bis[4-(N-phenyl-N-2-naphthylamino)phenyl]amine]* | 4 | H— |

TABLE 15

| Compound No. | General formula | R₁ | Substition position | R₂ | Substition position | R₃ | R₄ |
|---|---|---|---|---|---|---|---|
| 72 | (II) | *[diphenylamino]* | 4 | *[diphenylamino]* | 4 | H— | H— |

TABLE 15-continued
| Compound No. | General formula | R₁ | Substition position | R₂ | Substition position | R₃ | R₄ |
|---|---|---|---|---|---|---|---|
| 73 | (II) | 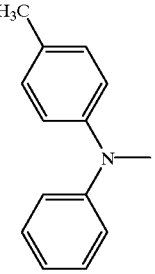 | 4 | 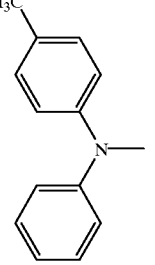 | 4 | H— | H— |
| 74 | (II) | 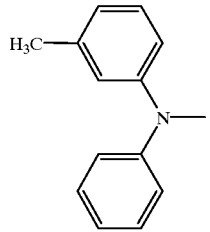 | 4 | 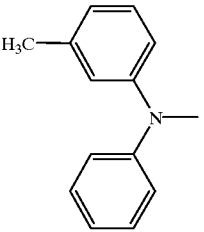 | 4 | H— | H— |
| 75 | (II) | 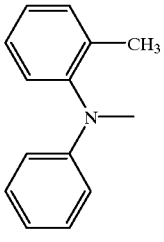 | 4 | 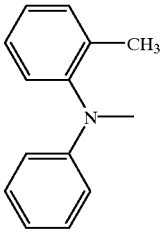 | 4 | H— | H— |
| 76 | (II) | 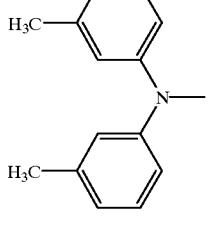 | 4 | 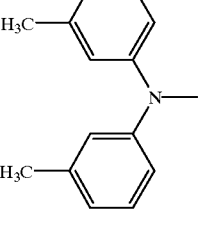 | 4 | H— | H— |
| 77 | (II) | 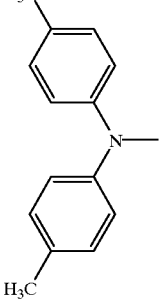 | 4 | 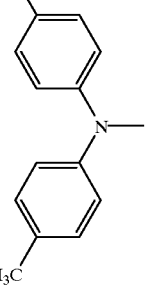 | 4 | H— | H— |

TABLE 16

| Compound No. | General formula | R₁ | Substitution position | R₂ | Substitution position | R₃ | R₄ |
|---|---|---|---|---|---|---|---|
| 78 | (II) | 3-methyl-4-methylphenyl-N-phenyl | 4 | 3-methyl-4-methylphenyl-N-phenyl | 4 | H— | H— |
| 79 | (II) | 3-methylphenyl-N-phenyl | 4 | 4-methylphenyl-N-phenyl | 4 | H— | H— |
| 80 | (II) | 4-biphenyl-N-phenyl | 4 | 4-biphenyl-N-phenyl | 4 | H— | H— |
| 81 | (II) | 3-biphenyl-N-phenyl | 4 | 3-biphenyl-N-phenyl | 4 | H— | H— |
| 82 | (II) | 2-biphenyl-N-phenyl | 4 | 2-biphenyl-N-phenyl | 4 | H— | H— |

TABLE 16-continued
| Compound No. | General formula | R₁ | Substition position | R₂ | Substition position | R₃ | R₄ |
|---|---|---|---|---|---|---|---|
| 83 | (II) | 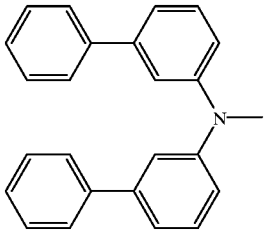 | 4 | 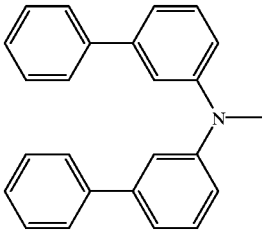 | 4 | H— | H— |
TABLE 17
| Compound No. | General formula | R₁ | Substition position | R₂ | Substition position | R₃ | R₄ |
|---|---|---|---|---|---|---|---|
| 84 | (II) | 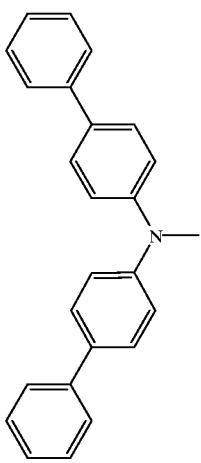 | 4 | 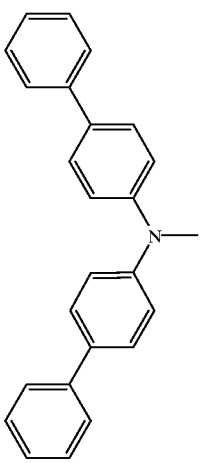 | 4 | H— | H— |
| 85 | (II) | 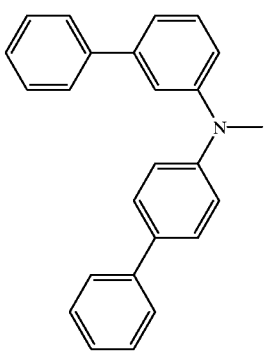 | 4 | 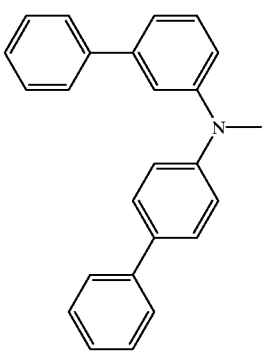 | 4 | H— | H— |

TABLE 17-continued

| Compound No. | General formula | R₁ | Substition position | R₂ | Substition position | R₃ | R₄ |
|---|---|---|---|---|---|---|---|
| 86 | (II) | 3-biphenylyl(phenyl)amino | 4 | 4-biphenylyl(phenyl)amino | 4 | H— | H— |
| 87 | (II) | 4-(diphenylamino)phenyl(phenyl)amino | 4 | 4-(diphenylamino)phenyl(phenyl)amino | 4 | H— | H— |
| 88 | (II) | 4-[N-phenyl-N-(4-methylphenyl)amino]phenyl(phenyl)amino | 4 | 4-[N-phenyl-N-(4-methylphenyl)amino]phenyl(phenyl)amino | 4 | H— | H— |

TABLE 18

| Compound No. | General formula | R₁ | Substition position | R₂ | Substition position | R₃ | R₄ |
|---|---|---|---|---|---|---|---|
| 89 | (II) | (structure: N,N-diphenyl-N'-(3-methylphenyl)-N'-phenyl) | 4 | (structure: N,N-diphenyl-N'-(3-methylphenyl)-N'-phenyl) | 4 | H— | H— |
| 90 | (II) | (structure: N-phenyl-N-(4-methylphenyl), N'-(4-methylphenyl)) | 4 | (structure: N-phenyl-N-(4-methylphenyl), N'-(4-methylphenyl)) | 4 | H— | H— |
| 91 | (II) | (structure: N-phenyl, N'-(3-methylphenyl)-N'-(3-methylphenyl)) | 4 | (structure: N-phenyl, N'-(3-methylphenyl)-N'-(3-methylphenyl)) | 4 | H— | H— |

TABLE 18-continued

| Compound No. | General formula | R₁ | Substitution position | R₂ | Substitution position | R₃ | R₄ |
|---|---|---|---|---|---|---|---|
| 92 | (II) | (4-methylphenyl)-N-(4-methylphenyl)-N-(4-methylphenyl)amino-phenyl group | 4 | (4-methylphenyl)-N-(4-methylphenyl)-N-(4-methylphenyl)amino-phenyl group | 4 | H— | H— |

TABLE 19

| Compound No. | General formula | R₁ | Substitution position | R₂ | Substitution position | R₃ | R₄ |
|---|---|---|---|---|---|---|---|
| 93 | (II) | diphenylamino group | 4 | N,N-diphenyl-4-(diphenylamino)phenyl group | 4 | H— | H— |
| 94 | (II) | diphenylamino group | 4 | N-phenyl-N-(4-methylphenyl)-4-(diphenylamino)phenyl group | 4 | H— | H— |

TABLE 19-continued

| Compound No. | General formula | R₁ | Substition position | R₂ | Substition position | R₃ | R₄ |
|---|---|---|---|---|---|---|---|
| 95 | (II) | diphenylamino | 4 | N-phenyl-N-(3-biphenylyl)-4-aminophenyl / diphenylamino substituted | 4 | H— | H— |
| 96 | (II) | di(4-methylphenyl)amino | 4 | 4-(diphenylamino)-N,N-diphenylanilino | 4 | H— | H— |
| 97 | (II) | di(3-biphenylyl)amino | 4 | 4-(diphenylamino)-N,N-diphenylanilino | 4 | H— | H— |

TABLE 20

| Compound No. | General formula | R₁ | Substitution position | R₂ |
|---|---|---|---|---|
| 98 | (II) | [N-phenyl-N-(3-methylphenyl)amino] | 4 | [N,N'-diphenyl-N-(3-methylphenyl)-p-phenylenediamine group] |
| 99 | (II) | [diphenylamino] | 4 | [diphenylamino] |
| 100 | (II) | [N-(4-methylphenyl)-N-phenylamino] | 4 | [diphenylamino] |
| 101 | (II) | [N-(3-methylphenyl)-N-phenylamino] | 4 | [diphenylamino] |
| 102 | (II) | [N-(2-methylphenyl)-N-phenylamino] | 4 | [N-(2-methylphenyl)-N-phenylamino] |

TABLE 20-continued
| 103 | (II) | | 4 | | |
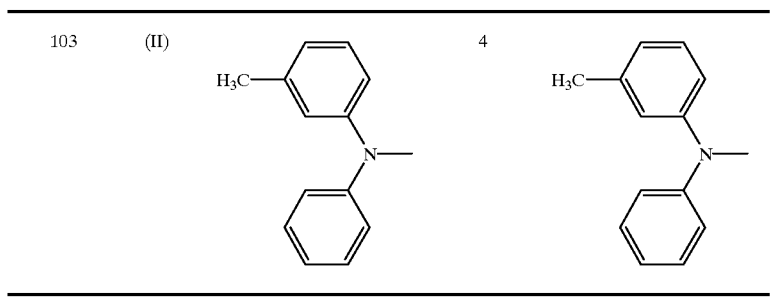
| Compound No. | Substition position | R₃ | Substition position | R₄ |
|---|---|---|---|---|
| 98 | 4 | H— | 4 | H— |
| 99 | 4 | (N,N-diphenylamino) | 4 | H— |
| 100 | 4 | (N-(4-methylphenyl)-N-phenylamino) | 4 | H— |
| 101 | 4 | (N-(3-methylphenyl)-N-phenylamino) | 4 | H— |
| 102 | 4 | (N-(2-methylphenyl)-N-phenylamino) | 4 | H— |

TABLE 20-continued

| 103 | 4 | [structure: N,N-diphenylamine group] | 4 | H— |

TABLE 21

| Compound No. | General formula | R₁ | Substitution position | R₂ | Substitution position |
|---|---|---|---|---|---|
| 104 | (II) | [bis(4-methylphenyl)amino] | 4 | [bis(4-methylphenyl)amino] | 4 |
| 105 | (II) | [N-(3-methylphenyl)-N-(4-methylphenyl)amino] | 4 | [diphenylamino] | 4 |
| 106 | (II) | [N-(3-methylphenyl)-N-phenylamino] | 4 | [diphenylamino] | 4 |
| 107 | (II) | [diphenylamino] | 4 | [diphenylamino] | 4 |

TABLE 21-continued
| | | | Substition position | | Substition position |
|---|---|---|---|---|---|
| 108 | (II) | 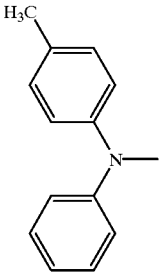 | 4 | 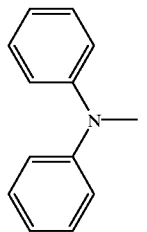 | 4 |
| 109 | (II) | 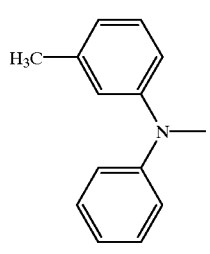 | 4 | 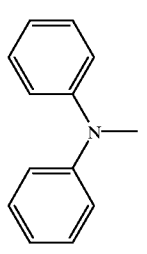 | 4 |
| Compound No. | $R_3$ | Substition position | $R_4$ | Substition position |
|---|---|---|---|---|
| 104 | 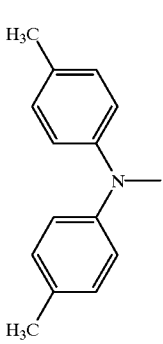 | 4 | H— | 4 |
| 105 | 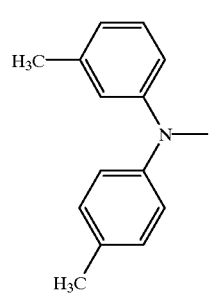 | 4 | H— | 4 |
| 106 | 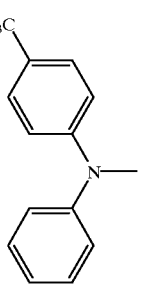 | 4 | H— | 4 |

TABLE 21-continued

| No. | R₁ | Substitution position | R₂ | Substitution position |
|---|---|---|---|---|
| 107 | diphenylamino-methyl | 4 | diphenylamino-methyl | 4 |
| 108 | N-(4-methylphenyl)-N-phenyl-methylamino | 4 | diphenylamino-methyl | 4 |
| 109 | N-(3-methylphenyl)-N-phenyl-methylamino | 4 | diphenylamino-methyl | 4 |

TABLE 22

| Compound No. | General formula | R₁ | Substitution position | R₂ | Substitution position |
|---|---|---|---|---|---|
| 110 | (II) | N-(2-methylphenyl)-N-phenyl-methylamino | 4 | N-(2-methylphenyl)-N-phenyl-methylamino | 4 |
| 111 | (II) | N-(3-methylphenyl)-N-phenyl-methylamino | 4 | N-(3-methylphenyl)-N-phenyl-methylamino | 4 |

TABLE 22-continued
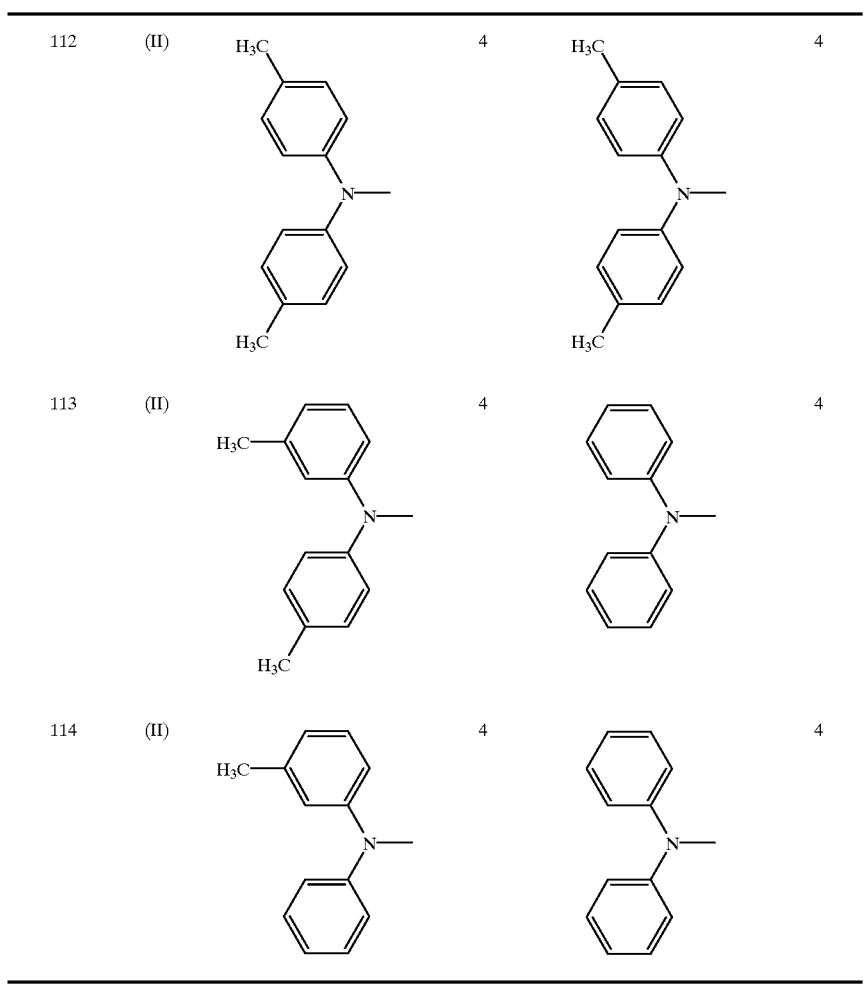
| Compound No. | $R_3$ | Substition position | $R_4$ | Substition position |
|---|---|---|---|---|
| 110 | | 4 | | 4 |
| 111 | | 4 | | 4 |
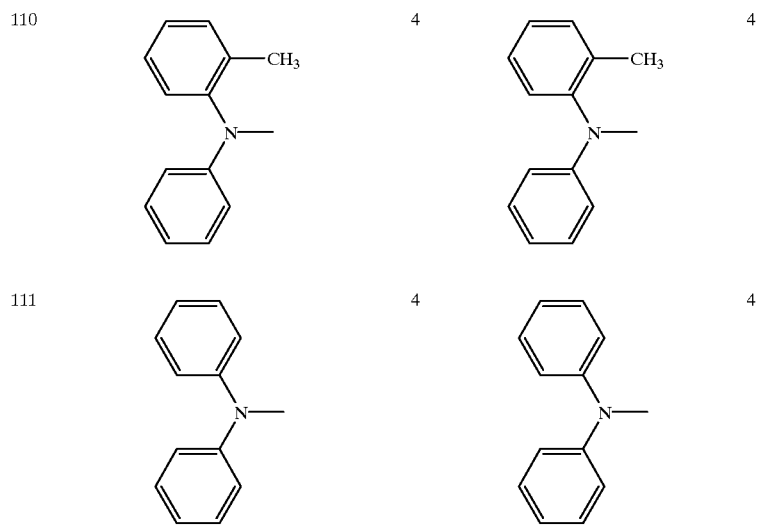

TABLE 22-continued

| 112 | [structure: N,N-di(4-methylphenyl)methylamine / bis(4-methylphenyl)-N-methyl] | 4 | [structure: bis(4-methylphenyl)amino radical] | 4 |
| 113 | [structure: N-(3-methylphenyl)-N-(4-methylphenyl)methylamine] | 4 | [structure: N,N-diphenylmethylamine] | 4 |
| 114 | [structure: N-(4-methylphenyl)-N-phenylmethylamine] | 4 | [structure: N,N-diphenylmethylamine] | 4 |

TABLE 23

| Compound No. | General formula | R₁ | Substition position | R₂ |
|---|---|---|---|---|
| 115 | (II) | [structure: 4-(N-phenyl-N-(3-methylphenyl)amino)phenyl-N-phenylamino group] | 4 | H— |

TABLE 23-continued
| 116 | (II) | 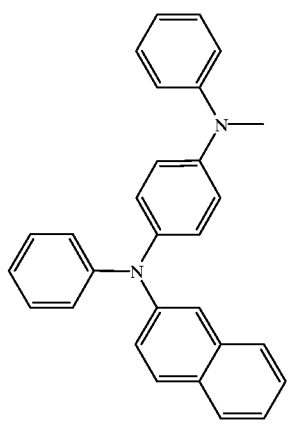 | 4 | H— |
| 117 | (II) | 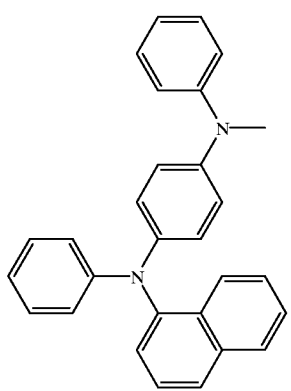 | 4 | H— |
| 118 | (II) | 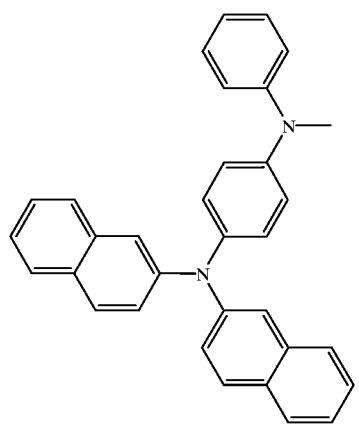 | 4 | H— |

TABLE 23-continued
| Compound No. | | R₃ | Substition position | R₄ |
|---|---|---|---|---|
| 119 | (II) | 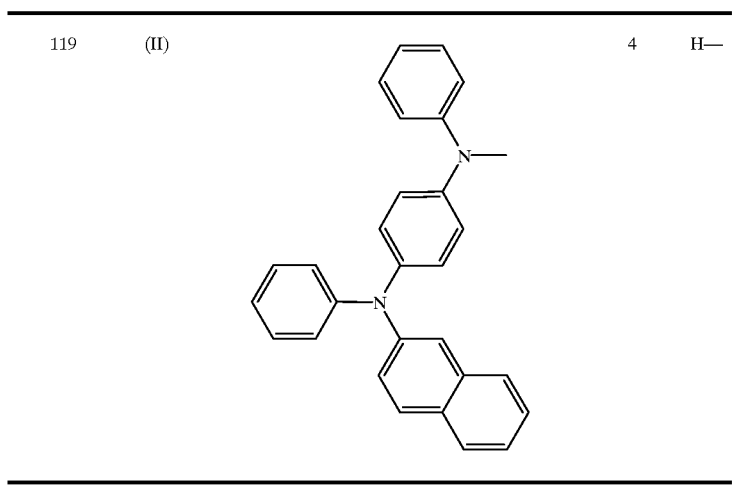 | 4 | H— |
| 115 | | 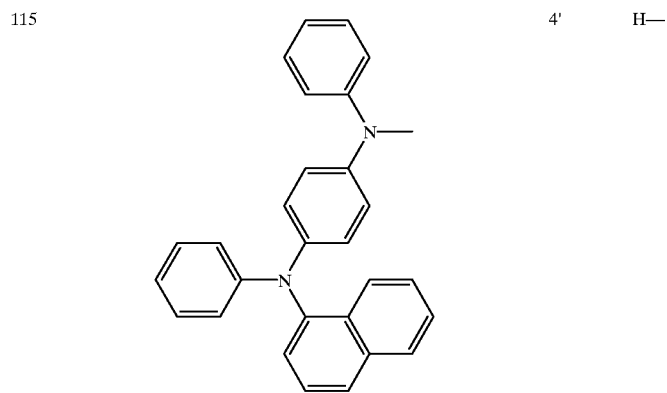 | 4' | H— |
| 116 | | 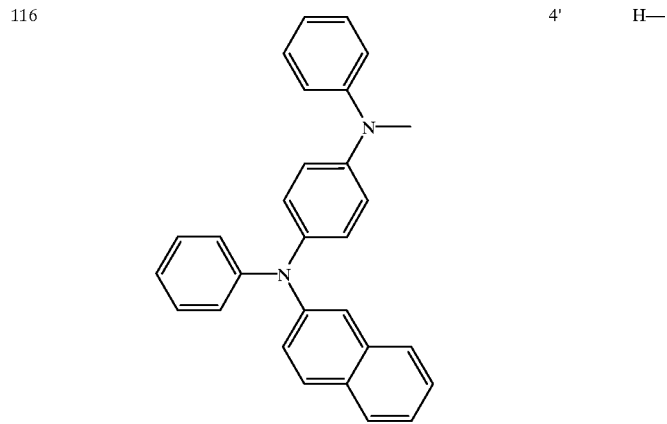 | 4' | H— |

TABLE 23-continued
| | | | |
|---|---|---|---|
| 117 | 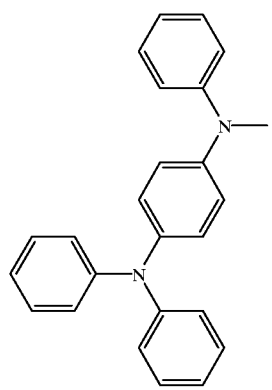 | 4' | H— |
| 118 | 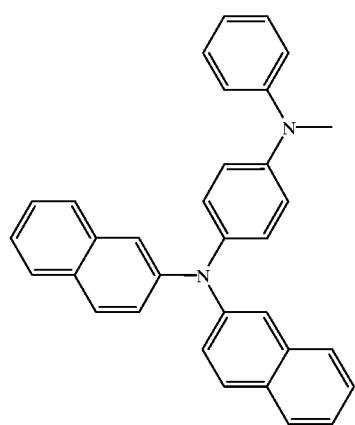 | 4' | H— |
| 119 | 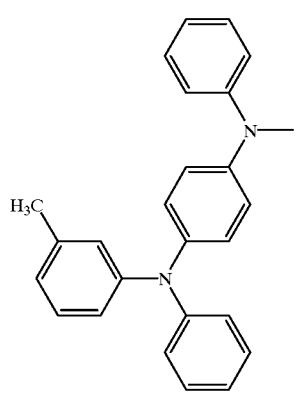 | 4' | H— |

TABLE 24

| Compound No. | General formula | R₁ | Substitution position | R₂ | R₃ | Substitution position | R₄ |
|---|---|---|---|---|---|---|---|
| 120 | (II) | N,N-diphenylamino | 3 | H— | N,N-diphenylamino | 3 | H— |
| 121 | (II) | N-(4-methylphenyl)-N-phenylamino | 3 | H— | N-(4-methylphenyl)-N-phenylamino | 3 | H— |
| 122 | (II) | N-(3-methylphenyl)-N-phenylamino | 3 | H— | N-(3-methylphenyl)-N-phenylamino | 3 | H— |
| 123 | (II) | N-(2-methylphenyl)-N-phenylamino | 3 | H— | N-(2-methylphenyl)-N-phenylamino | 3 | H— |
| 124 | (II) | N,N-bis(3-methylphenyl)amino | 3 | H— | N,N-bis(3-methylphenyl)amino | 3 | H— |

TABLE 24-continued
| Compound No. | General formula | R₁ | Substitution position | R₂ | R₃ | Substitution position | R₄ |
|---|---|---|---|---|---|---|---|
| 125 | (II) | 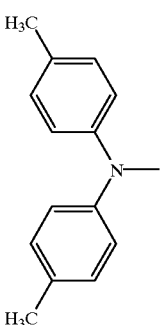 | 3 | H— | 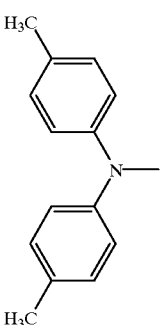 | 3 | H— |
TABLE 25
| Compound No. | General formula | R₁ | Substitution position | R₂ | R₃ | Substitution position | R₄ |
|---|---|---|---|---|---|---|---|
| 126 | (II) | 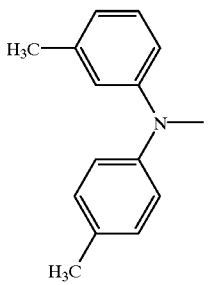 | 3 | H— | 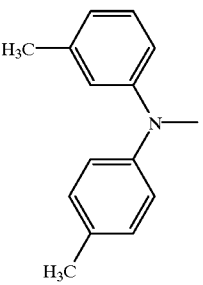 | 3 | H— |
| 127 | (II) | 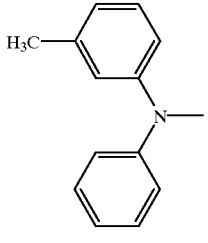 | 3 | H— | 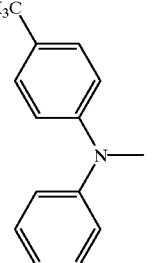 | 3 | H— |
| 128 | (II) | 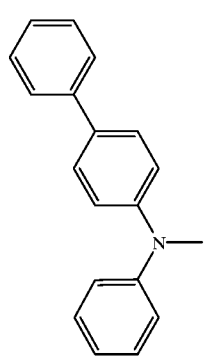 | 3 | H— | 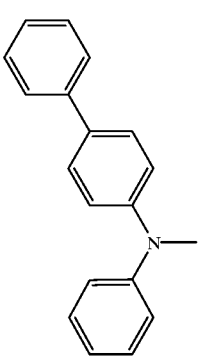 | 3 | H— |

TABLE 25-continued

| Compound No. | General formula | R₁ | Substition position | R₂ | R₃ | Substition position | R₄ |
|---|---|---|---|---|---|---|---|
| 129 | (II) | [3-biphenylyl-N-phenyl] | 3 | H— | [3-biphenylyl-N-phenyl] | 3 | H— |
| 130 | (II) | [2-biphenylyl-N-phenyl] | 3 | H— | [2-biphenylyl-N-phenyl] | 3 | H— |
| 131 | (II) | [bis(3-biphenylyl)-N] | 3 | H— | [bis(3-biphenylyl)-N] | 3 | H— |

TABLE 26

| Compound No. | General formula | R₁ | Substition position | R₂ | R₃ | Substition position | R₄ |
|---|---|---|---|---|---|---|---|
| 132 | (II) | [4-biphenylyl-N-(4-biphenylyl)] | 3 | H— | [4-biphenylyl-N-(4-biphenylyl)] | 3 | H— |

TABLE 26-continued

| Compound No. | General formula | R₁ | Substitution position | R₂ | R₃ | Substitution position | R₄ |
|---|---|---|---|---|---|---|---|
| 133 | (II) | [biphenyl-phenyl-N-biphenyl group] | 3 | H— | [biphenyl-phenyl-N-biphenyl group] | 3 | H— |
| 134 | (II) | [biphenyl-N-phenyl group] | 3 | H— | [biphenyl-N-phenyl group] | 3 | H— |
| 135 | (II) | [naphthyl-N-phenyl group] | 3 | H— | [naphthyl-N-phenyl group] | 3 | H— |
| 136 | (II) | [naphthyl-N-phenyl group] | 3 | H— | [naphthyl-N-phenyl group] | 3 | H— |

TABLE 26-continued
| Compound No. | General formula | R₁ | Substition position | R₂ | R₃ | Substition position | R₄ |
|---|---|---|---|---|---|---|---|
| 137 | (II) | 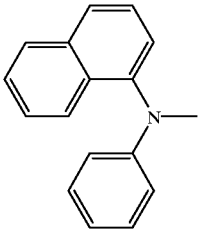 | 3 | H— | 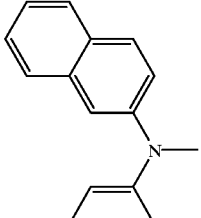 | 3 | H— |
TABLE 27
| Compound No. | General formula | R₁ | Substition position | R₂ | R₃ | Substition position | R₄ |
|---|---|---|---|---|---|---|---|
| 138 | (II) | 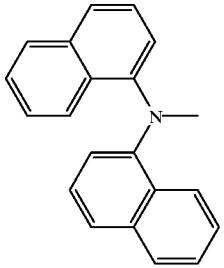 | 3 | H— | 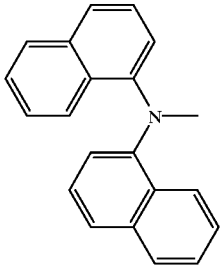 | 3 | H— |
| 139 | (II) | 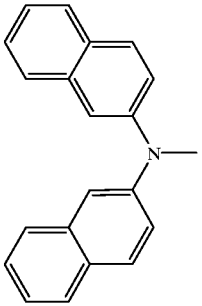 | 3 | H— | 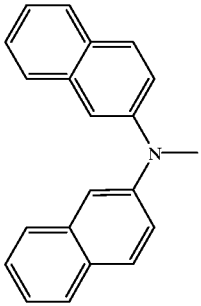 | 3 | H— |

TABLE 27-continued
| Compound No. | General formula | R₁ | Substitution position | R₂ | R₃ | Substitution position | R₄ |
|---|---|---|---|---|---|---|---|
| 140 | (II) | 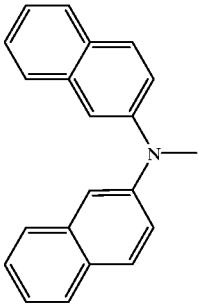 | 3 | H— | 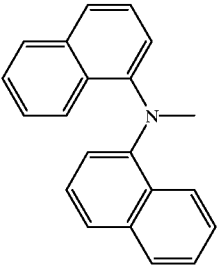 | 3 | H— |
| 141 | (II) | 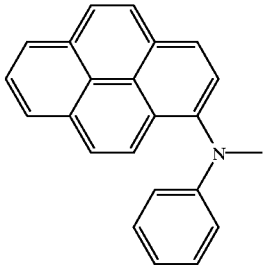 | 3 | H— | 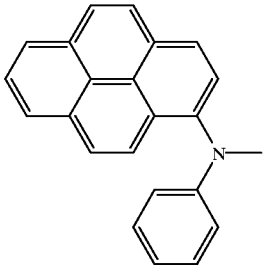 | 3 | H— |
| 142 | (II) | 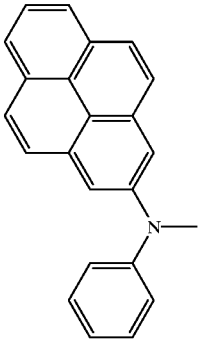 | 3 | H— | 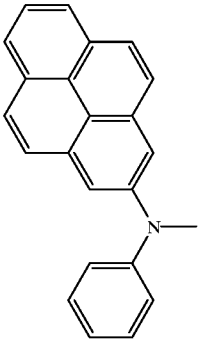 | 3 | H— |
| 143 | (II) | 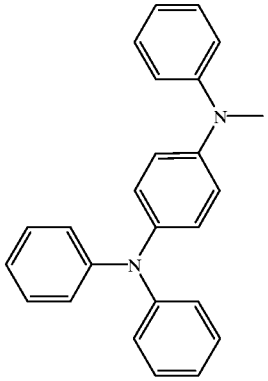 | 3 | H— | 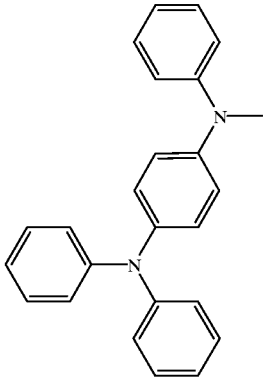 | 3 | H— |

TABLE 28

| Compound No. | General formula | R₁ | Substitution position | R₂ | R₃ | Substitution position | R₄ |
|---|---|---|---|---|---|---|---|
| 144 | (II) | (structure) | 3 | H— | (structure) | 3 | H— |
| 145 | (II) | (structure) | 3 | H— | (structure) | 3 | H— |
| 146 | (II) | (structure) | 3 | H— | (structure) | 3 | H— |

TABLE 28-continued

| Compound No. | General formula | R₁ | Substitution position | R₂ | R₃ | Substitution position | R₄ |
|---|---|---|---|---|---|---|---|
| 147 | (II) | [structure: N,N-diphenyl-N-(m-tolyl) aminophenyl with m-tolyl] | 3 | H— | [structure: same as R₁] | 3 | H— |
| 148 | (II) | [structure: tri(p-tolyl)amine-based group] | 3 | H— | [structure: same as R₁] | 3 | H— |

TABLE 29

| Compound No. | General formula | R₁ | Substitution position | R₂ |
|---|---|---|---|---|
| 149 | (II) | [structure: N-phenyl-N-(3-biphenylyl)aminophenyl group] | 3 | H— |

TABLE 29-continued
| 150 | (II) | 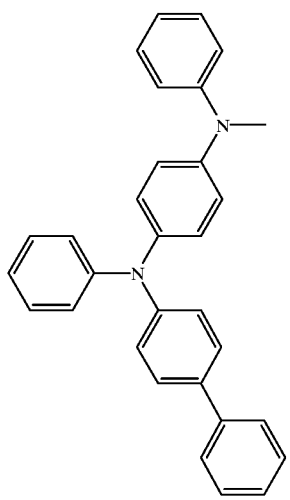 | 3 | H— |
| 151 | (II) | 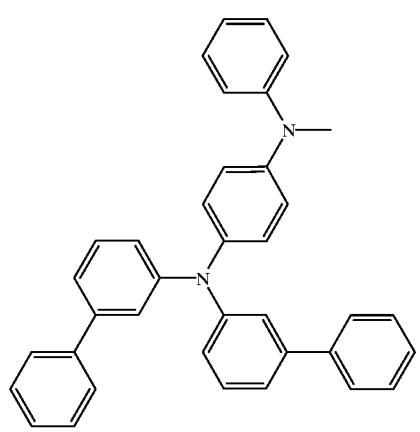 | 3 | H— |
| 152 | (II) | 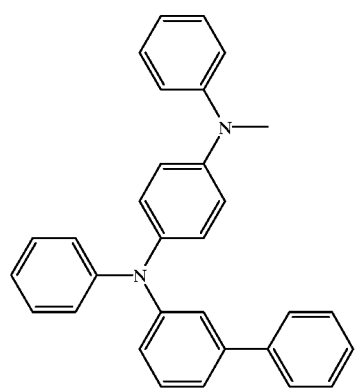 | 3 | H— |

TABLE 29-continued
| Compound No. | | R₃ | Substition position | R₄ |
|---|---|---|---|---|
| 153 | (II) | 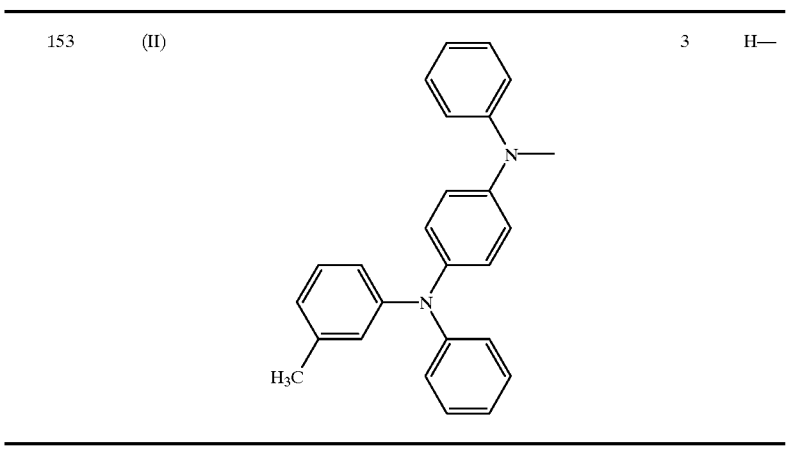 | 3 | H— |
| 149 | | 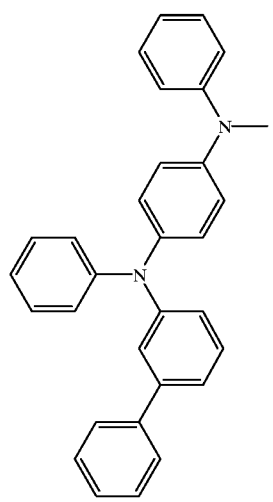 | 3 | H— |
| 150 | | 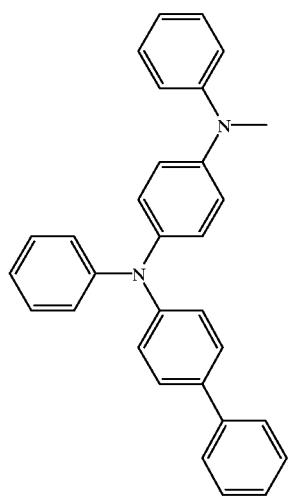 | 3 | H— |

TABLE 29-continued
| | | | |
|---|---|---|---|
| 151 | 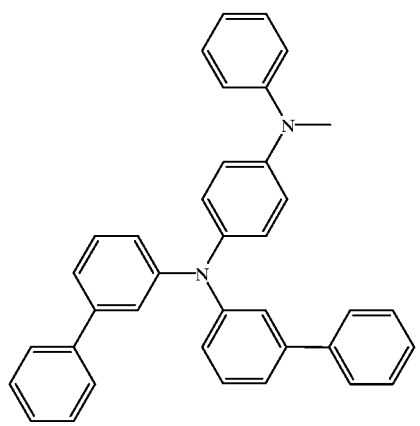 | 3 | H— |
| 152 | 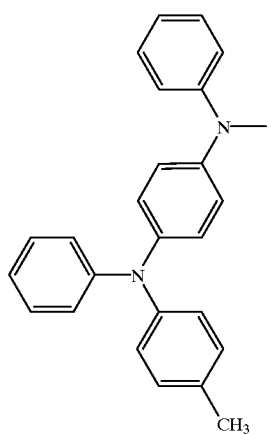 | 3 | H— |
| 153 | 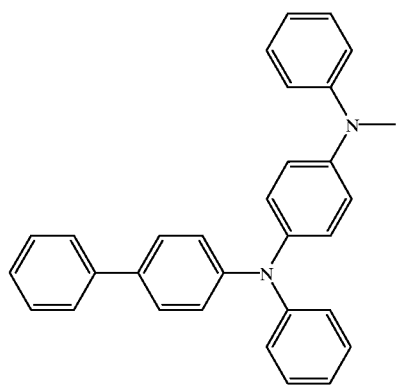 | 3 | H— |

TABLE 30

| Compound No. | General formula | R₁ | Substitution position | R₂ |
|---|---|---|---|---|
| 154 | (II) | [structure: N,N-bis(3-biphenylyl)-N'-(3-biphenylyl)-phenylenediamine type] | 3 | H— |
| 155 | (II) | [structure: 9-anthryl(phenyl)amino] | 3 | H— |
| 156 | (II) | [structure: 2-anthryl(phenyl)amino] | 3 | H— |
| 157 | (II) | [structure: perylenyl(phenyl)amino] | 3 | H— |

TABLE 30-continued
| Compound No. | | R₃ | Substition position | R₄ |
|---|---|---|---|---|
| 158 | (II) | 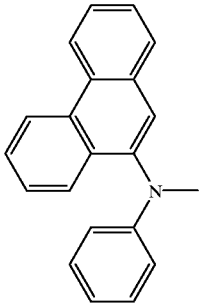 | 3 | H— |
| 159 | (II) | 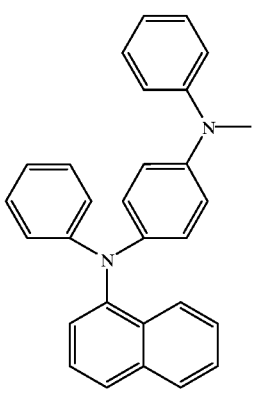 | 3 | H— |
| 154 | | 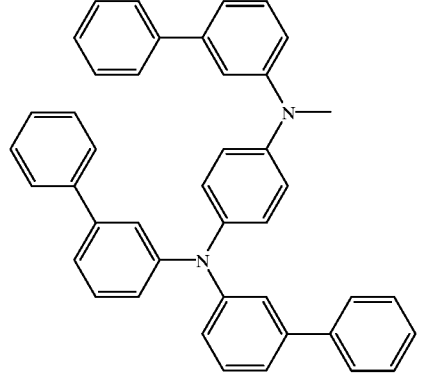 | 3 | H— |
| 155 | | 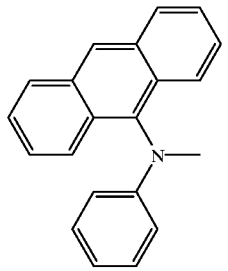 | 3 | H— |

TABLE 30-continued
| | | | |
|---|---|---|---|
| 156 | 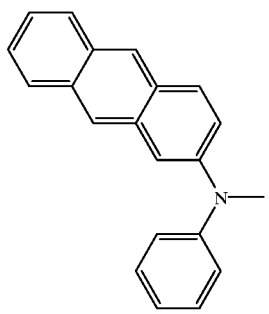 | 3 | H— |
| 157 | 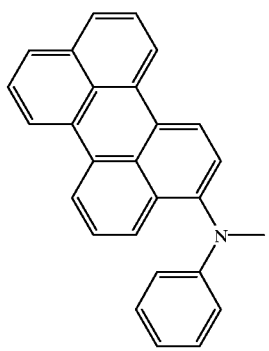 | 3 | H— |
| 158 | 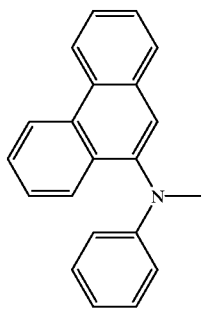 | 3 | H— |
| 159 | 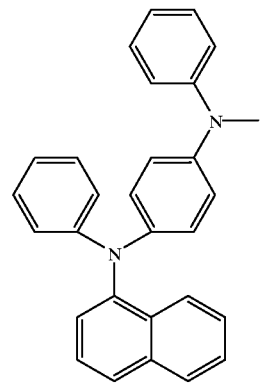 | 3 | H— |

TABLE 31
| Compound No. | General formula | R₁ | Substitution position | R₂ | R₃ | Substitution position | R₄ |
|---|---|---|---|---|---|---|---|
| 160 | (II) | 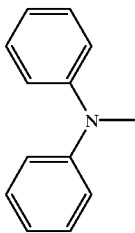 | 3 | H— | 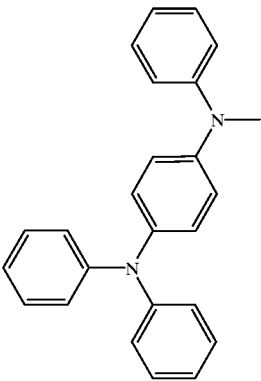 | 3 | H— |
| 161 | (II) | 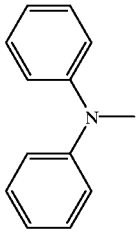 | 3 | H— | 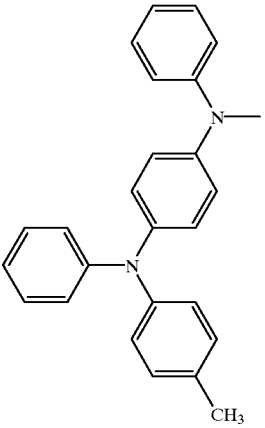 | 3 | H— |
| 162 | (II) | 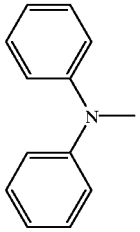 | 3 | H— | 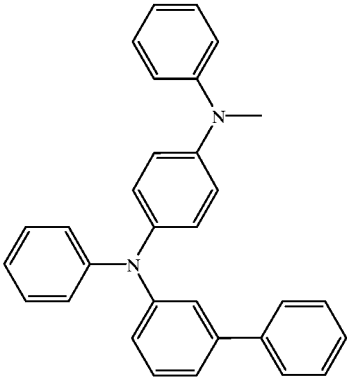 | 3 | H— |

TABLE 31-continued

| Compound No. | General formula | R₁ | Substitution position | R₂ | R₃ | Substitution position | R₄ |
|---|---|---|---|---|---|---|---|
| 163 | (II) | di(4-methylphenyl)amino | 3 | H— | N-phenyl-N-(4-(diphenylamino)phenyl)amino | 3 | H— |
| 164 | (II) | di(biphenyl-3-yl)amino | 3 | H— | N-phenyl-N-(4-(diphenylamino)phenyl)amino | 3 | H— |

TABLE 32

| Compound No. | General formula | R₁ | Substitution position | R₂ | R₃ | Substitution position | R₄ |
|---|---|---|---|---|---|---|---|
| 165 | (II) | N-phenyl-N-(3-methylphenyl)amino | 3 | H— | N-(4-(diphenylamino)phenyl)-N-(3-methylphenyl)amino | 3 | H— |

TABLE 32-continued

| Compound No. | General formula | R₁ | Substition position | R₂ | R₃ | Substition position | R₄ |
|---|---|---|---|---|---|---|---|
| 166 | (II) | H— | 3 | H— | | 3 | H— |
| 167 | (II) | H— | 3 | H— | | 3 | H— |
| 168 | (II) | H— | 3 | H— | | 3 | H— |

TABLE 32-continued

| Compound No. | General formula | R₁ | Substitution position | R₂ | R₃ | Substitution position | R₄ |
|---|---|---|---|---|---|---|---|
| 169 | (II) | H— | 3 | H— | [structure: N,N-bis(4-methylphenyl)-N'-phenyl-p-phenylenediamine-type group] | 3 | H— |

TABLE 33

| Compound No. | General formula | R₁ | R₂ | R₃ | Substitution position | R₄ |
|---|---|---|---|---|---|---|
| 170 | (II) | H— | H— | [structure with 3-methylphenyl, phenyl, and 3-methylphenyl groups on nitrogens] | 3 | H— |
| 171 | (II) | H— | H— | [structure with three 4-methylphenyl (tolyl) groups on nitrogens] | 3 | H— |

TABLE 33-continued
| Compound No. | General formula | $R_1$ | $R_2$ | $R_3$ | Substition position | $R_4$ |
|---|---|---|---|---|---|---|
| 172 | (II) | H— | H— | 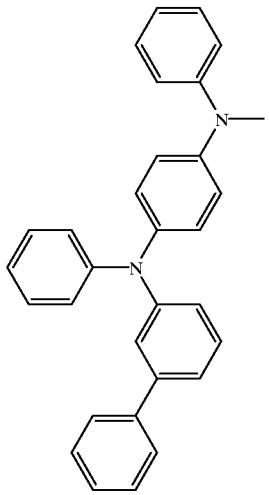 | 3 | H— |
| 173 | (II) | H— | H— | 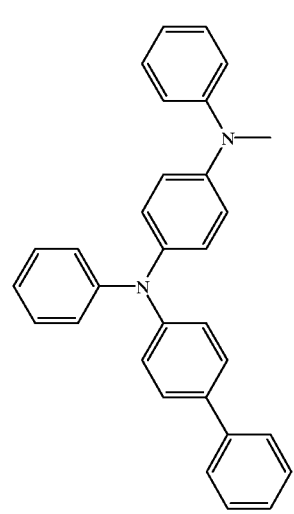 | 3 | H— |
| 174 | (II) | H— | H— | 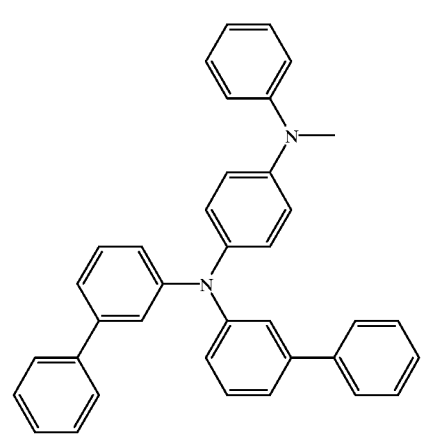 | 3 | H— |

TABLE 34

| Compound No. | General formula | $R_1$ | $R_2$ | $R_3$ | Substitution position | $R_4$ |
|---|---|---|---|---|---|---|
| 175 | (II) | H— | H— | (structure) | 3 | H— |
| 176 | (II) | H— | H— | (structure) | 3 | H— |
| 177 | (II) | H— | H— | (structure) | 3 | H— |

TABLE 34-continued
| Compound No. | General formula | R₁ | R₂ | R₃ | Substitution position | R₄ |
|---|---|---|---|---|---|---|
| 178 | (II) | H— | H— | 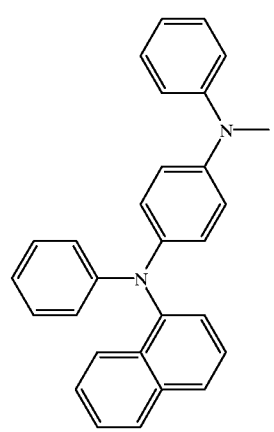 | 3 | H— |
| 179 | (II) | H— | H— | 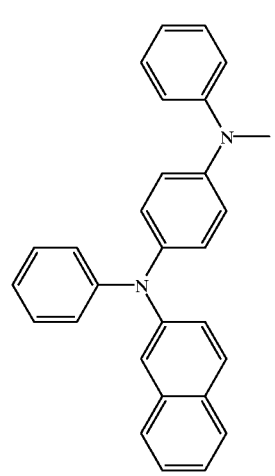 | 3 | H— |
TABLE 35
| Compound No. | General formula | R₁ | R₂ | R₃ | Substitution position | R₄ |
|---|---|---|---|---|---|---|
| 180 | (II) | H— | H— | 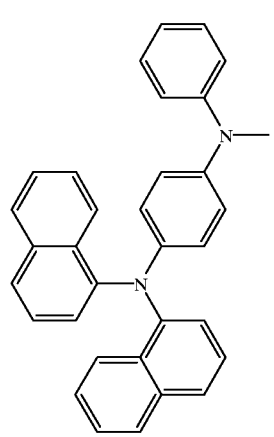 | 3 | H— |

TABLE 35-continued
| Compound No. | General formula | $R_1$ | $R_2$ | $R_3$ | Substition position | $R_4$ |
|---|---|---|---|---|---|---|
| 181 | (II) | H— | H— | 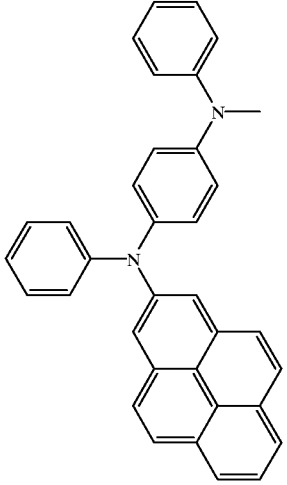 | 3 | H— |
| 182 | (II) | H— | H— | 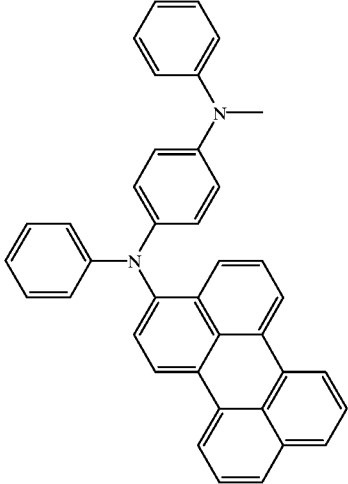 | 3 | H— |

TABLE 35-continued
| Compound No. | General formula | $R_1$ | $R_2$ | $R_3$ | Substitution position | $R_4$ |
|---|---|---|---|---|---|---|
| 183 | (II) | H— | H— | 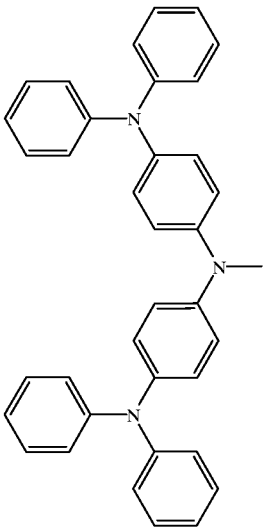 | 3 | H— |
TABLE 36
| Compound No. | General formula | $R_1$ | $R_2$ | $R_3$ | Substitution position | $R_4$ |
|---|---|---|---|---|---|---|
| 184 | (II) | H— | H— | 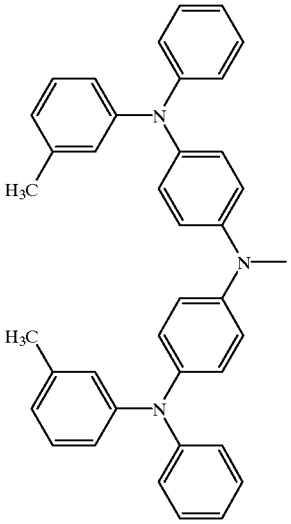 | 3 | H— |

TABLE 36-continued

| Compound No. | General formula | R₁ | R₂ | R₃ | Substitution position | R₄ |
|---|---|---|---|---|---|---|
| 185 | (II) | H— | H— | (structure) | 3 | H— |
| 186 | (II) | H— | H— | (structure) | 3 | H— |

TABLE 36-continued
| Compound No. | General formula | R₁ | R₂ | R₃ | Substition position | R₄ |
|---|---|---|---|---|---|---|
| 187 | (II) | H— | H— | 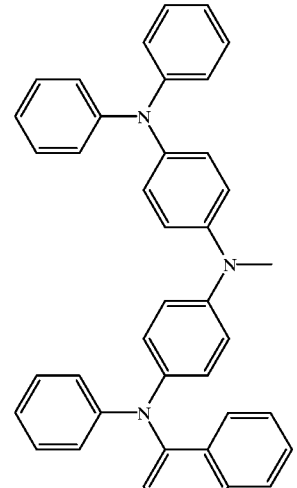 | 3 | H— |
TABLE 37
| Compound No. | General formula | R₁ | R₂ | R₃ | Substition position | R₄ |
|---|---|---|---|---|---|---|
| 188 | (II) | H— | H— | 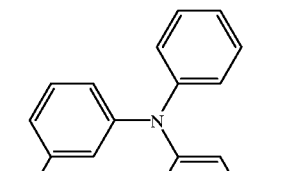 | 3 | H— |

TABLE 37-continued
| Compound No. | General formula | R₁ | R₂ | R₃ | Substition position | R₄ |
|---|---|---|---|---|---|---|
| 189 | (II) | H— | H— | 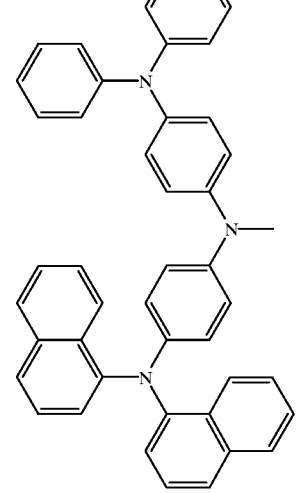 | 3 | H— |
| 190 | (II) | H— | H— | 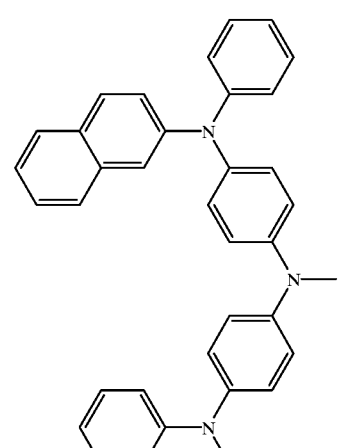 | 3 | H— |
TABLE 38
| Compound No. | General formula | R₁ | Substition position | R₂ | Substition position | R₃ | R₄ |
|---|---|---|---|---|---|---|---|
| 191 | (II) | 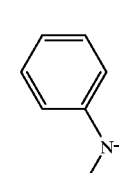 | 3 | 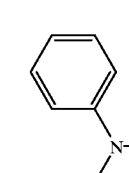 | 3 | H— | H— |

TABLE 38-continued
| Compound No. | General formula | R₁ | Substition position | R₂ | Substition position | R₃ | R₄ |
|---|---|---|---|---|---|---|---|
| 192 | (II) | 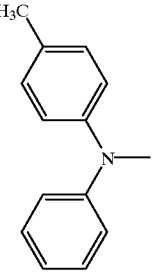 | 3 | 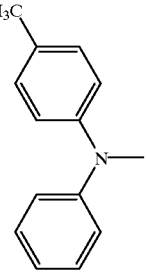 | 3 | H— | H— |
| 193 | (II) | 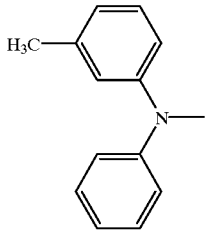 | 3 | 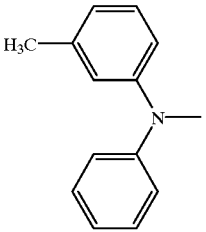 | 3 | H— | H— |
| 194 | (II) | 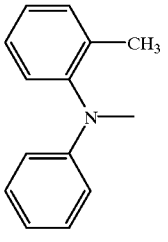 | 3 | 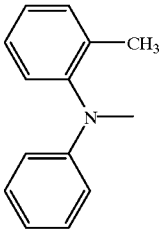 | 3 | H— | H— |
| 195 | (II) | 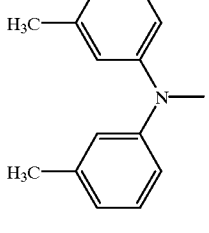 | 3 | 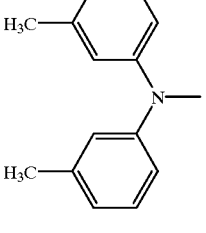 | 3 | H— | H— |
| 196 | (II) | 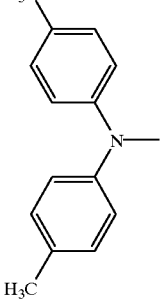 | 3 | 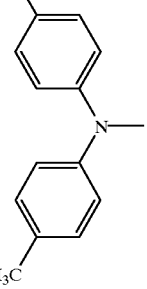 | 3 | H— | H— |

TABLE 39

| Compound No. | General formula | R₁ | Substition position | R₂ | Substition position | R₃ | R₄ |
|---|---|---|---|---|---|---|---|
| 197 | (II) | 3-methylphenyl / 4-methylphenyl amino | 3 | 3-methylphenyl / 4-methylphenyl amino | 3 | H— | H— |
| 198 | (II) | 3-methylphenyl / phenyl amino | 3 | 4-methylphenyl / phenyl amino | 3 | H— | H— |
| 199 | (II) | 4-biphenylyl / phenyl amino | 3 | 4-biphenylyl / phenyl amino | 3 | H— | H— |
| 200 | (II) | 3-biphenylyl / phenyl amino | 3 | 3-biphenylyl / phenyl amino | 3 | H— | H— |
| 201 | (II) | 2-biphenylyl / phenyl amino | 3 | 2-biphenylyl / phenyl amino | 3 | H— | H— |

TABLE 39-continued
| Compound No. | General formula | R₁ | Substitution position | R₂ | Substitution position | R₃ | R₄ |
|---|---|---|---|---|---|---|---|
| 202 | (II) | 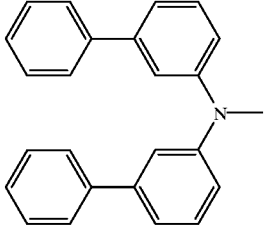 | 3 | 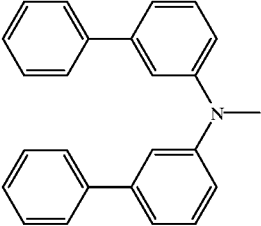 | 3 | H— | H— |
TABLE 40
| Compound No. | General formula | R₁ | Substitution position | R₂ | Substitution position | R₃ | R₄ |
|---|---|---|---|---|---|---|---|
| 203 | (II) | 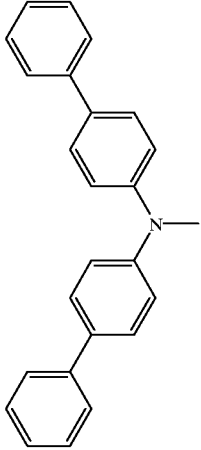 | 3 | 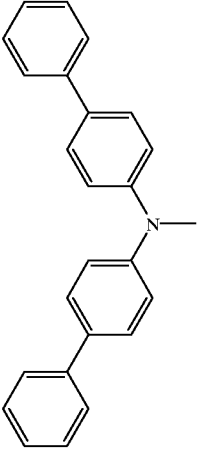 | 3 | H— | H— |
| 204 | (II) | 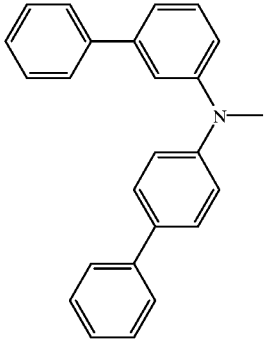 | 3 | 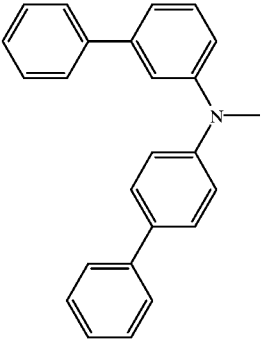 | 3 | H— | H— |

TABLE 40-continued

| Compound No. | General formula | R₁ | Substitution position | R₂ | Substitution position | R₃ | R₄ |
|---|---|---|---|---|---|---|---|
| 205 | (II) | 3-biphenylyl(phenyl)amino | 3 | 4-biphenylyl(phenyl)amino | 3 | H— | H— |
| 206 | (II) | 4-(diphenylamino)phenyl(phenyl)amino | 3 | 4-(diphenylamino)phenyl(phenyl)amino | 3 | H— | H— |
| 207 | (II) | 4-[N-phenyl-N-(4-methylphenyl)amino]phenyl(phenyl)amino | 3 | 4-[N-phenyl-N-(4-methylphenyl)amino]phenyl(phenyl)amino | 3 | H— | H— |

TABLE 41
| Compound No. | General formula | R₁ | Substitution position | R₂ | Substitution position | R₃ | R₄ |
|---|---|---|---|---|---|---|---|
| 208 | (II) | 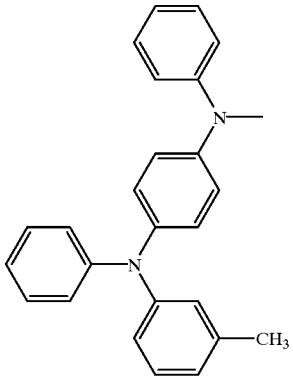 | 3 | 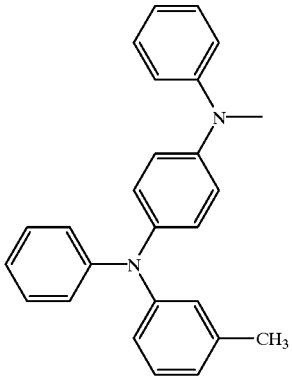 | 3 | H— | H— |
| 209 | (II) | 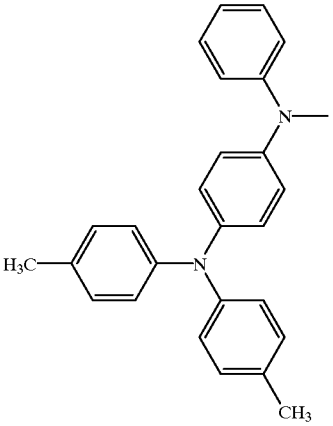 | 3 | 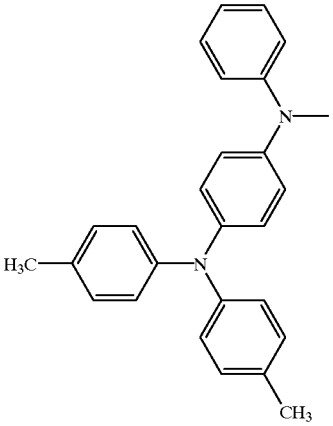 | 3 | H— | H— |
| 210 | (II) | 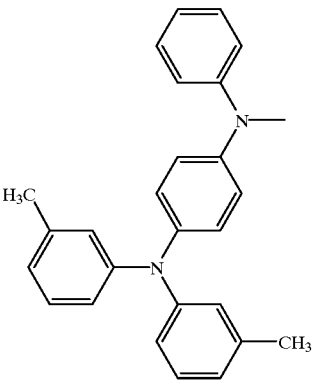 | 3 | 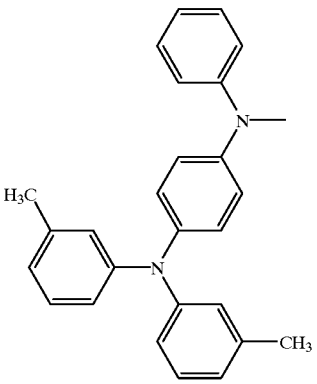 | 3 | H— | H— |

TABLE 41-continued

| Compound No. | General formula | R₁ | Substitution position | R₂ | Substitution position | R₃ | R₄ |
|---|---|---|---|---|---|---|---|
| 211 | (II) | [tri(p-tolyl)amino-p-tolyl-N-methyl group] | 3 | [tri(p-tolyl)amino-p-tolyl-N-methyl group] | 3 | H— | H— |

TABLE 42

| Compound No. | General formula | R₁ | Substitution position | R₂ | Substitution position | R₃ | R₄ |
|---|---|---|---|---|---|---|---|
| 212 | (II) | [diphenylamino-N-methyl group] | 3 | [bis(diphenylamino)phenyl-N-methyl group] | 3 | H— | H— |
| 213 | (II) | [diphenylamino-N-methyl group] | 3 | [phenyl(p-tolyl)amino-phenyl-diphenylamino-N-methyl group] | 3 | H— | H— |

TABLE 42-continued

| Compound No. | General formula | R₁ | Substitution position | R₂ | Substitution position | R₃ | R₄ |
|---|---|---|---|---|---|---|---|
| 214 | (II) | *diphenylamino group* | 3 | *N-phenyl-N-(3-biphenylyl)amino-phenyl group* | 3 | H— | H— |
| 215 | (II) | *di(4-methylphenyl)amino group* | 3 | *N,N-diphenylamino-phenyl-N-phenyl group* | 3 | H— | H— |
| 216 | (II) | *N,N-di(3-biphenylyl)amino group* | 3 | *N,N-diphenylamino-phenyl-N-phenyl group* | 3 | H— | H— |

TABLE 43
| Compound No. | General formula | R₁ | Substitution position | R₂ | Substitution position | R₃ | Substitution position | R₄ |
|---|---|---|---|---|---|---|---|---|
| 217 | (II) | 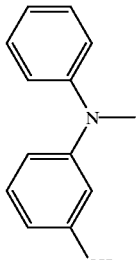 | 3 | 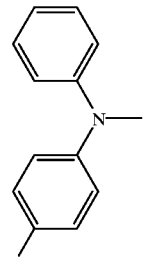 | 3 | H— | 3 | H— |
| 218 | (II) | 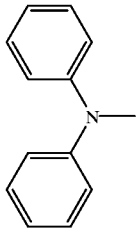 | 3 | 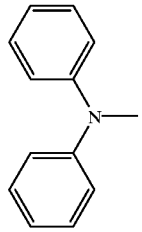 | 3 | 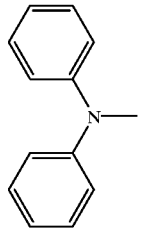 | 3 | H— |
| 219 | (II) | 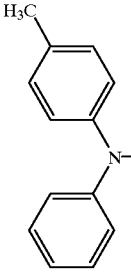 | 3 | 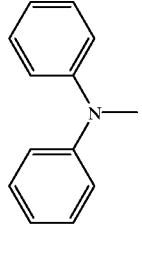 | 3 | 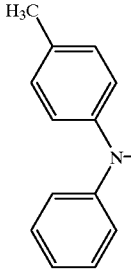 | 3 | H— |
| 220 | (II) | 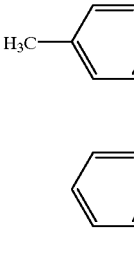 | 3 | 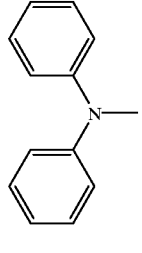 | 3 | 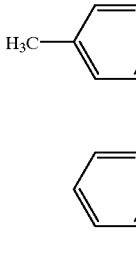 | 3 | H— |
| 221 | (II) | 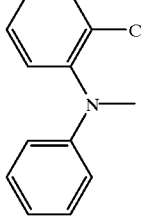 | 3 | 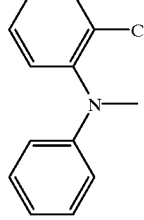 | 3 | 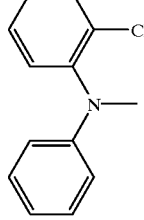 | 3 | H— |

TABLE 43-continued
| Compound No. | General formula | R₁ | Substitution position | R₂ | Substitution position | R₃ | Substitution position | R₄ |
|---|---|---|---|---|---|---|---|---|
| 222 | (II) | 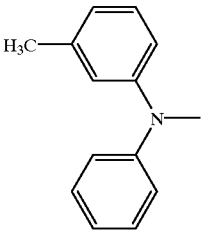 | 3 | 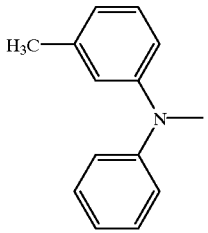 | 3 | 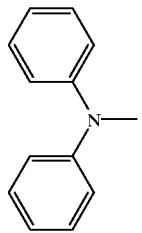 | 3 | H— |
TABLE 44
| Compound No. | General formula | R₁ | Substitution position | R₂ | Substitution position | R₃ | Substitution position | R₄ | Substitution position |
|---|---|---|---|---|---|---|---|---|---|
| 223 | (II) | 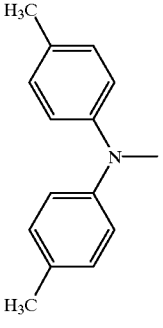 | 3 | 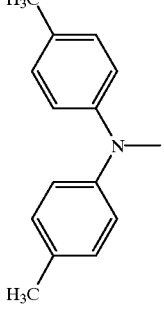 | 3 | 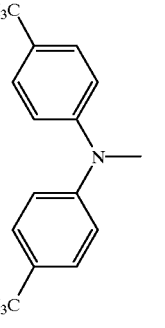 | 3 | H— | 3 |
| 224 | (II) | 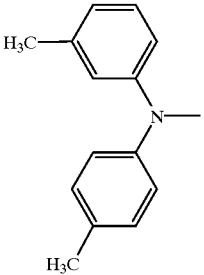 | 3 | 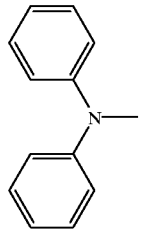 | 3 | 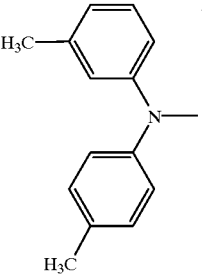 | 3 | H— | 3 |
| 225 | (II) | 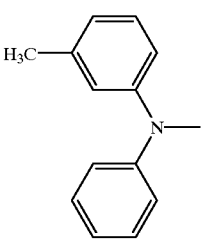 | 3 | 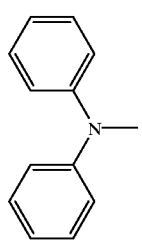 | 3 | 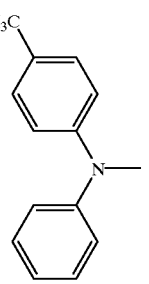 | 3 | H— | 3 |

TABLE 44-continued

| Compound No. | General formula | R₁ | Substitution position | R₂ | Substitution position | R₃ | Substitution position | R₄ | Substitution position |
|---|---|---|---|---|---|---|---|---|---|
| 226 | (II) | N(C₆H₅)₂ | 3 | N(C₆H₅)₂ | 3 | N(C₆H₅)₂ | 3 | N(C₆H₅)₂ | 3 |
| 227 | (II) | N(4-CH₃-C₆H₄)(C₆H₅) | 3 | N(C₆H₅)₂ | 3 | N(4-CH₃-C₆H₄)(C₆H₅) | 3 | N(C₆H₅)₂ | 3 |
| 228 | (II) | N(3-CH₃-C₆H₄)(C₆H₅) | 3 | N(C₆H₅)₂ | 3 | N(3-CH₃-C₆H₄)(C₆H₅) | 3 | N(C₆H₅)₂ | 3 |

TABLE 45

| Compound No. | General formula | R₁ | Substitution position | R₂ | Substitution position | R₃ | Substitution position | R₄ | Substitution position |
|---|---|---|---|---|---|---|---|---|---|
| 229 | (II) | N(2-CH₃-C₆H₄)(C₆H₅) | 3 | N(2-CH₃-C₆H₄)(C₆H₅) | 3 | N(2-CH₃-C₆H₄)(C₆H₅) | 3 | N(2-CH₃-C₆H₄)(C₆H₅) | 3 |
| 230 | (II) | N(3-CH₃-C₆H₄)(C₆H₅) | 3 | N(3-CH₃-C₆H₄)(C₆H₅) | 3 | N(C₆H₅)₂ | 3 | N(C₆H₅)₂ | 3 |

TABLE 45-continued
| Compound No. | General formula | R$_1$ | Substition position | R$_2$ | Substition position | R$_3$ | Substition position | R$_4$ | Substition position |
|---|---|---|---|---|---|---|---|---|---|
| 231 | (II) | 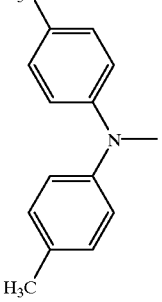 | 3 | 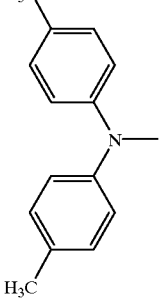 | 3 | 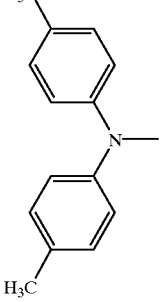 | 3 | 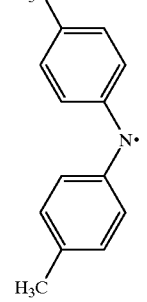 | 3 |
| 232 | (II) | 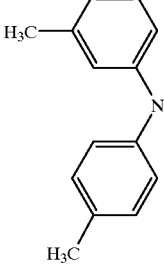 | 3 | 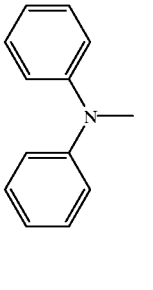 | 3 | 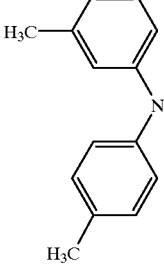 | 3 | 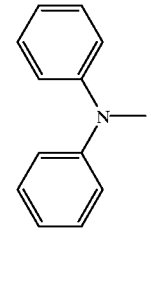 | 3 |
| 233 | (II) | 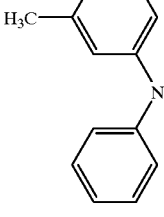 | 3 | 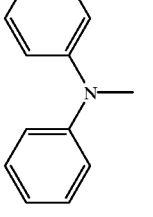 | 3 | 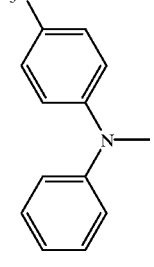 | 3 | 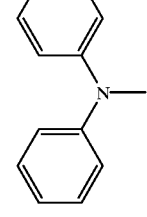 | 3 |
TABLE 46
| Compound No. | General formula | R$_1$ | Substition position | R$_2$ | R$_3$ | Substition position | R$_4$ |
|---|---|---|---|---|---|---|---|
| 234 | (II) | 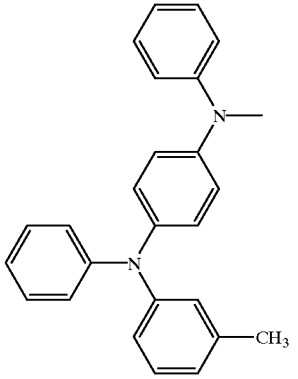 | 3 | H— | 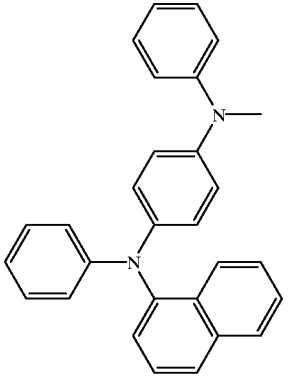 | 3 | H— |

TABLE 46-continued

| Compound No. | General formula | R₁ | Substitution position | R₂ | R₃ | Substitution position | R₄ |
|---|---|---|---|---|---|---|---|
| 235 | (II) | [N,N-diphenyl-N'-phenyl-N'-(2-naphthyl)-p-phenylenediamine group] | 3 | H— | [N,N-diphenyl-N'-phenyl-N'-(2-naphthyl)-p-phenylenediamine group] | 3 | H— |
| 236 | (II) | [N,N-diphenyl-N'-phenyl-N'-(1-naphthyl)-p-phenylenediamine group] | 3 | H— | [N,N,N',N'-tetraphenyl-p-phenylenediamine group] | 3 | H— |
| 237 | (II) | [N-phenyl-N-(2-naphthyl)-N'-phenyl-N'-(2-naphthyl)-p-phenylenediamine group] | 3 | H— | [N-phenyl-N-(2-naphthyl)-N'-phenyl-N'-(2-naphthyl)-p-phenylenediamine group] | 3 | H— |

TABLE 46-continued
| Compound No. | General formula | R₁ | Substition position | R₂ | R₃ | Substition position | R₄ |
|---|---|---|---|---|---|---|---|
| 238 | (II) | 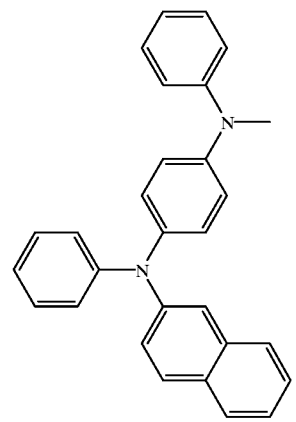 | 3 | H— | 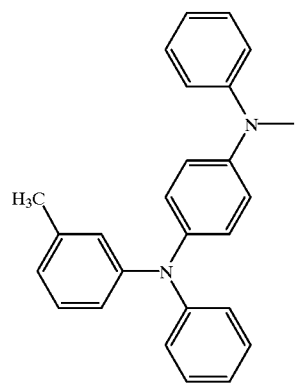 | 3 | H— |
TABLE 47
| Compound No. | General formula | R₁ | Substition position | R₂ | R₃ | Substition position | R₄ |
|---|---|---|---|---|---|---|---|
| 239 | (II) | | 3 | H— | | 4 | H— |
| 240 | (II) | | 3 | H— | | 4 | H— |
| 241 | (II) | 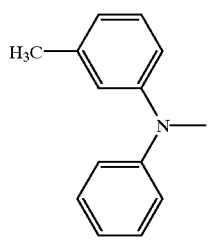 | 3 | H— | 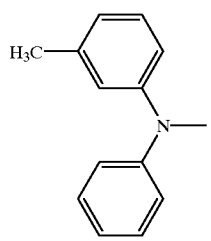 | 4 | H— |

TABLE 47-continued

| Compound No. | General formula | R₁ | Substitution position | R₂ | R₃ | Substitution position | R₄ |
| --- | --- | --- | --- | --- | --- | --- | --- |
| 242 | (II) | 2-methylphenyl-N-phenyl | 3 | H— | 2-methylphenyl-N-phenyl | 4 | H— |
| 243 | (II) | 3-methylphenyl-N-phenyl | 3 | H— | 4-methylphenyl-N-phenyl | 4 | H— |
| 244 | (II) | 3-biphenyl-N-phenyl | 3 | H— | 3-biphenyl-N-phenyl | 4 | H— |
| 245 | (II) | 3-biphenyl-N-(3-biphenyl) | 3 | H— | 3-biphenyl-N-(3-biphenyl) | 4 | H— |
| 246 | (II) | 3-biphenyl-N-phenyl | 3 | H— | 4-biphenyl-N-phenyl | 4 | H— |

TABLE 48
| Compound No. | General formula | R₁ | Substition position | R₂ | R₃ | Substitution position | R₄ |
|---|---|---|---|---|---|---|---|
| 247 | (II) | 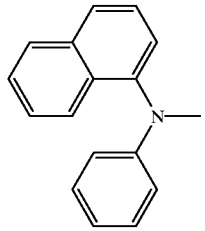 | 3 | H— | 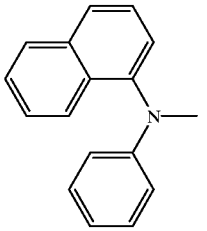 | 4 | H— |
| 248 | (II) | 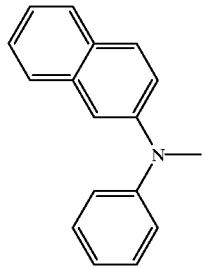 | 3 | H— | 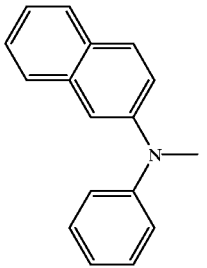 | 4 | H— |
| 249 | (II) | 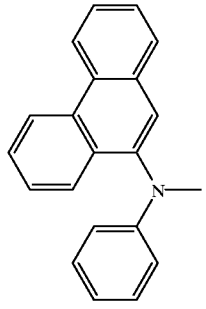 | 3 | H— | 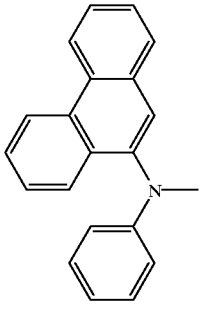 | 4 | H— |
| 250 | (II) | 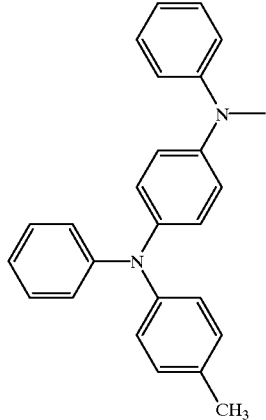 | 3 | H— | 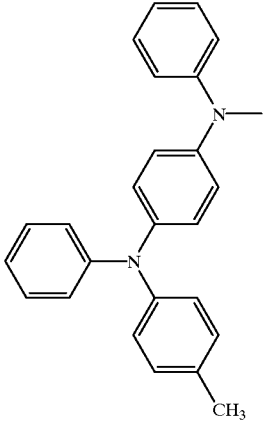 | 4 | H— |

TABLE 48-continued

| Compound No. | General formula | R₁ | Substition position | R₂ | R₃ | | Substitution position | R₄ |
|---|---|---|---|---|---|---|---|---|
| 251 | (II) | [structure: N,N-diphenylamino-phenyl linked to N-(3-methylphenyl)-N-phenyl] | 3 | H— | | [structure: N,N-diphenylamino-phenyl linked to N-(3-methylphenyl)-N-phenyl] | 4 | H— |
| 252 | (II) | [structure: N,N-diphenylamino-phenyl linked to N-(3-biphenylyl)-N-phenyl] | 3 | H— | | [structure: N,N-diphenylamino-phenyl linked to N-(3-biphenylyl)-N-phenyl] | 4 | H— |

TABLE 49

| Compound No. | General formula | R₁ | Substition position | R₂ | R₃ | Substitution position | R₄ |
|---|---|---|---|---|---|---|---|
| 253 | (II) | [structure: N,N-diphenylamino] | 3 | H— | | [structure: 4-(N,N-diphenylamino)phenyl-N-phenylamino] | 4 | H— |

TABLE 49-continued

| Compound No. | General formula | R₁ | Substitution position | R₂ | R₃ | Substitution position | R₄ |
|---|---|---|---|---|---|---|---|
| 254 | (II) | [diphenylamino] | 3 | H— | [4-(N-phenyl-N-(4-methylphenyl)amino)phenyl-N-phenylamino] | 4 | H— |
| 255 | (II) | [di(4-methylphenyl)amino] | 3 | H— | [4-(diphenylamino)phenyl-N-phenylamino] | 4 | H— |
| 256 | (II) | [N-(biphenyl-3-yl)-N-phenylamino] | 3 | H— | [4-(diphenylamino)phenyl-N-phenylamino] | 4 | H— |

TABLE 49-continued
| Compound No. | General formula | R$_1$ | Substitution position | R$_2$ | R$_3$ | Substitution position | R$_4$ |
|---|---|---|---|---|---|---|---|
| 257 | (II) | 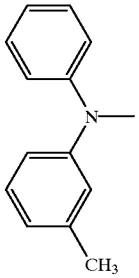 | 3 | H— | 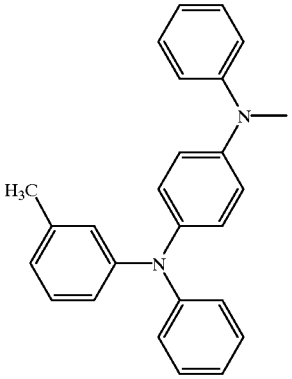 | 4 | H— |
TABLE 50
| Compound No. | General formula | R$_1$ | Substitution position | R$_2$ | Substitution position | R$_3$ | R$_4$ |
|---|---|---|---|---|---|---|---|
| 258 | (II) | 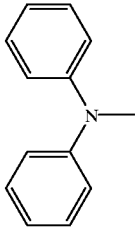 | 3 | 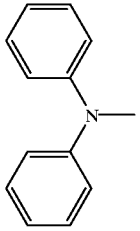 | 4 | H— | H— |
| 259 | (II) | 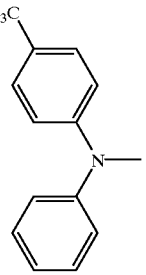 | 3 | 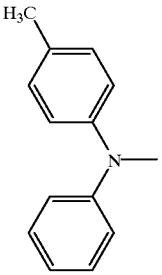 | 4 | H— | H— |
| 260 | (II) | 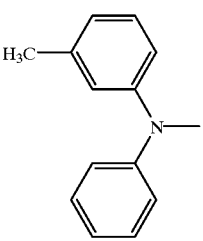 | 3 | 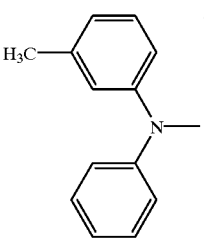 | 4 | H— | H— |

TABLE 50-continued
| Compound No. | General formula | R₁ | Substition position | R₂ | Substition position | R₃ | R₄ |
|---|---|---|---|---|---|---|---|
| 261 | (II) | 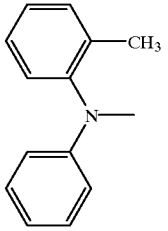 | 3 | 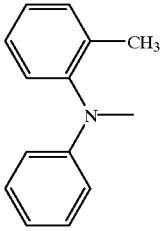 | 4 | H— | H— |
| 262 | (II) | 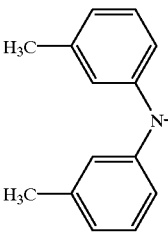 | 3 | 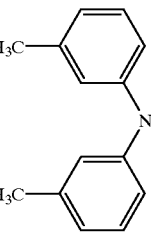 | 4 | H— | H— |
| 263 | (II) | 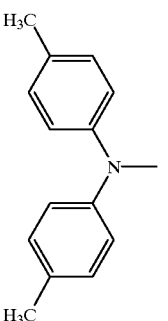 | 3 | 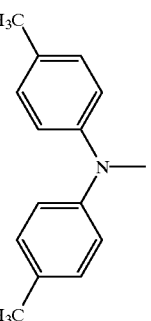 | 4 | H— | H— |
| 264 | (II) | 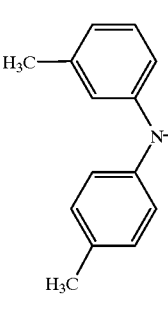 | 3 | 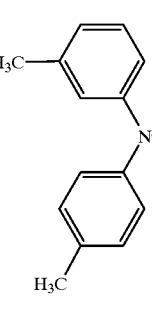 | 4 | H— | H— |
| 265 | (II) | 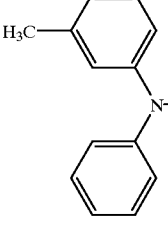 | 3 | 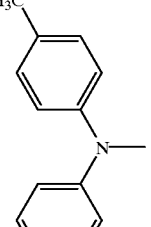 | 4 | H— | H— |

TABLE 51

| Compound No. | General formula | R₁ | Substitution position | R₂ | Substitution position | R₃ | Substitution position | R₄ |
|---|---|---|---|---|---|---|---|---|
| 266 | (II) | N(C₆H₅)₂ | 3 | N(C₆H₅)₂ | 3 | N(C₆H₅)₂ | 4 | H— |
| 267 | (II) | N(4-CH₃-C₆H₄)(C₆H₅) | 3 | N(C₆H₅)₂ | 4 | N(4-CH₃-C₆H₄)(C₆H₅) | 4 | H— |
| 268 | (II) | N(3-CH₃-C₆H₄)(C₆H₅) | 4 | N(C₆H₅)₂ | 3 | N(3-CH₃-C₆H₄)(C₆H₅) | 4 | H— |
| 269 | (II) | N(2-CH₃-C₆H₄)(C₆H₅) | 4 | N(2-CH₃-C₆H₄)(C₆H₅) | 4 | N(2-CH₃-C₆H₄)(C₆H₅) | 3 | H— |
| 270 | (II) | N(3-CH₃-C₆H₄)(C₆H₅) | 4 | N(3-CH₃-C₆H₄)(C₆H₅) | 3 | N(C₆H₅)₂ | 4 | H— |

TABLE 51-continued

| Compound No. | General formula | R₁ | Substitution position | R₂ | Substitution position | R₃ | Substitution position | R₄ |
|---|---|---|---|---|---|---|---|---|
| 271 | (II) | 4-methylphenyl, 4-methylphenyl-N | 3 | 4-methylphenyl, 4-methylphenyl-N | 4 | 4-methylphenyl, 4-methylphenyl-N | 3 | H— |
| 272 | (II) | 3-methylphenyl, 4-methylphenyl-N | 4 | diphenyl-N | 3 | 3-methylphenyl, 4-methylphenyl-N | 4 | H— |
| 273 | (II) | 3-methylphenyl, phenyl-N | 4 | diphenyl-N | 4 | 4-methylphenyl, phenyl-N | 3 | H— |

TABLE 52

| Compound No. | General formula | R₁ | Substitution position | R₂ | Substitution position | R₃ | Substitution position | R₄ | Substitution position |
|---|---|---|---|---|---|---|---|---|---|
| 274 | (II) | diphenyl-N | 3 | diphenyl-N | 3 | diphenyl-N | 4 | diphenyl-N | 4 |

TABLE 52-continued

| Compound No. | General formula | R₁ | Substitution position | R₂ | Substitution position | R₃ | Substitution position | R₄ | Substitution position |
|---|---|---|---|---|---|---|---|---|---|
| 275 | (II) | 4-methylphenyl-N-phenyl | 3 | N,N-diphenyl | 4 | 4-methylphenyl-N-phenyl | 3 | N,N-diphenyl | 4 |
| 276 | (II) | 3-methylphenyl-N-phenyl | 3 | N,N-diphenyl | 4 | 3-methylphenyl-N-phenyl | 3 | N,N-diphenyl | 4 |
| 277 | (II) | 2-methylphenyl-N-phenyl | 4 | 2-methylphenyl-N-phenyl | 4 | 2-methylphenyl-N-phenyl | 4 | 2-methylphenyl-N-phenyl | 3 |
| 278 | (II) | 3-methylphenyl-N-phenyl | 3 | 3-methylphenyl-N-phenyl | 4 | N,N-diphenyl | 3 | N,N-diphenyl | 4 |
| 279 | (II) | bis(4-methylphenyl)N | 4 | bis(4-methylphenyl)N | 4 | bis(4-methylphenyl)N | 3 | bis(4-methylphenyl)N | 3 |

TABLE 52-continued
| Compound No. | General formula | R₁ | Substition position | R₂ | Substition position | R₃ | Substition position | R₄ | Substition position |
|---|---|---|---|---|---|---|---|---|---|
| 280 | (II) | 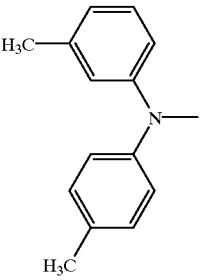 | 4 | 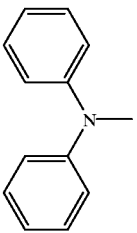 | 3 | 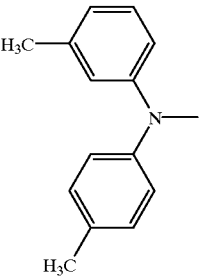 | 4 | 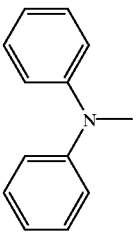 | 3 |
| 281 | (II) | 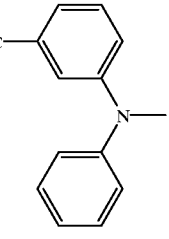 | 4 | 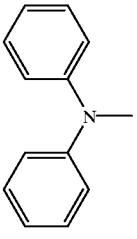 | 4 | 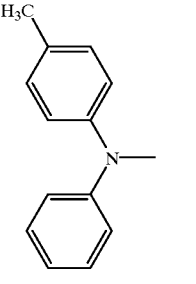 | 4 | 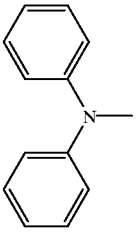 | 3 |
TABLE 53
| Compound No. | General formula | R₁ | Substition position | R₂ | R₃ | Substition position | R₄ |
|---|---|---|---|---|---|---|---|
| 282 | (II) | 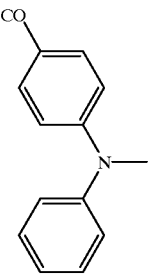 | 4 | H— | 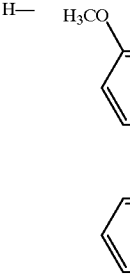 | 4 | H— |
| 283 | (II) | 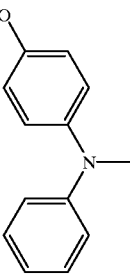 | 4 | H— |  | 4 | H— |

TABLE 53-continued
| Compound No. | General formula | R₁ | Substitution position | R₂ | R₃ | Substitution position | R₄ |
|---|---|---|---|---|---|---|---|
| 284 | (II) | 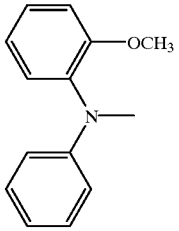 | 4 | H— | 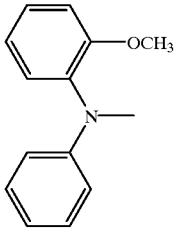 | 4 | H— |
| 285 | (II) | 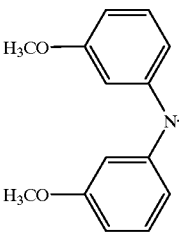 | 4 | H— | 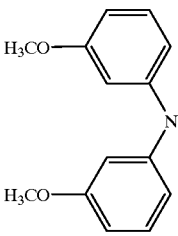 | 4 | H— |
| 286 | (II) | 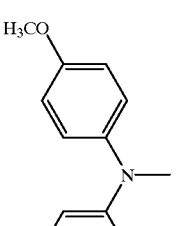 | 4 | H— | 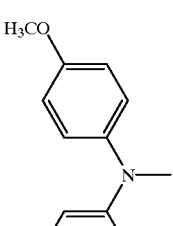 | 4 | H— |
| 287 | (II) | 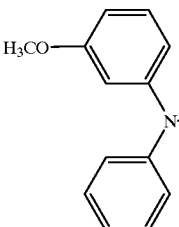 | 4 | H— | 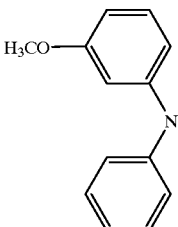 | 4 | H— |
| 288 | (II) | 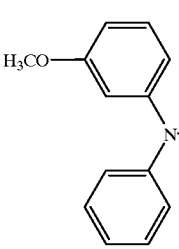 | 4 | H— | 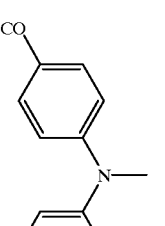 | 4 | H— |

TABLE 54

| Compound No. | General formula | R₁ | Substition position | R₂ | R₃ | Substitution position | R₄ |
|---|---|---|---|---|---|---|---|
| 289 | (II) | 4-phenoxyphenyl-N-phenyl | 4 | H— | 4-phenoxyphenyl-N-phenyl | 4 | H— |
| 290 | (II) | 3-phenoxyphenyl-N-phenyl | 4 | H— | 3-phenoxyphenyl-N-phenyl | 4 | H— |
| 291 | (II) | 2-phenoxyphenyl-N-phenyl | 4 | H— | 2-phenoxyphenyl-N-phenyl | 4 | H— |
| 292 | (II) | bis(3-phenoxyphenyl)-N | 4 | H— | bis(3-phenoxyphenyl)-N | 4 | H— |

TABLE 54-continued

| Compound No. | General formula | R₁ | Substition position | R₂ | R₃ | Substition position | R₄ |
|---|---|---|---|---|---|---|---|
| 293 | (II) | [4-phenoxyphenyl-N-(4-phenoxyphenyl)] group | 4 | H— | [4-phenoxyphenyl-N-(4-phenoxyphenyl)] group | 4 | H— |
| 294 | (II) | [3-phenoxyphenyl-N-(4-phenoxyphenyl)] group | 4 | H— | [3-phenoxyphenyl-N-(4-phenoxyphenyl)] group | 4 | H— |

TABLE 55

| Compound No. | General formula | R₁ | Substition position | R₂ | Substition position | R₃ | Substition position | R₄ | Substition position |
|---|---|---|---|---|---|---|---|---|---|
| 295 | (II) | N-phenyl-N-(4-methylphenyl) group | 4 | phenyl | 4 | N-phenyl-N-(4-methylphenyl) group | 4 | phenyl | 4 |
| 296 | (II) | N-phenyl-N-(4-methylphenyl) group | 4 | phenyl | 3 | N-phenyl-N-(4-methylphenyl) group | 4 | phenyl | 3 |

TABLE 55-continued
| Compound No. | General formula | R₁ | Substitution position | R₂ | Substitution position | R₃ | Substitution position | R₄ | Substitution position |
|---|---|---|---|---|---|---|---|---|---|
| 297 | (II) | 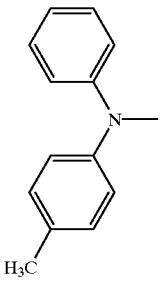 | 4 |  | 2,3 | 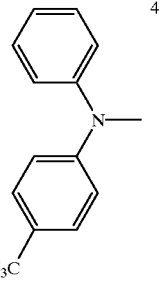 | 4 |  | 2,3 |
| 298 | (II) | 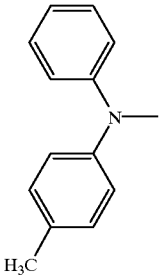 | 4 |  | 3,4 | 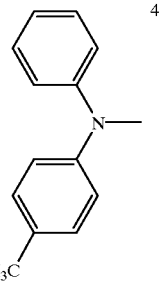 | 4 |  | 3,4 |
| 299 | (II) | 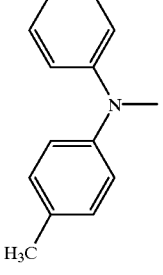 | 4 |  | 4 | 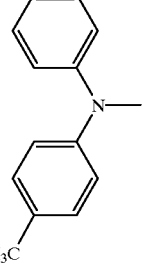 | 4 |  | 4 |
| 300 | (II) | 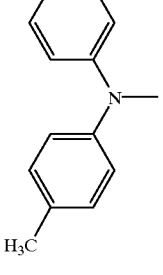 | 4 | 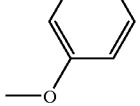 | 4 | 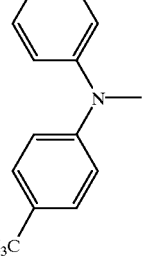 | 4 | 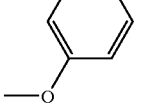 | 4 |

TABLE 56
| Compound No. | General formula | R₁ | Substitution position | R₂ | R₃ | Substitution position | R₄ |
|---|---|---|---|---|---|---|---|
| 301 | (III) | 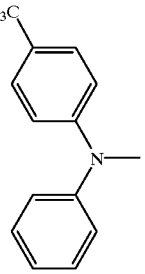 | 4 | H— | 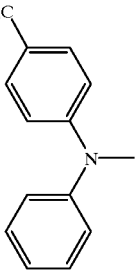 | 4 | H— |
| 302 | (III) | 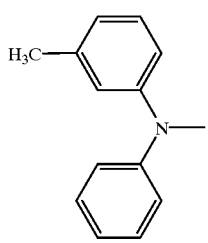 | 4 | H— | 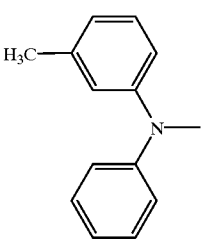 | 4 | H— |
| 303 | (III) | 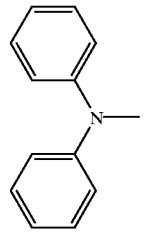 | 4 | H— | 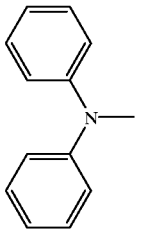 | 4 | H— |
| 304 | (III) | 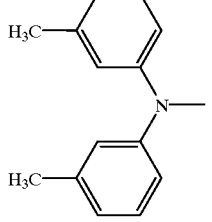 | 4 | H— | 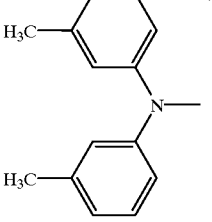 | 4 | H— |
| 305 | (III) | 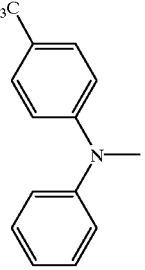 | 3 | H— | 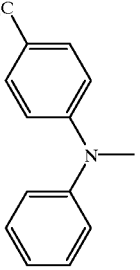 | 3 | H— |

TABLE 56-continued

| Compound No. | General formula | R₁ | Substitution position | R₂ | R₃ | Substitution position | R₄ |
|---|---|---|---|---|---|---|---|
| 306 | (III) | 3-methylphenyl-N-phenyl | 3 | H— | 3-methylphenyl-N-phenyl | 3 | H— |
| 307 | (III) | 3-methylphenyl-N-phenyl | 4 | H— | 4-methylphenyl-N-phenyl | 3 | H— |

TABLE 57

| Compound No. | General formula | R₁ | Substitution position | R₂ | R₃ | Substitution position | R₄ |
|---|---|---|---|---|---|---|---|
| 308 | (III) | 4-biphenylyl-N-phenyl | 4 | H— | 4-biphenylyl-N-phenyl | 4 | H— |
| 309 | (III) | 3-biphenylyl-N-phenyl | 4 | H— | 3-biphenylyl-N-phenyl | 4 | H— |

TABLE 57-continued
| Compound No. | General formula | R₁ | Substition position | R₂ | R₃ | Substition position | R₄ |
|---|---|---|---|---|---|---|---|
| 310 | (III) | 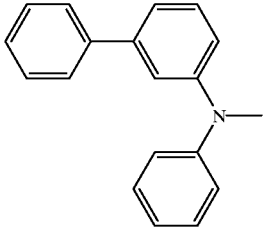 | 3 | H— | 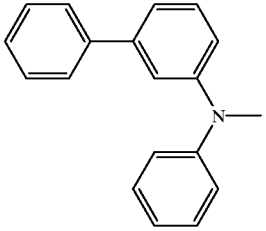 | 3 | H— |
| 311 | (III) | 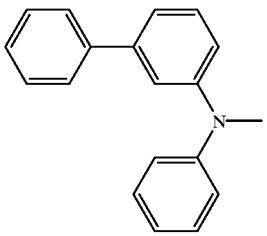 | 4 | H— | 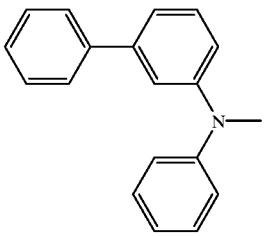 | 3 | H— |
| 312 | (III) | 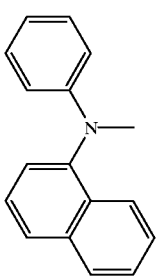 | 4 | H— | 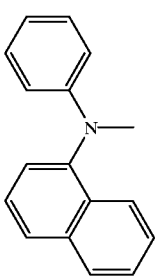 | 4 | H— |
| 313 | (III) | 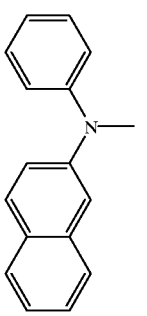 | 3 | H— | 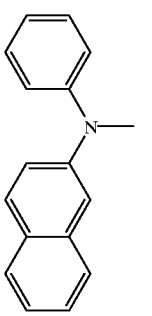 | 3 | H— |
| 314 | (III) | 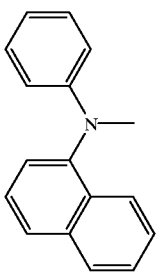 | 4 | H— | 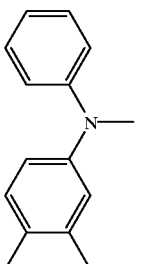 | 3 | H— |

TABLE 58

| Compound No. | General formula | R₁ | Substitution position | R₂ | R₃ | | Substitution position | R₄ |
|---|---|---|---|---|---|---|---|---|
| 315 | (III) | (triphenylamine-phenyl-N-phenyl group) | 4 | H— | (triphenylamine-phenyl-N-phenyl group) | | 4 | H— |
| 316 | (III) | (N-phenyl-N-(4-methylphenyl)-phenyl-N-phenyl group) | 4 | H— | (N-phenyl-N-(4-methylphenyl)-phenyl-N-phenyl group) | | 4 | H— |
| 317 | (III) | (N-phenyl-N-(3-methylphenyl)-phenyl-N-phenyl group) | 3 | H— | (N-phenyl-N-(3-methylphenyl)-phenyl-N-phenyl group) | | 3 | H— |

TABLE 58-continued

| Compound No. | General formula | R₁ | Substition position | R₂ | R₃ | Substition position | R₄ |
|---|---|---|---|---|---|---|---|
| 318 | (III) | | 3 | H— | | 3 | H— |
| 319 | (III) | | 4 | H— | | 3 | H— |
| 320 | (III) | | 4 | H— | | 4 | H— |

TABLE 59
| Compound No. | General formula | R₁ | Substitution position | R₂ | Substitution position | R₃ | Substitution position | R₄ | Substitution position |
|---|---|---|---|---|---|---|---|---|---|
| 321 | (III) | H— | | H— | | 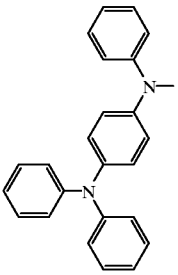 | 4 | H— | |
| 322 | (III) | H— | | H— | | 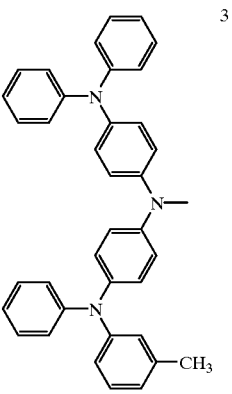 | 3 | H— | |
| 323 | (III) | 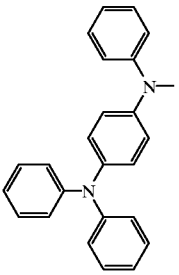 | 4 | 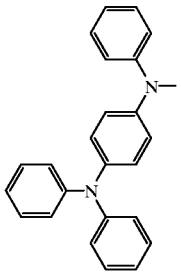 | 4 | H— | | H— | |
| 324 | (III) | 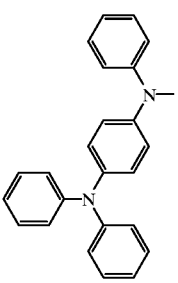 | 4 | 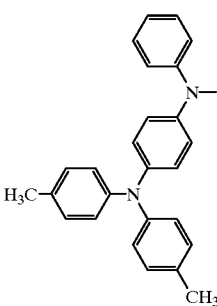 | 4 | 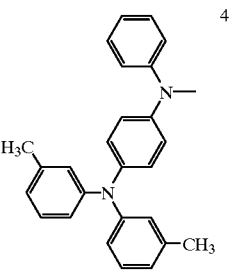 | 4 | H— | |

TABLE 59-continued
| Compound No. | General formula | R₁ | Substitution position | R₂ | Substitution position | R₃ | Substitution position | R₄ | Substitution position |
|---|---|---|---|---|---|---|---|---|---|
| 325 | (III) | 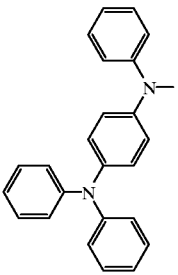 | 4 | 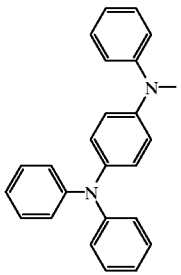 | 4 | 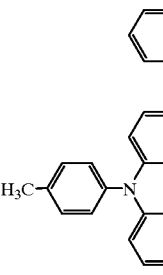 | 4 | 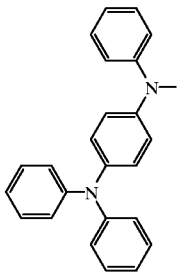 | 4 |
TABLE 60
| Compound No. | General formula | R₁ | Substitution position | R₂ | R₃ | Substitution position | R₄ |
|---|---|---|---|---|---|---|---|
| 326 | (IV) | 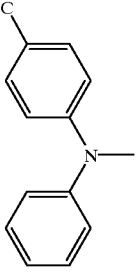 | 4 | H— | 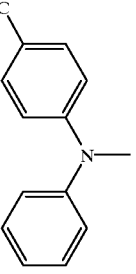 | 4 | H— |
| 327 | (IV) |  | 4 | H— |  | 4 | H— |
| 328 | (IV) | 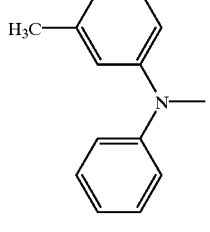 | 4 | H— | 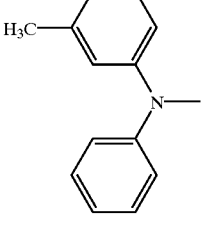 | 4 | H— |
| 329 | (IV) |  | 4 | H— |  | 4 | H— |

TABLE 60-continued
| Compound No. | General formula | $R_1$ | Substitution position | $R_2$ | $R_3$ | Substitution position | $R_4$ |
|---|---|---|---|---|---|---|---|
| 330 | (IV) | 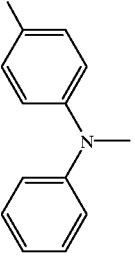 | 3 | H— | 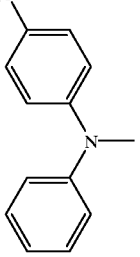 | 3 | H— |
| 331 | (IV) | 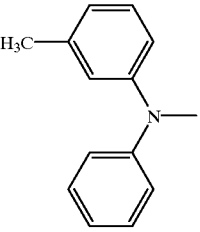 | 3 | H— | 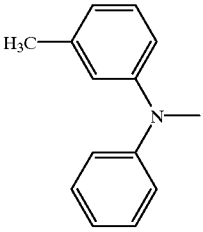 | 3 | H— |
| 332 | (IV) | 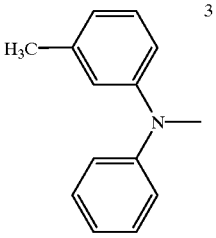 | 3 | H— | 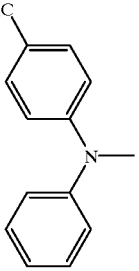 | 3 | H— |
TABLE 61
| Compound No. | General formula | $R_1$ | Substitution position | $R_2$ | $R_3$ | Substitution position | $R_4$ |
|---|---|---|---|---|---|---|---|
| 333 | (IV) | 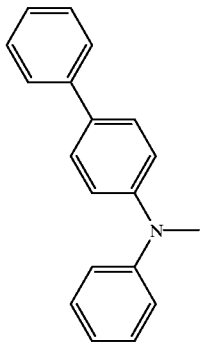 | 4 | H— | 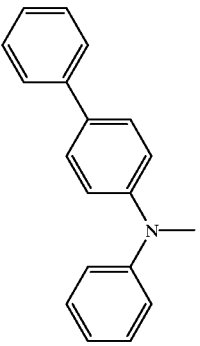 | 4 | H— |

TABLE 61-continued

| Compound No. | General formula | R₁ | Substition position | R₂ | R₃ | Substition position | R₄ |
|---|---|---|---|---|---|---|---|
| 334 | (IV) | 3-biphenyl-N-phenyl | 4 | H— | 3-biphenyl-N-phenyl | 4 | H— |
| 335 | (IV) | 3-biphenyl-N-phenyl | 3 | H— | 3-biphenyl-N-phenyl | 3 | H— |
| 336 | (IV) | 3-biphenyl-N-phenyl | 4 | H— | 3-biphenyl-N-phenyl | 3 | H— |
| 337 | (IV) | 1-naphthyl-N-phenyl | 4 | H— | 1-naphthyl-N-phenyl | 4 | H— |
| 338 | (IV) | 2-naphthyl-N-phenyl | 3 | H— | 2-naphthyl-N-phenyl | 3 | H— |

TABLE 61-continued

| Compound No. | General formula | R₁ | Substition position | R₂ | R₃ | Substition position | R₄ |
|---|---|---|---|---|---|---|---|
| 339 | (IV) | *N-phenyl-1-naphthylamino group* | 4 | H— | *N-phenyl-2-naphthylamino group* | 3 | H— |

TABLE 62

| Compound No. | General formula | R₁ | Substition position | R₂ | R₃ | Substition position | R₄ |
|---|---|---|---|---|---|---|---|
| 340 | (IV) | *4-(diphenylamino)phenyl-phenylamino group* | 4 | H— | *4-(diphenylamino)phenyl-phenylamino group* | 4 | H— |
| 341 | (IV) | *4-(N-phenyl-N-(4-methylphenyl)amino)phenyl-phenylamino group* | 4 | H— | *4-(N-phenyl-N-(4-methylphenyl)amino)phenyl-phenylamino group* | 4 | H— |

TABLE 62-continued

| Compound No. | General formula | R₁ | Substition position | R₂ | R₃ | Substition position | R₄ |
|---|---|---|---|---|---|---|---|
| 342 | (IV) | *structure* | 3 | H— | *structure* | 3 | H— |
| 343 | (IV) | *structure* | 3 | H— | *structure* | 3 | H— |
| 344 | (IV) | *structure* | 4 | H— | *structure* | 3 | H— |

TABLE 62-continued

| Compound No. | General formula | R₁ | Substition position | R₂ | R₃ | Substition position | R₄ |
|---|---|---|---|---|---|---|---|
| 345 | (III) | (tri-p-tolylamino-phenyl-N-methyl group) | 4 | H— | (tri-p-tolylamino-phenyl-N-methyl group) | 4 | H— |

TABLE 63

| Compound No. | General formula | R₁ | Substition position | R₂ | Substition position |
|---|---|---|---|---|---|
| 346 | (IV) | H— | | H— | |
| 347 | (IV) | H— | | H— | |
| 348 | (IV) | (triphenylamino-phenyl-N group) | 4 | (triphenylamino-phenyl-N group) | 4 |

TABLE 63-continued

| Compound No. | R₃ | Substition position | R₄ | Substition position |
|---|---|---|---|---|
| 349 | (III) [structure] | 4 | [structure] | 4 |
| 350 | (III) [structure] | 4 | [structure] | 4 |
| 346 | [structure] | 4 | H— | |

TABLE 63-continued
| 347 | 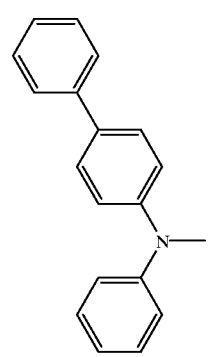 | 3 | H— |
| 348 | H— | | H— |
| 349 | 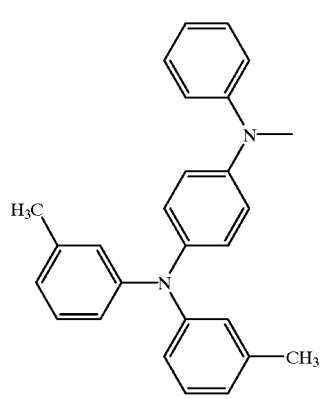 | 4 | H— |
| 350 | 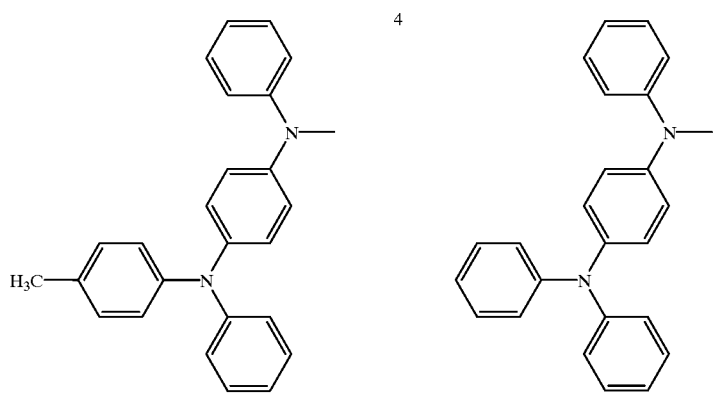 | 4 | |
TABLE 64
| Compound No. | General formula | $R_1$ | Substition position | $R_2$ | $R_3$ | Substition position | $R_4$ |
|---|---|---|---|---|---|---|---|
| 351 | (V) | | 4 | H— | | 4 | H— |

TABLE 64-continued
| Compound No. | General formula | R₁ | Substitution position | R₂ | R₃ | Substitution position | R₄ |
|---|---|---|---|---|---|---|---|
| 352 | (V) | 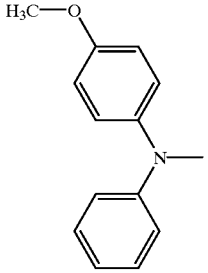 | 4 | H— | 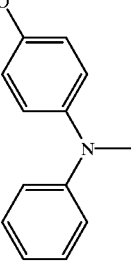 | 4 | H— |
| 353 | (V) | 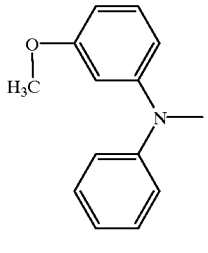 | 4 | H— | 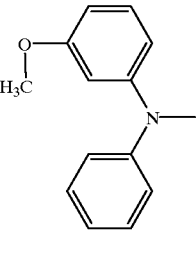 | 4 | H— |
| 354 | (V) | 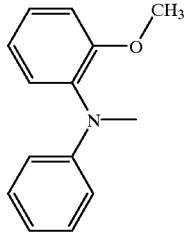 | 4 | H— | 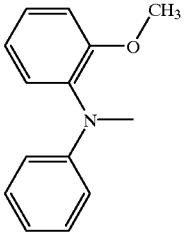 | 4 | H— |
| 355 | (V) | 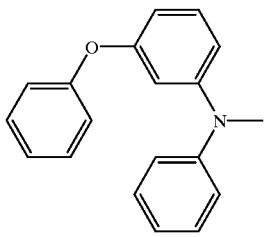 | 4 | H— | 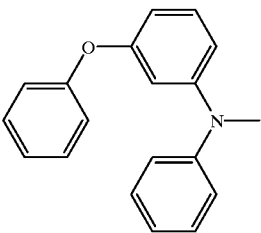 | 4 | H— |
| 356 | (V) | 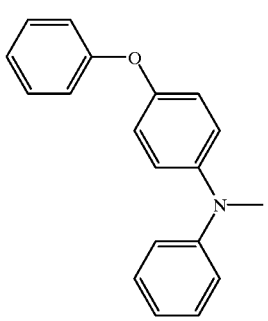 | 4 | H— | 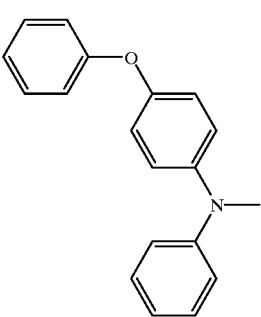 | 4 | H— |

TABLE 64-continued

| Compound No. | General formula | R₁ | Substition position | R₂ | R₃ | Substition position | R₄ |
|---|---|---|---|---|---|---|---|
| 357 | (V) | (structure) | 4 | H— | (structure) | 4 | H— |

TABLE 65

| Compound No. | General formula | R₁ | Substition position | R₂ | R₃ | Substition position | R₄ |
|---|---|---|---|---|---|---|---|
| 358 | (V) | (structure) | 4 | H— | (structure) | 4 | H— |
| 359 | (V) | (structure) | 4 | H' | (structure) | 4 | H— |
| 360 | (V) | (structure) | 4 | H— | (structure) | 4 | H— |
| 361 | (V) | (structure) | 4 | H— | (structure) | 4 | H— |

TABLE 65-continued
| Compound No. | General formula | R₁ | Substition position | R₂ | R₃ | Substition position | R₄ |
|---|---|---|---|---|---|---|---|
| 362 | (V) | 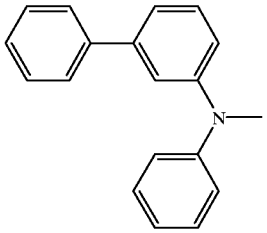 | 4 | H— | 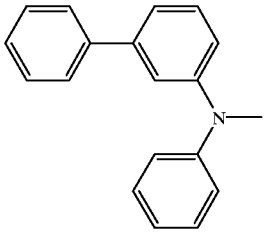 | 4 | H— |
| 363 | (V) | 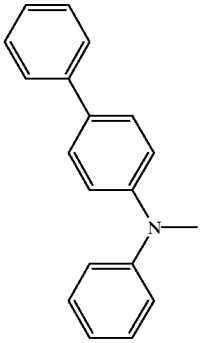 | 4 | H— | 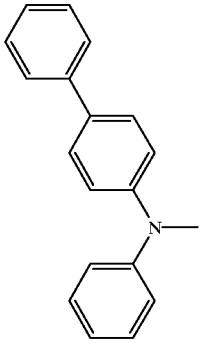 | 4 | H— |
| 364 | (V) | 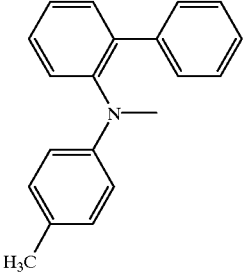 | 4 | H— | 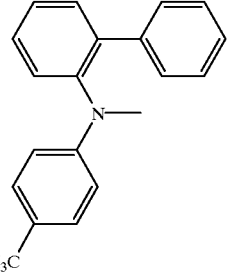 | 4 | H— |
TABLE 66
| Compound No. | General formula | R₁ | Substition position | R₂ | R₃ | Substition position | R₄ |
|---|---|---|---|---|---|---|---|
| 365 | (V) | 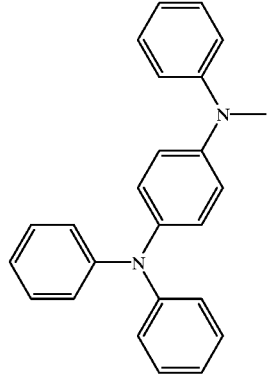 | 4 | H— | 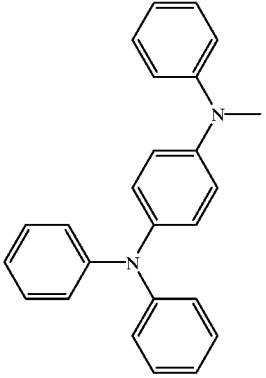 | 4 | H— |

TABLE 66-continued
| Compound No. | General formula | R₁ | Substitution position | R₂ | R₃ | Substitution position | R₄ |
|---|---|---|---|---|---|---|---|
| 366 | (V) | 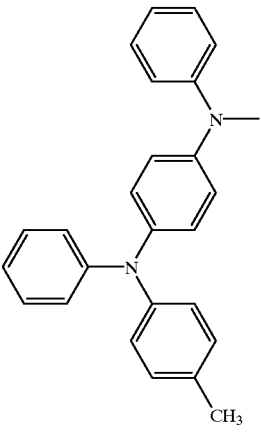 | 4 | H— | 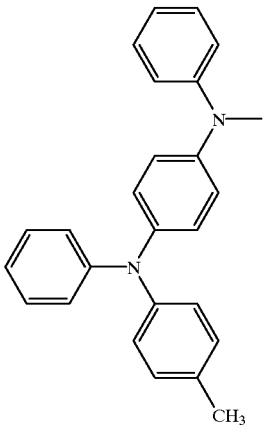 | 4 | H— |
| 367 | (V) | 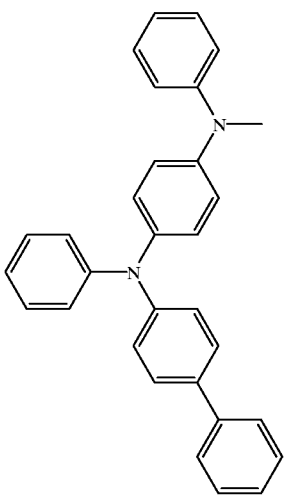 | 4 | H— | 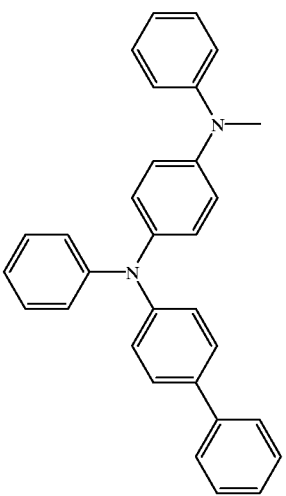 | 4 | H— |
| 368 | (V) | 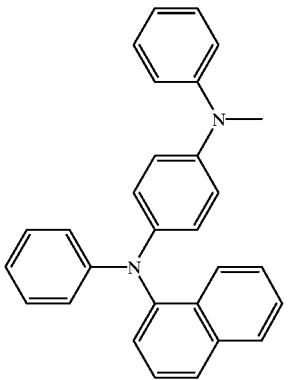 | 4 | H— | 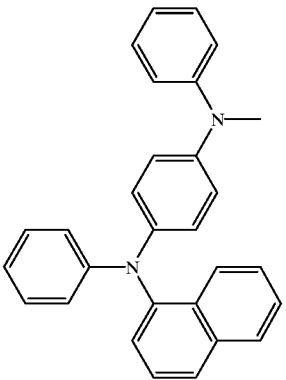 | 4 | H— |

TABLE 67

| Compound No. | General formula | R₁ | Substition position | R₂ | R₃ | Substition position | R₄ |
|---|---|---|---|---|---|---|---|
| 369 | (V) | N,N-diphenylamino | 3 | H— | N,N-diphenylamino | 3 | H— |
| 370 | (V) | N-(4-methoxyphenyl)-N-phenylamino | 3 | H— | N-(4-methoxyphenyl)-N-phenylamino | 3 | H— |
| 371 | (V) | N-(3-methoxyphenyl)-N-phenylamino | 3 | H— | N-(3-methoxyphenyl)-N-phenylamino | 3 | H— |
| 372 | (V) | N-(2-methoxyphenyl)-N-phenylamino | 3 | H— | N-(2-methoxyphenyl)-N-phenylamino | 3 | H— |
| 373 | (V) | N-(3-phenoxyphenyl)-N-phenylamino | 3 | H— | N-(3-phenoxyphenyl)-N-phenylamino | 3 | H— |

TABLE 67-continued

| Compound No. | General formula | R₁ | Substition position | R₂ | R₃ | Substition position | R₄ |
|---|---|---|---|---|---|---|---|
| 374 | (V) | (4-phenoxyphenyl)(phenyl)amino | 3 | H— | (4-phenoxyphenyl)(phenyl)amino | 3 | H— |
| 375 | (V) | (2-phenoxyphenyl)(4-methylphenyl)amino | 3 | H— | (2-phenoxyphenyl)(4-methylphenyl)amino | 4 | H— |

TABLE 68

| Compound No. | General formula | R₁ | Substition position | R₂ | R₃ | Substition position | R₄ |
|---|---|---|---|---|---|---|---|
| 376 | (V) | diphenylamino | 3 | H— | diphenylamino | 3 | H— |
| 377 | (V) | (4-methylphenyl)(phenyl)amino | 3 | H— | (4-methylphenyl)(phenyl)amino | 3 | H— |

TABLE 68-continued

| Compound No. | General formula | R₁ | Substitution position | R₂ | R₃ | Substitution position | R₄ |
|---|---|---|---|---|---|---|---|
| 378 | (V) | N,N-(3-methylphenyl)(phenyl)amino | 3 | H— | N,N-(3-methylphenyl)(phenyl)amino | 3 | H— |
| 379 | (V) | N,N-(2-methylphenyl)(phenyl)amino | 3 | H— | N,N-(2-methylphenyl)(phenyl)amino | 3 | H— |
| 380 | (V) | N,N-(biphenyl-3-yl)(phenyl)amino | 3 | H— | N,N-(biphenyl-3-yl)(phenyl)amino | 3 | H— |
| 381 | (V) | N,N-(biphenyl-4-yl)(phenyl)amino | 3 | H— | N,N-(biphenyl-4-yl)(phenyl)amino | 3 | H— |
| 382 | (V) | N-(biphenyl-2-yl)-N-(4-methylphenyl)amino | 3 | H— | N-(biphenyl-2-yl)-N-(4-methylphenyl)amino | 3 | H— |

TABLE 69

| Compound No | General formula | R₁ | Substition position | R₂ | R₃ | Substition position | R₄ |
|---|---|---|---|---|---|---|---|
| 383 | (V) | [N,N-diphenylamino-phenyl-N-diphenyl group] | 3 | H— | [N,N-diphenylamino-phenyl-N-diphenyl group] | 3 | H— |
| 384 | (V) | [N-phenyl-N-(p-tolyl)amino-phenyl-N-phenyl group] | 3 | H— | [N-phenyl-N-(p-tolyl)amino-phenyl-N-phenyl group] | 3 | H— |
| 385 | (V) | [N,N-diphenylamino-phenyl-N-phenyl-N-biphenyl group] | 3 | H— | [N,N-diphenylamino-phenyl-N-phenyl-N-biphenyl group] | 3 | H— |

TABLE 69-continued

| Compound No | General formua | R₁ | Substition position | R₂ | R₃ | Substition position | R₄ |
|---|---|---|---|---|---|---|---|
| 386 | (V) | *N,N-diphenylamino-phenyl-N-phenyl-naphthylamine group* | 3 | H— | *N,N-diphenylamino-phenyl-N-phenyl-naphthylamine group* | 3 | H— |

TABLE 70

| Compound No. | General formula | R₁ | Substition position | R₂ | R₃ | Substition position | R₄ |
|---|---|---|---|---|---|---|---|
| 387 | (VI) | *N,N-diphenylamino group* | 4 | H— | *N,N-diphenylamino group* | 4 | H— |
| 388 | (VI) | *N-(4-methoxyphenyl)-N-phenylamino group* | 4 | H— | *N-(4-methoxyphenyl)-N-phenylamino group* | 4 | H— |
| 389 | (VI) | *N-(3-methoxyphenyl)-N-phenylamino group* | 4 | H— | *N-(3-methoxyphenyl)-N-phenylamino group* | 4 | H— |

TABLE 70-continued

| Compound No. | General formula | R₁ | Substitution position | R₂ | R₃ | Substitution position | R₄ |
|---|---|---|---|---|---|---|---|
| 390 | (VI) | (2-methoxyphenyl)(phenyl)amino | 4 | H— | (2-methoxyphenyl)(phenyl)amino | 4 | H— |
| 391 | (VI) | (3-phenoxyphenyl)(phenyl)amino | 4 | H— | (3-phenoxyphenyl)(phenyl)amino | 4 | H— |
| 392 | (VI) | (4-phenoxyphenyl)(phenyl)amino | 4 | H— | (4-phenoxyphenyl)(phenyl)amino | 4 | H— |
| 393 | (VI) | (2-phenoxyphenyl)(4-methylphenyl)amino | 4 | H— | (2-phenoxyphenyl)(4-methylphenyl)amino | 4 | H— |

TABLE 71
| Compound No. | General formula | R₁ | Substitution position | R₂ | R₃ | Substitution position | R₄ |
|---|---|---|---|---|---|---|---|
| 394 | (VI) | 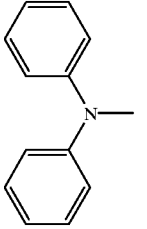 | 4 | H— | 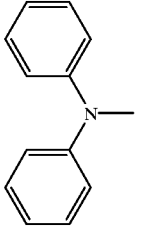 | 4 | H— |
| 395 | (VI) | 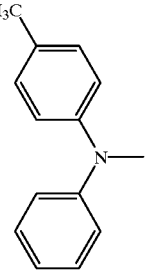 | 4 | H— | 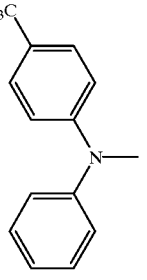 | 4 | H— |
| 396 | (VI) | 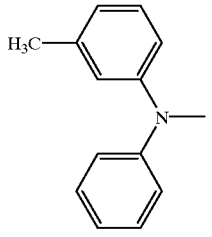 | 4 | H— | 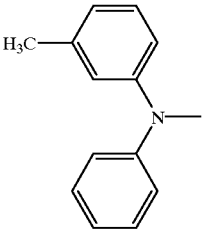 | 4 | H— |
| 397 | (VI) | 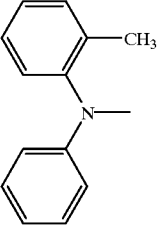 | 4 | H— | 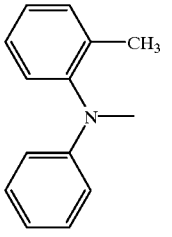 | 4 | H— |
| 398 | (VI) | 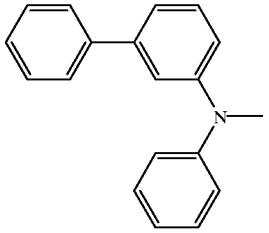 | 4 | H— | 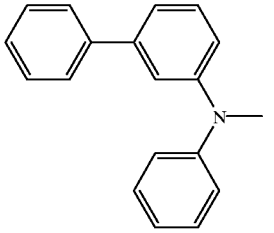 | 4 | H— |

TABLE 71-continued
| Compound No. | General formula | R₁ | Substitution position | R₂ | R₃ | Substitution position | R₄ |
|---|---|---|---|---|---|---|---|
| 399 | (VI) | 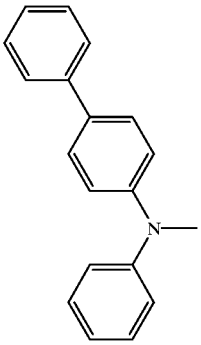 | 4 | H— | 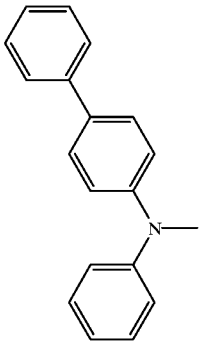 | 4 | H— |
| 400 | (VI) | 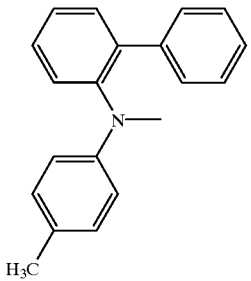 | 4 | H— | 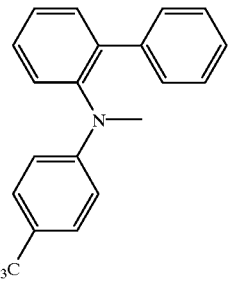 | 4 | H— |
TABLE 72
| Compound No. | General formula | R₁ | Substitution position | R₂ | R₃ | Substitution position | R₄ |
|---|---|---|---|---|---|---|---|
| 401 | (VI) | 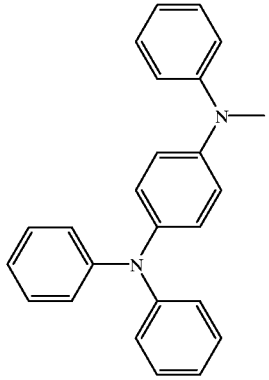 | 4 | H— | 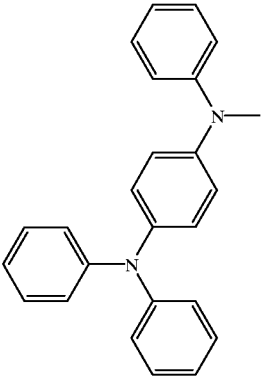 | 4 | H— |

TABLE 72-continued

| Compound No. | General formula | R₁ | Substitution position | R₂ | R₃ | Substitution position | R₄ |
|---|---|---|---|---|---|---|---|
| 402 | (VI) | | 4 | H— | | 4 | H— |
| 403 | (VI) | | 4 | H— | | 4 | H— |
| 404 | (VI) | | 4 | H— | | 4 | H— |

TABLE 73

| Compound No. | General formula | R₁ | Substition position | R₂ | R₃ | Substition position | R₄ |
|---|---|---|---|---|---|---|---|
| 405 | (VI) | [diphenylamino] | 3 | H— | [diphenylamino] | 3 | H— |
| 406 | (VI) | [N-(4-methoxyphenyl)-N-phenylamino] | 3 | H— | [N-(4-methoxyphenyl)-N-phenylamino] | 3 | H— |
| 407 | (VI) | [N-(3-methoxyphenyl)-N-phenylamino] | 3 | H— | [N-(3-methoxyphenyl)-N-phenylamino] | 3 | H— |
| 408 | (VI) | [N-(2-methoxyphenyl)-N-phenylamino] | 3 | H— | [N-(2-methoxyphenyl)-N-phenylamino] | 3 | H— |
| 409 | (VI) | [N-(3-phenoxyphenyl)-N-phenylamino] | 3 | H— | [N-(3-phenoxyphenyl)-N-phenylamino] | 3 | H— |

TABLE 73-continued

| Compound No. | General formula | R₁ | Substitution position | R₂ | R₃ | Substitution position | R₄ |
|---|---|---|---|---|---|---|---|
| 410 | (VI) | 4-phenoxyphenyl-N-methyl-N-phenyl | 3 | H— | 4-phenoxyphenyl-N-methyl-N-phenyl | 3 | H— |
| 411 | (VI) | 2-phenoxyphenyl-N-methyl-N-(4-methylphenyl) | 3 | H— | 2-phenoxyphenyl-N-methyl-N-(4-methylphenyl) | 4 | H— |

TABLE 74

| Compound No. | General formula | R₁ | Substitution position | R₂ | R₃ | Substitution position | R₄ |
|---|---|---|---|---|---|---|---|
| 412 | (VI) | N-methyl-N,N-diphenylamino | 3 | H— | N-methyl-N,N-diphenylamino | 3 | H— |
| 413 | (VI) | N-methyl-N-(4-methylphenyl)-N-phenylamino | 3 | H— | N-methyl-N-(4-methylphenyl)-N-phenylamino | 3 | H— |

TABLE 74-continued

| Compound No. | General formula | R₁ | Substitution position | R₂ | R₃ | Substitution position | R₄ |
|---|---|---|---|---|---|---|---|
| 414 | (VI) | N-(3-methylphenyl)-N-phenyl | 3 | H— | N-(3-methylphenyl)-N-phenyl | 3 | H— |
| 415 | (VI) | N-(2-methylphenyl)-N-phenyl | 4 | H— | N-(2-methylphenyl)-N-phenyl | 3 | H— |
| 416 | (VI) | N-(biphenyl-3-yl)-N-phenyl | 3 | H— | N-(biphenyl-3-yl)-N-phenyl | 3 | H— |
| 417 | (VI) | N-(biphenyl-4-yl)-N-phenyl | 4 | H— | N-(biphenyl-4-yl)-N-phenyl | 3 | H— |
| 418 | (VI) | N-(biphenyl-2-yl)-N-(4-methylphenyl) | 3 | H— | N-(biphenyl-2-yl)-N-(4-methylphenyl) | 3 | H— |

TABLE 75

| Compound No. | General formula | R₁ | Substition position | R₂ | R₃ | Substition position | R₄ |
|---|---|---|---|---|---|---|---|
| 419 | (VI) | (structure) | 3 | H— | (structure) | 3 | H— |
| 420 | (VI) | (structure) | 3 | H— | (structure) | 3 | H— |
| 421 | (VI) | (structure) | 3 | H— | (structure) | 3 | H— |

TABLE 75-continued

| Compound No. | General formula | R₁ | Substition position | R₂ | R₃ | Substition position | R₄ |
|---|---|---|---|---|---|---|---|
| 422 | (VI) | [N,N-diphenylamino-phenyl-N-phenyl-N-(1-naphthyl)amino group] | 3 | H— | [N,N-diphenylamino-phenyl-N-phenyl-N-(1-naphthyl)amino group] | 3 | H— |

TABLE 76

| Compound No. | General formula | R₁ | Substition position | R₂ | R₃ | Substition position | R₄ | R₅ |
|---|---|---|---|---|---|---|---|---|
| 423 | (VII) | N-(4-methylphenyl)-N-phenyl | 4 | H— | N-(4-methylphenyl)-N-phenyl | 4 | H— | phenyl |
| 424 | (VII) | N-(3-methylphenyl)-N-phenyl | 4 | H— | N-(3-methylphenyl)-N-phenyl | 4 | H— | phenyl |
| 425 | (VII) | N-(2-methylphenyl)-N-phenyl | 4 | H— | N-(2-methylphenyl)-N-phenyl | 4 | H— | phenyl |

TABLE 76-continued
| Compound No. | General formula | R₁ | Substition position | R₂ | R₃ | Substition position | R₄ | R₅ |
|---|---|---|---|---|---|---|---|---|
| 426 | (VII) | 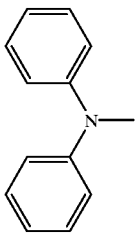 | 4 | H— | 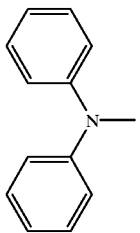 | 4 | H— | 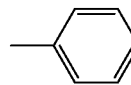 |
| 427 | (VII) | 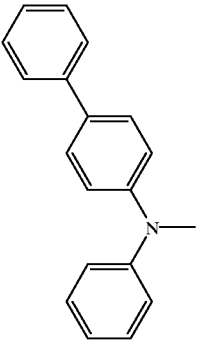 | 4 | H— | 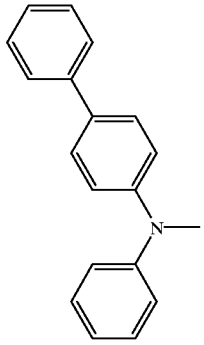 | 4 | H— | 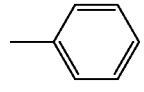 |
| 428 | (VII) | 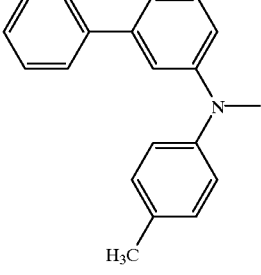 | 4 | H— | 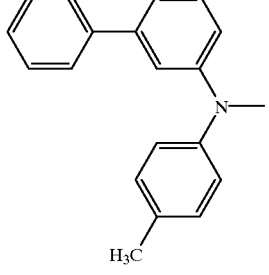 | 4 | H— | 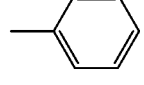 |
TABLE 77
| Compound No. | General formula | R₁ | Substition position | R₂ | R₃ | Substition position | R₄ | R₅ |
|---|---|---|---|---|---|---|---|---|
| 429 | (VII) | 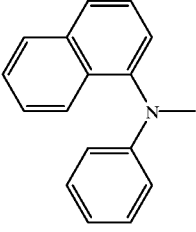 | 4 | H— | 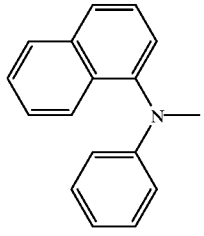 | 4 | H— | 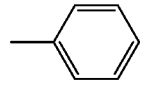 |

TABLE 77-continued
| Compound No. | General formula | R₁ | Substition position | R₂ | R₃ | Substition position | R₄ | R₅ |
|---|---|---|---|---|---|---|---|---|
| 430 | (VII) | 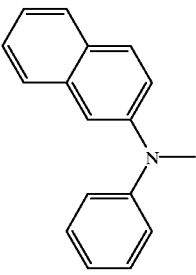 | 4 | H— | 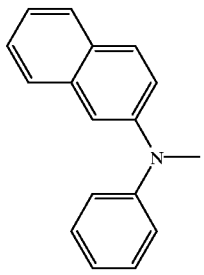 | 4 | H— | 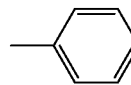 |
| 431 | (VII) | 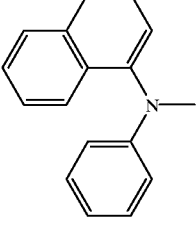 | 4 | H— | 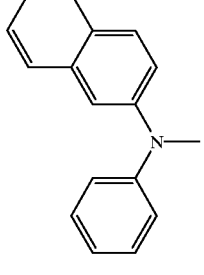 | 4 | H— | 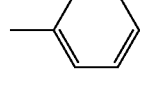 |
| 432 | (VII) | 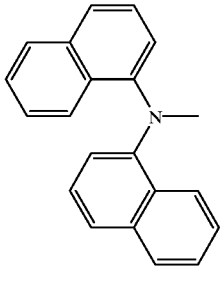 | 4 | H— | 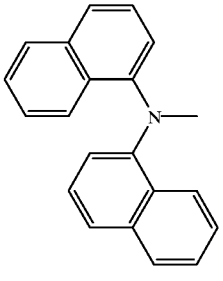 | 4 | H— | 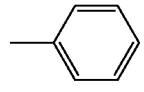 |
| 433 | (VII) | 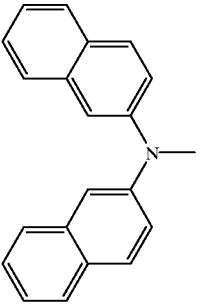 | 4 | H— | 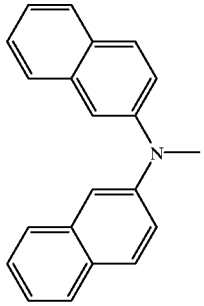 | 4 | H— | 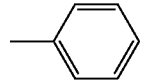 |

TABLE 77-continued

| Compound No. | General formula | R₁ | Substition position | R₂ | R₃ | Substition position | R₄ | R₅ |
|---|---|---|---|---|---|---|---|---|
| 434 | (VII) | [2-naphthyl-N-methyl] | 4 | H— | [1-naphthyl-N-naphthyl] | 4 | H— | [phenyl] |
| 435 | (VII) | [pyrenyl-N-phenyl] | 4 | H— | [pyrenyl-N-phenyl] | 4 | H— | [phenyl] |
| 436 | (VII) | [pyrenyl-N-phenyl] | 4 | H— | [pyrenyl-N-phenyl] | 4 | H— | [phenyl] |

TABLE 78

| Compound No. | General formula | R₁ | Substition position | R₂ | R₃ | Substition position | R₄ | R₅ |
|---|---|---|---|---|---|---|---|---|
| 437 | (VII) | [4-methylphenyl-N-phenyl] | 4 | H— | [4-methylphenyl-N-phenyl] | 4 | H— | [1-naphthyl] |

TABLE 78-continued
| Compound No. | General formula | $R_1$ | Substitution position | $R_2$ | $R_3$ | Substitution position | $R_4$ | $R_5$ |
|---|---|---|---|---|---|---|---|---|
| 438 | (VII) | 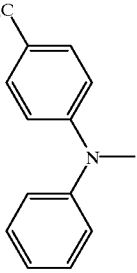 | 4 | H— | 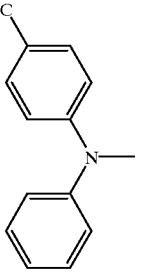 | 4 | H— | 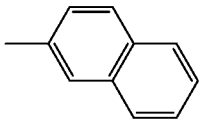 |
| 439 | (VII) | 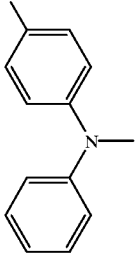 | 4 | H— | 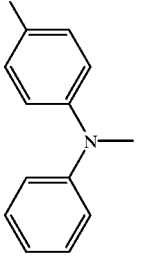 | 4 | H— | 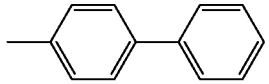 |
| 440 | (VII) | 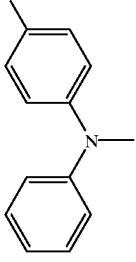 | 4 | H— | 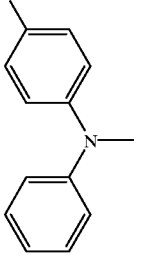 | 4 | H— | 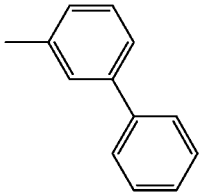 |
| 441 | (VII) | 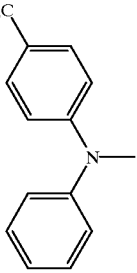 | 4 | H— | 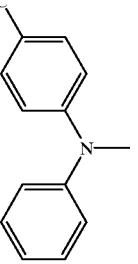 | 4 | H— | 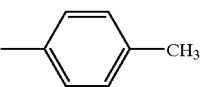 |
| 442 | (VII) | 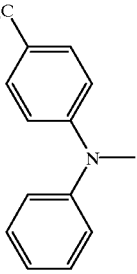 | 4 | H— | 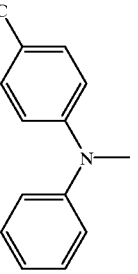 | 4 | H— | 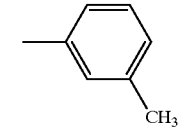 |

273 274
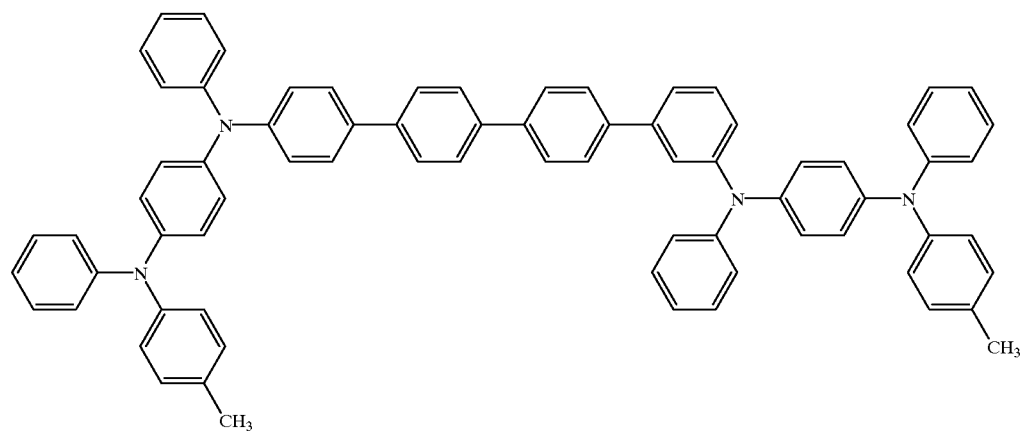
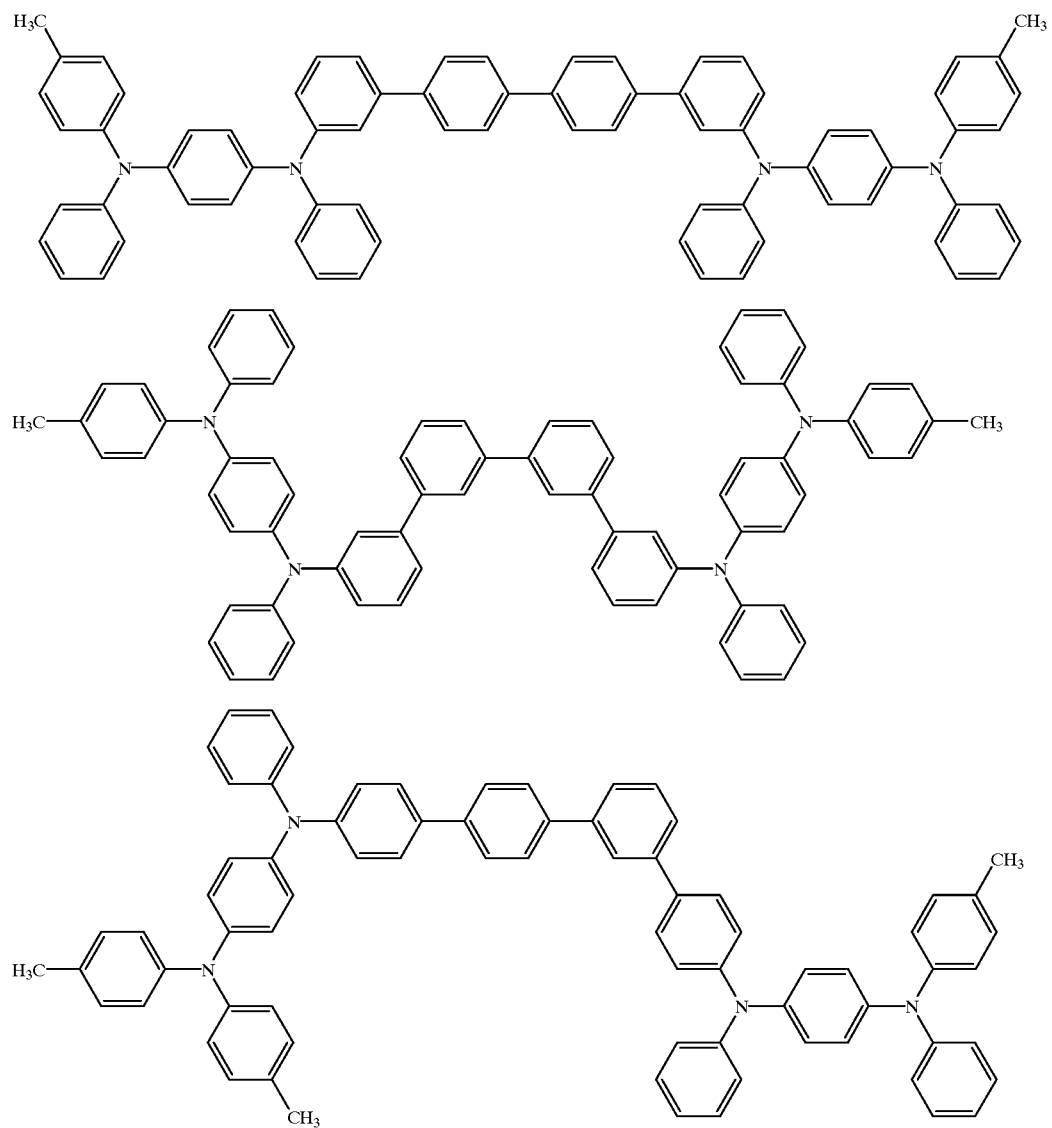

-continued
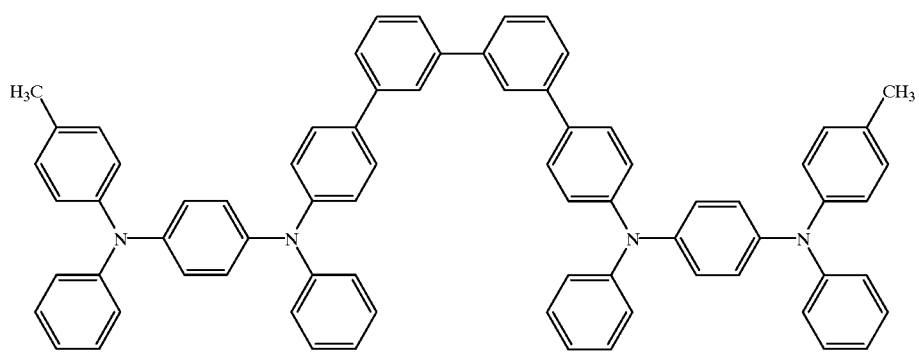
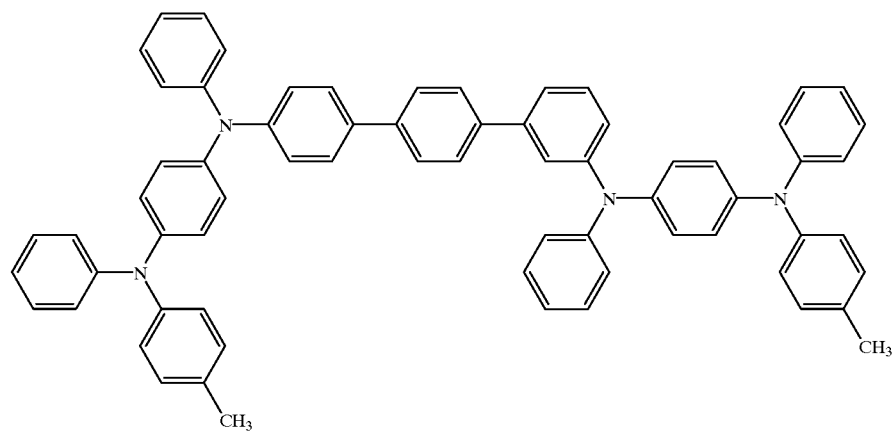
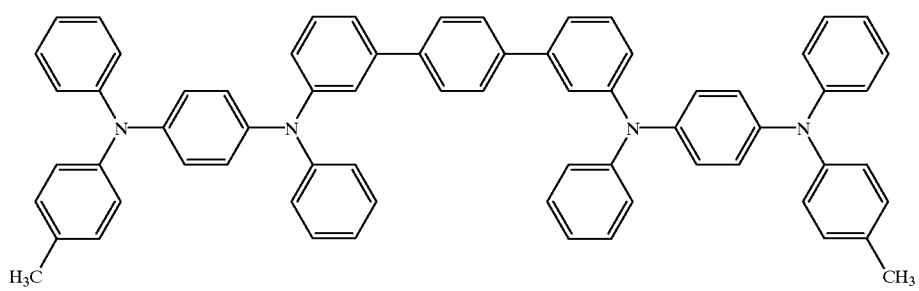
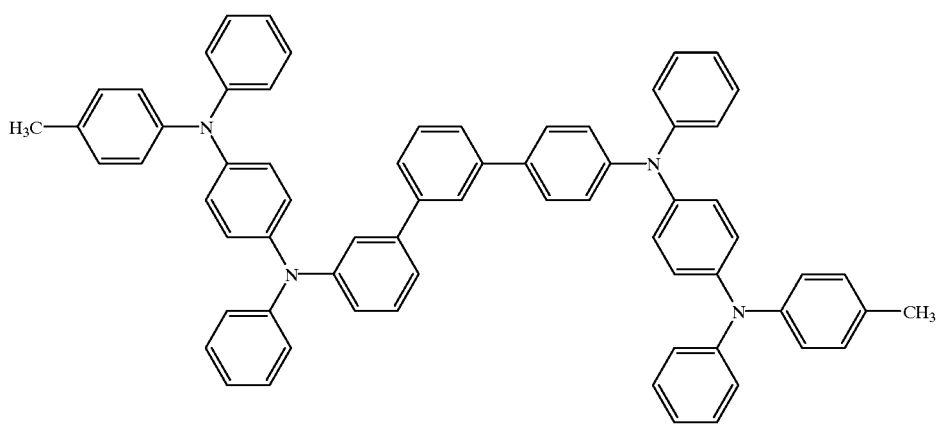

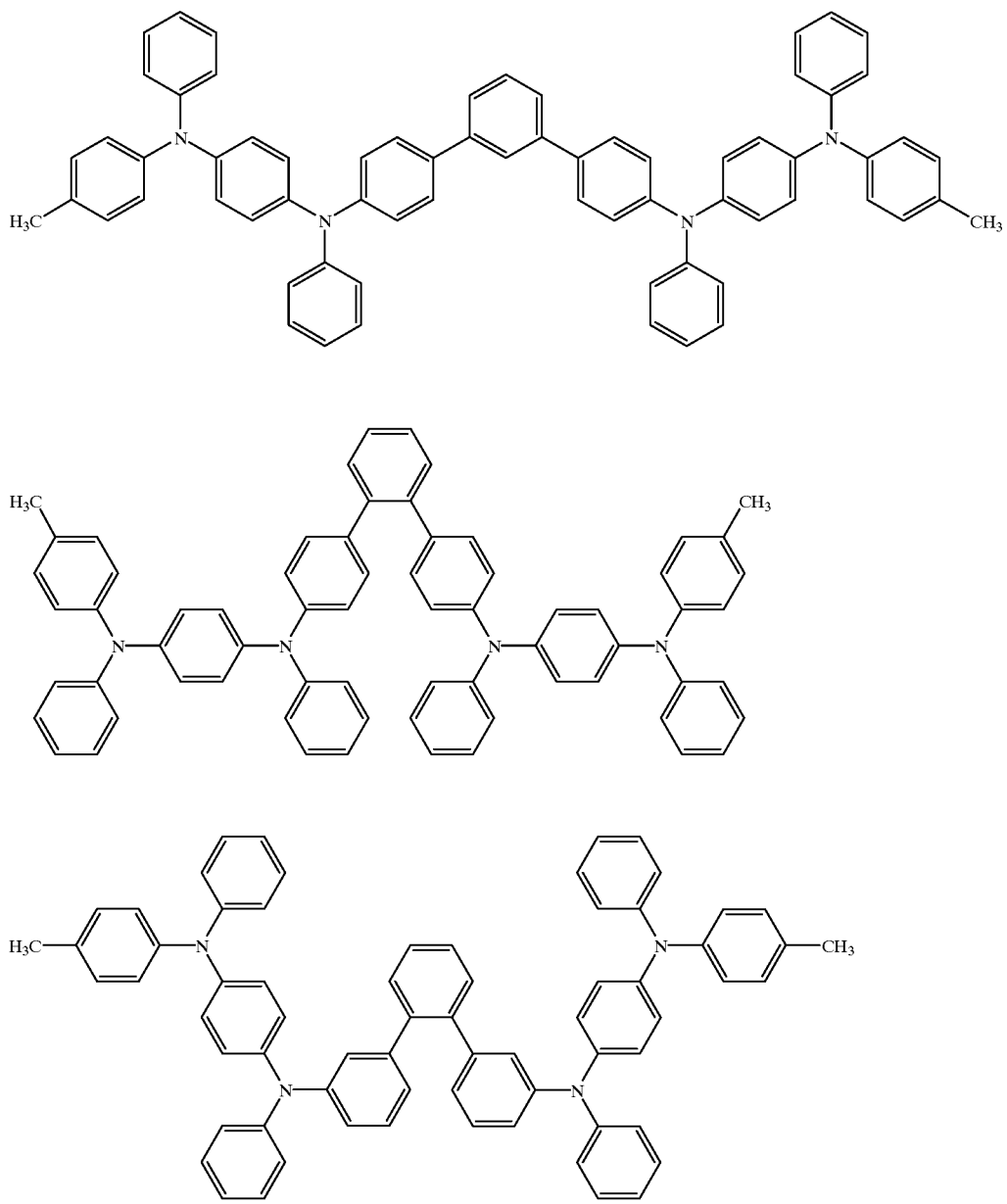

The compounds of the invention may be synthesized by the Ullmann reaction for the condensation of, for instance, a primary or secondary aromatic amine and an aromatic iodide using a catalyst such as copper. When $R_{01}$ and $R_{02}$ are asymmetric with respect to $R_{03}$ and $R_{04}$ (both sides of the biphenyl moieties are asymmetric), $R_{01}$ and $R_{02}$, and $R_{03}$ and $R_{04}$ may synthesize the corresponding amines, finally followed by the coupling of the biphenyl moieties (guanine coupling, Ni(dppp)Cl$_2$, etc.).

Illustrative synthesis examples are given below as (1) to (4). Using copper as the catalyst, 4,4'-diiodobiphenyl is coupled to a compound having formula (A) in (1), and a compound having formula (B) is coupled to a compound having formula (C) in (2), thereby obtaining an asymmetric compound having formula (D). In (3), a compound having formula (E) is coupled to a compound having formula (F) using Ni(dppp)Cl$_2$ to obtain an asymmetric compound having formula (G). In (4), an asymmetric compound having formula (K) is synthesized from a compound having formula (J), and a compound having formula (I) obtained from a compound having formula (H). Here it is to be noted that $R_{30}$, $R_{41}$, $R_{45}$ and $R_{50}$ in the following formulae (A) to (K) are tantamount to $R_{01}$, $R_{02}$, $R_{03}$ and $R_{04}$ in general formula (I), respectively, and $R_{32}$, $R_{33}$, $R_{42}$, $R_{43}$, $R_{46}$, $R_{47}$, $R_{52}$ and $R_{53}$ are tantamount to $R_{11}$, $R_{12}$, $R_{13}$, $R_{14}$, $R_{15}$, $R_{16}$ and $R_{17}$ in general formula (I), respectively.

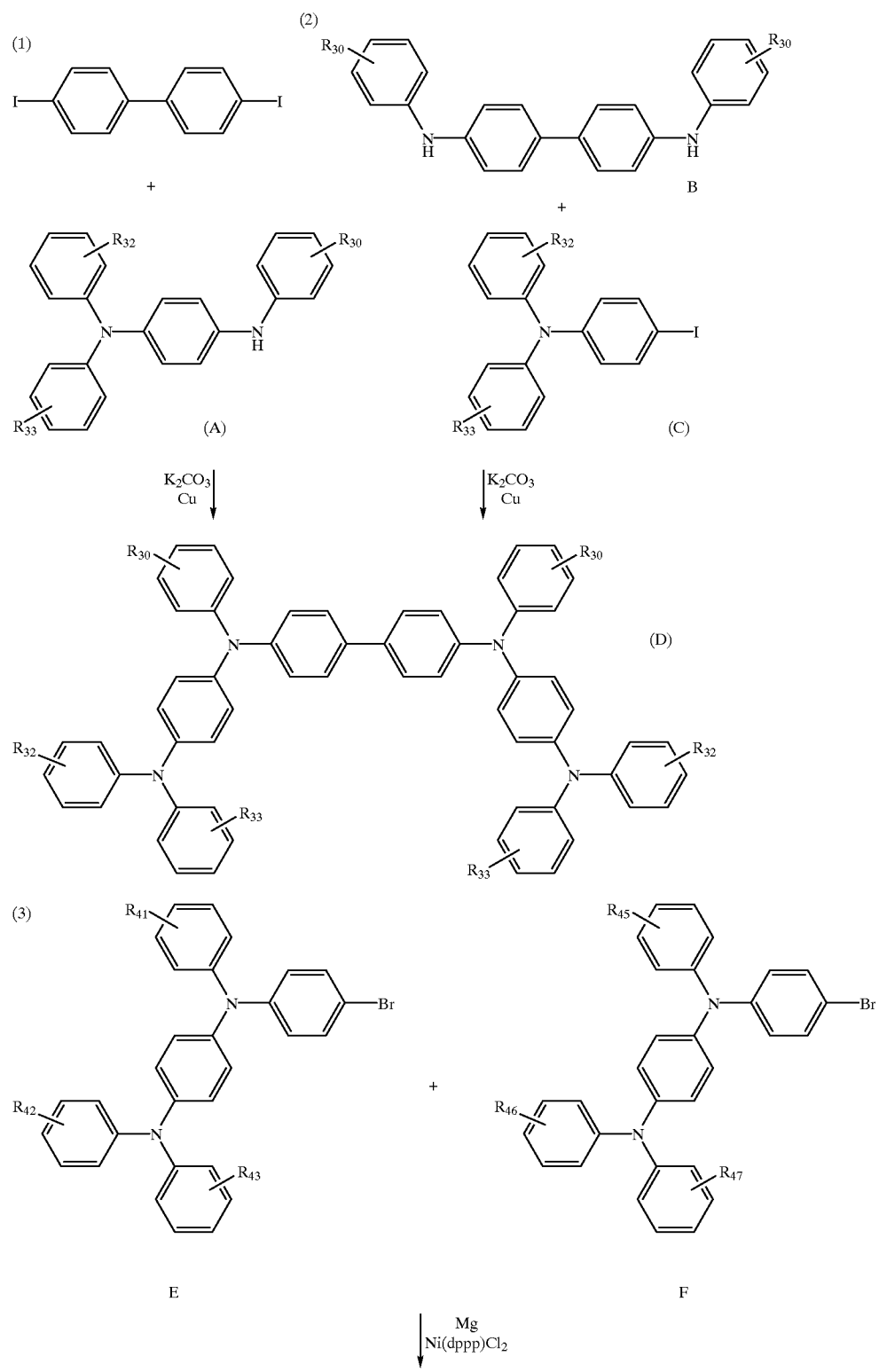

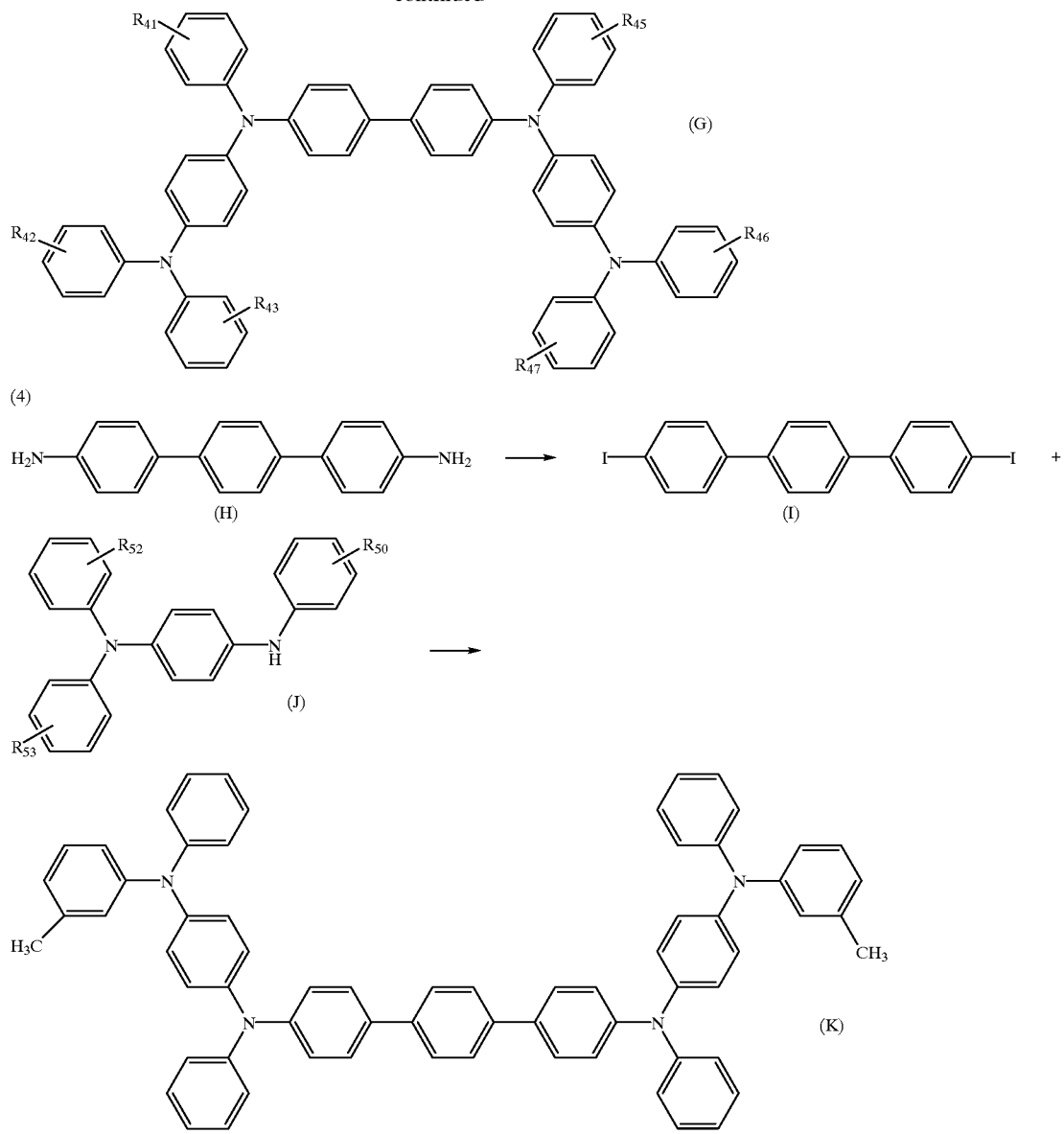

The compounds of the invention may be identified by mass spectroscopy, infrared absorption spectra (IR), $^1$H or $^{13}$C nuclear magnetic resonance spectra (NMR) or the like.

These compounds of the invention have a molecular weight of the order of 640 to 2,000 and a high melting point of 190 to 300° C., and show a high glass transition temperature of 80 to 200° C. They are put as by ordinary vacuum evaporation into a transparent amorphous state which is stable even at higher than room temperature; that is, they are obtained in the form of a smooth and good film which is maintained intact over an extended period. It is here to be noted that some of the compounds of the invention have no melting point and exist in an amorphous state even at high temperatures. It is thus possible to obtain a homogeneous thin film that is by itself stable without recourse to a binder resin.

By using the compounds of the invention, the Hole mobility is so improved that a device having an increased current density can be obtained. The Hole mobility obtained by the compound of the invention is preferably at least $1.0 \times 10^{-3}$ cm$^2$/Vs, especially $1.1 \times 10^{-3}$ to $100 \times 10^{-3}$ cm$^2$/Vs, and more especially $1.1 \times 10^{-3}$ to $20.0 \times 10^{-3}$ cm$^2$/Vs. In the invention, the hole injecting layer is formed of the compound of the invention which imparts such excellent Hole mobility thereto. Even when such a hole injecting layer has a thickness of at least 100 nm, and especially at least 200 nm, there is obtained a device that can be operated with no difficulty. It is here to be noted that the upper limit on the thickness of the hole injecting layer is usually about 5,000 nm although the invention is not limited thereto. In the practice of the invention, this film thickness may be determined in such a manner that, while the optical refractive index of each layer is taken into account, the optimum light extraction efficiency is obtained with no problem in conjunction with the angle of view, etc.

The compounds according to the invention may be used alone or in combination of two or more.

The EL device of the invention comprises at least one organic compound layer, and said at least one organic compound layer comprises the compound or compounds of the invention. One exemplary construction of the organic EL device according to the invention is shown in FIG. 1. As illustrated, the organic EL device comprises a hole injecting electrode 3, a hole injecting and transporting layer 4, a light emitting layer 5, an electron injecting and transporting layer 6 and an electron injecting electrode 7 in the described order. Furthermore, if a color filter 8, a fluorescence conversion filter 9, an organic EL device as mentioned above, a sealing layer 10 and a cover 11 are stacked and formed on a glass substrate 2 in the described order, an organic EL color display is then obtained.

The light emitting layer has functions of injecting holes and electrons, transporting them, and recombining holes and electrons to create excitons. The hole injecting and transporting layer has functions of facilitating injection of holes from the hole injecting electrode, providing stable transportation of holes and blocking electrons, and the electron injecting and transporting layer has functions of facilitating injection of electrons from the electron injecting electrode, providing stable transportation of electrons and blocking holes. These layers are effective for increasing the number of holes and electrons injected into the light emitting layer and confining holes and electrons therein for optimizing the recombination region to improve light emission efficiency. The electron injecting and transporting layer and the hole injecting and transporting layer may be provided, if required, while care is taken of the magnitudes of the functions which the compound used for the light emitting layer has in injecting electrons, transporting electrons, injecting holes, and transporting holes. For instance, when the compound used for the light emitting layer has great functions in injecting and transporting holes or electrons, the hole or electron injecting and transporting layer may be dispensed with; that is, the light emitting layer may be allowed to function as a hole injecting and transporting layer or an electron injecting and transporting layer. In some cases, both the hole injecting and transporting layer and the electron injecting and transporting layer may be dispensed with. Alternatively, the hole injecting and transporting layer and the electron injecting and transporting layer may be each separated into an injecting layer and a transporting layer.

By controlling the thickness of the organic layer while care is taken of the carrier mobility or carrier density (determined depending on ionization potential and electron affinity) of the light emitting layer, electron injecting and transporting layer or hole injecting and transporting layer to be combined therewith, it is possible to freely determine the recombination/light emitting region. It is in turn possible to design the color of light to be emitted, and control emission luminance and spectra due to the interference effect between both electrode as well as the spatial distribution of light emission.

The compound of the invention may be applied to any one of the hole injecting layer, hole transporting layer, light emitting layer, and hole injecting and transporting layer. Since the compound of the invention is excellent in the capability of injecting holes, however, it is preferably applied to the hole injecting layer or hole injecting and transporting layer, especially the hole injecting layer. With the compound of the invention that has both the phenylenediamine skeleton and the diamine skeleton including a plurality of phenylene radicals such as a benzidine skeleton, it is possible to freely control ionization potential and carrier mobility without sacrifice of heat resistance and, hence, optimize hole injection efficiency depending on the material to be combined therewith.

Here an account is given of the case where the compound of the invention is used for the hole injecting and transporting layer. The hole injecting and transporting layer may be formed by the evaporation of the compound of the invention or the coating of a dispersion of the compound of the invention in a resin binder. Especially the evaporation of the compound of the invention yields a good enough amorphous film.

When the compound of the invention is used for the hole injecting and transporting layer, the fluorescent material used for the light emitting layer may be selected from materials emitting fluorescence of longer wavelength. For instance, a sensible selection may be made from at least one fluorescent material used for the light emitting layer in combination with the compound of the invention. In such a case, too, the compound of the invention may be applied to the light emitting layer.

In this case, the compound of the invention may be used. However, the compound of the invention has the phenylenediamine skeleton contributing to very strong donicity, and so is susceptible to interaction with the light emitting layer, resulting a drop of the intensity of fluorescence due to the formation of exciplexes, etc. This in turn offers problems such as a light emission efficiency drop, and a color purity drop due to the broadening of emission spectra, and so is undesired. When a light emitting material having no interaction with the compound of the invention, however, the compound of the invention may be used as a hole transporting material.

The hole injecting and transporting layer may be formed of a combination of more than one of hole injecting and transporting materials. In a particularly preferred embodiment, hole injecting and transporting materials are laminated on ITO in the order of increasing ionization potential, for instance, in the order of a hole injecting layer and a hole transporting layer. Thus, it is preferable to form on the ITO surface a hole injecting material having a good thin film property so that a uniform thin film can be formed on the ITO surface having a varying hydrophilic nature. Since evaporation is utilized in the manufacture of devices, films as thin as about 1 to 10 nm can be formed in a uniform and pinhole-free state. If film thickness, refractive index, etc. are regulated, it is then possible to prevent an efficiency drop by controlling the color of light emitted and emission luminance or making use of interference light effects such as the spatial distribution of light emission.

For the hole transporting layer opposite to the light emitting layer, it is preferable to use a triarylamine polymer having a benzidine skeleton alone and less susceptible to interaction with the light emitting material, such as those set forth in JP-A's 63-295695, 5-234681 and 7-43564.

In the invention, the light emitting layer may contain a fluorescent material. The fluorescent material used herein, for instance, may be at least one compound selected from compounds such as those disclosed in JP-A 63-264692, for instance, quinacridone, rubrene, and styryl dyes. Use may also be made of quinoline derivatives such as metal complex dyes containing 8-quinolinol or its derivative as ligands, for instance, tris(8-quinolinolato)aluminum, tetraphenylbutadiene, anthracene, perylene, coronene, and 12-phthaloperinone derivatives. Use may further be made of phenyanthracene derivatives disclosed in Japanese Patent Application No. 6-110569, and tetraarylethene derivatives disclosed in Japanese Patent Application 6-114456.

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by weight, and especially 0.1 to 5% by weight. By using the fluorescent compound in combination with the host substance, it is possible to vary the wavelength performance of light emission, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, 3-255190, 5-70733, 5-258859, 6-215874, etc.

Exemplary aluminum complexes include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolato-lithium, tris(5-chloro-8-quinolinolato)gallium, bis(5-chloro-8-quinolinolato)calcium, 5,7-dichloro-8-quinolinolato-aluminum, tris(5,7-dibromo-8-hydroxyquinolinolato) aluminum, and poly[zinc(II)-bis(8-hydroxy-5-quinolinyl) methane].

Use may also be made of aluminum complexes containing other ligands in addition to 8-quinolinol or its derivatives, for instance, bis(2-methyl-8-quinolinolato)(phenolato) aluminum (III), bis(2-methyl-8-quinolinolato)(o-cresolato) aluminum (III), bis(2-methyl-8-quinolinolato)(m-cresolato) aluminum (III), bis(2-methyl-8-quinolinolato)(p-cresolato) aluminum (III), bis(2-methyl-8-quinolinolato)(o-phenylphenolato)aluminum (III), bis(2-methyl-8-quinolinolato) (m-phenylphenolato)aluminum (III), bis(2-methyl-8-quinolinolato) (p-phenylphenolato)aluminum (III), bis(2-methyl-8-quinolinolato)(2,3-dimethylphenolato) aluminum (III), bis(2-methyl-8-quinolinolato)(2,6-dimethylphenolato)aluminum (III), bis(2-methyl-8-quinolinolato)(3,4-dimethylphenolato)aluminum (III), bis (2-methyl-8-quinolinolato)(3,5-dimethylphenolato) aluminum (III), bis(2-methyl-8-quinolinolato)(3,5-di-tert-butylphenolato)aluminum (III), bis(2-methyl-8-quinolinolato)(2,6-diphenylphenolato)aluminum (III), bis (2-methyl-8-quinolinolato)(2,4,6-triphenylphenolato) aluminum (III), bis(2-methyl-8-quinolinolato)(2,3,6-trimethylphenolato)aluminum (III), bis(2-methyl-8-quinolinolato) (2,3,5,6-tetramethylphenolato)aluminum (III), bis(2-methyl-8-quinolinolato)(1-naphtholato) aluminum (III), bis(2-methyl-8-quinolinolato)(2-naphtholato)aluminum (III), bis(2,4-dimethyl-8-quinolinolato)(o-phenylphenolato)aluminum (III), bis(2,4-dimethyl-8-quinolinolato)(p-phenylphenolato)aluminum (III), bis(2,4-dimethyl-8-quinolinolato) (m-phenylphenolato) aluminum (III), bis(2,4-dimethyl-8-quinolinolato)(3,5-dimethylphenolato)aluminum (III), bis (2,4-dimethyl-8-quinolinolato)(3,5-di-tert-butylphenolato) aluminum (III), bis(2-methyl-4-ethyl-8-quinolinolato)(p-cresolato)aluminum (III), bis(2-methyl-4-methoxy-8-quinolinolato)(p-phenylphenolato)aluminum (III), bis(2-methyl-5-cyano-8-quinolinolato)(o-cresolato)aluminum (III), and bis(2-methyl-6-trifluoromethyl-8-quinolinolato) (2-naphtholato)aluminum (III).

Besides, use may be made of bis(2-methyl-8-quinolinolato)aluminum (III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum (III)-$\mu$-oxo-bis(4-ethyl-2-methyl-8-quinolinolato)aluminum (III), bis(2-methyl-4-methoxyquinolinolato)aluminum (III)-$\mu$-oxo-bis(2-methyl-4-methoxyquinolinolato)aluminum (III), bis(5-cyano-2-methyl-8-quinolinolato)aluminum (III)-$\mu$-oxo-bis(5-cyano-2-methyl-8-quinolinolato)aluminum (III), bis(2-methyl-5-trifluoromethyl-8-quinolinolato)aluminum (III)-$\mu$-oxo-bis (2-methyl-5-trifluoromethyl-8-quinolinolato)aluminum (III), etc.

Other preferable host substances include phenylanthracene derivatives disclosed in Japanese Patent Application No. 6-110569, tetraarylethene derivatives disclosed in Japanese Patent Application No. 6-114456, etc.

The phenylanthracene derivatives are represented by the following formula (VIII):

$$A_1-L_1-A_2 \qquad (VIII)$$

In formula (VIII), $A_1$ and $A_2$ may be identical with or different from each other, and are each a monophenylanthryl or diphenylanthryl group.

The monophenylanthryl or diphenylanthryl group represented by $A_1$, and $A_2$ may, or may not, have a substituent. The substituent, for instance, may be an alkyl, aryl, alkoxy, aryloxy or amino group which may have another substituent. Where is substituted by such a substituent is not critical in the invention. However, it is preferable that the phenyl group attached to the anthracene ring rather than the anthracene ring per se is substituted by such a substituent. Preferably in this case, the bond position of the phenyl group in the anthracene ring is the 9- or 10-position in the anthracene ring.

In formula (VIII), $L_1$ stands for a single bond or an arylene group. The arylene group given by $L_1$ is preferably unsubstituted. For instance, the arylene group includes an ordinary arylene group such as a phenylene group, a biphenylene group, and an anthrylene group as well as two or more such arylene groups attached directly to each other. $L_1$ is preferably a single bond, and a p-phenylene or 4,4'-biphenylene group.

$L_1$ may also include two or more such arylene groups as attached to each other via an alkylene group, —O—, —S— or —NR— where R is an alkyl or aryl group. For instance, a methyl or ethyl group is mentioned for the alkyl group and a phenyl group is mentioned for the aryl group. Particular preference is given to the aryl group, for instance, a phenyl group as well as $A_1$ and $A_2$. A phenyl group with $A_1$ or $A_2$ attached thereto may also be acceptable. Preferred for the alkylene group are a methylene group, an ethylene group or the like. Examples of such an arylene group are given below.

The tetraarylethene derivatives are represented by the following formula (IX):

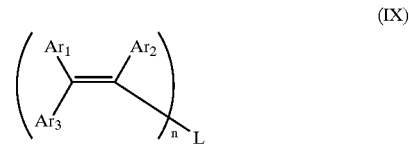

(IX)

In formula (IX), $Ar_1$, $Ar_2$ and $Ar_3$ may be identical with or different from one another, and are each an aromatic residue.

Aromatic hydrocarbon groups (aryl groups), and aromatic heterocyclic groups, for instance, may be mentioned for the aromatic residues represented by $Ar_1$, $Ar_2$ and $Ar_3$. The aromatic hydrocarbon groups may monocyclic or polycyclic aromatic hydrocarbon groups, and include fused rings or ring combinations as well. Each aromatic hydrocarbon group has preferably 6 to 30 carbon atoms in all, and may have a substituent represented by an alkyl group, an aryl group, an alkoxy group, an aryloxy group, an amino group or the like. The aromatic hydrocarbon groups, for instance, include phenyl, alkylphenyl, alkoxyphenyl, arylphenyl, aryloxyphenyl, aminophenyl, biphenyl, naphthyl, anthryl, pyrenyl, and perylenyl groups.

The aromatic heterocyclic groups are preferably those containing O, N, and S as a hetero-atom, and may each be a five- or six-membered ring. For instance, thienyl, furyl, pyrrolyl and pyridyl groups are mentioned.

A phenyl group is particularly preferred for the aromatic group represented by $Ar_1$, $Ar_2$, and $Ar_3$.

The letter n is an integer of preferably 2 to 6, and especially 2 to 4.

$L_2$ is an n-valent aromatic residue. It is preferably a di- to hexa-valent, especially di- to tetra-valent residue derived from an aromatic hydrocarbon, an aromatic heterocyclic ring, an aromatic ether or an aromatic amine. This aromatic residue, which may have a substituent, is preferably unsubstituted.

The light emitting layer is formed by using the compound of formula (IX) in combination with the aforesaid host material. It is also preferred that the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by weight, and especially 0.1 to 15% by weight.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the compound of formula (IX) in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons. Especially for the compounds capable of injecting and transporting electrons, it is preferable to use metal complexes containing quinoline derivatives, especially 8-quinolinol or its derivatives as ligands, in particular, tris(8-quinolinolato)aluminum ($Alq^3$). It is also preferable to use the aforesaid phenylanthracene derivatives, and tetraarylamine derivatives.

For the compounds for the injection and transportation of holes, it is preferable to use amine derivatives having strong fluorescence, for instance, hole transporting materials such as tetraphenyldiamine derivatives, styrylamine derivatives, and amine derivatives having an aromatic fused ring, as already mentioned.

In this case, the mixing ratio is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, particularly 10/90 to 90/10, and more particularly 20/80 to 80/20.

The thickness of the mixed layer must correspond to the thickness of a single molecular layer, and so is preferably less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an archipelagic form may be present in the mixed layer. The light emitting layer may generally be formed at a given thickness by the evaporation of the organic fluorescent substance or coating a dispersion of the organic fluorescent substance in a resin binder.

In the practice of the invention, the electron injecting and transporting layer may be provided. For the electron inject-ing and transporting layer, there may be used quinoline derivatives such as organic metal complexes containing 8-quinolinol or its derivatives as ligands, for instance, tris(8-quinolinolato)aluminum ($Alq^3$), oxadiazole derivatives, perylene derivatives, pyridine derivatives, pyrimidine derivatives, quinoxaline derivative, diphenylquinone derivatives, and nitro-substituted fluorene derivatives. The electron injecting and transporting layer may also serve as a light emitting layer. In this case, it is preferable to use tris(8-quinolilato)aluminum, etc. Like the light emitting layer, the electron injecting and transporting layer may then be formed by evaporation or the like.

When the compound of the invention is used for the light emitting layer, the hole, and electron injecting and transporting layer may be formed of various organic compounds as disclosed in JP-A's 63-295695, 2-191694, 3-792 and so on. For the hole injecting and transporting layer, for instance, aromatic tertiary amines, hydrazone derivatives, carbazole derivatives, triazole derivatives, imidazole derivatives, and indole derivatives may be used. For the electron injecting and transporting layer, for instance, organic metal complex derivatives such as aluminum quinolinol, oxadiazole derivatives, pyridine derivatives, pyrimidine derivatives, quinoline derivatives, quinoxaline derivative, diphenylquinone derivatives, perylene derivatives and fluorene derivatives may be used.

When the compound of the invention is used for the light emitting layer, it is preferable to combine the compound of the invention with the aforesaid light emitting material unlikely to extinguish light due to their interaction. The compound of the invention emits strong blue fluorescence, and so can achieve a high-luminance light emitting device when combined with a material having little interaction therewith.

The thickness of the light emitting layer, the hole injecting and transporting layer, and the electron injecting and transporting layer is not critical and varies with the design of recombination/light emitting region and a particular formation technique although it is usually of the order of preferably 5 to 500 nm, and especially 10 to 200 nm.

The thickness of the hole injecting and transporting layers, and the electron injecting and transporting layer is equal to, or about 1/10 times to about 10 times as large as, the thickness of the light emitting layer although it depends on the design of the recombination/light emitting region.

When the electron or hole injecting and transporting layer is separated into an injecting layer and a transporting layer, it is preferable that the injecting layer is at least 1 nm thick and the transporting layer is at least 1 nm and especially at least 20 nm thick.

The upper limit on thickness is usually about 500 nm and especially about 100 nm for the injecting layer and about 500 nm for the transporting layer. The same film thickness applies when two injecting and transporting layers are provided.

By controlling the thickness of the organic layer while care is taken of the carrier mobility or carrier density (determined depending on ionization potential and electron affinity) of the light emitting layer, electron injecting and transporting layer or hole injecting and transporting layer to be combined therewith, it is possible to freely determine the recombination/light emitting region. It is in turn possible to design the color of light to be emitted, and control emission luminance and spectra due to the interference effect between both electrode as well as the spatial distribution of light emission.

For the electron injecting electrode, it is preferable to use a material having a low work function, for instance, Li, Na, K, Mg, Al, Ag or In, an alloy thereof, or an oxide or halide thereof. It is also preferred that the electron injecting electrode be formed of fine crystal grains, especially in an amorphous state. The electron injecting electrode has preferably a thickness of the order of 10 to 1,000 nm.

Furthermore, it is preferable to evaporate and sputter Al or a fluorine type compound at the final stage of electrode formation, because an improved sealing effect is obtained with an interconnection resistance drop in the case of Al.

To allow the EL device to emit light at its surface, it is required that at least one of the two electrodes be transparent or semitransparent. Since there is some limitation on the material of which the electron injecting electrode is formed as mentioned above, however, the material and thickness of the hole injecting electrode are preferably determined such that at least 80% of the light emitted transmits through it. For instance, it is preferable to use ITO (tin-doped indium oxide), IZO (zinc-doped indium oxide), $SnO_2$, Ni, Au, Pt, Pd, and polypyrrole for the hole injecting electrode. It is also preferable that the hole injecting electrode has a thickness of the order of 10 to 500 nm. To improve the reliability of the device, it is required that the driving voltage be low. Preferable to this end is an ITO of 10 to 30Ω/□ (with a thickness of 80 to 300 nm). In the practice of the invention, the thickness and optical constant of the ITO may be designed such that high light extraction efficiency and high color purity are satisfied by the interference effect due to reflection at the ITO interface.

To a large device such as a display device, an Al interconnection may be applied because the resistance of the ITO increases.

Preferably but not exclusively, transparent or translucent materials such as glasses, and resins are used for the substrate material because, in the illustrated embodiment, the emitted light is extracted or taken out of the substrate side. The substrate may be colored or otherwise provided with a color filter film, fluorescence conversion film or dielectric reflecting film for controlling the color of light emitted.

It is here to be noted that when an opaque material is used for the substrate, the order of lamination shown in FIG. 1 may be reversed.

For the color filter film, a color filter employed with liquid crystal display devices may be used. However, it is preferable to control the properties of the color filter in conformity to the light emitted from the organic EL device, thereby optimizing the efficiency of taking out light emission and color purity.

By using a color filter capable of cutting off extraneous light of such wavelength as absorbed by an EL device material or the fluorescence conversion layer, it is possible to improve the light resistance of the device and the contrast of what is displayed on the device.

Instead of the color filter, an optical thin film such as a dielectric multilayer film may be used.

The fluorescence conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. It is also preferable to use a material that is not damaged during ITO film formation.

The light absorbing material is used when light is not fully absorbed by the fluorescent material, and so may be dispensed with, if not required. For the light absorbing material, it is preferable to make a selection from materials that do not extinguish the fluorescence of the fluorescent material.

In what follows, how to fabricate the EL device of the invention will now be explained.

To form the hole, and electron injecting electrode, it is preferable to use vapor phase growth processes such as evaporation, and sputtering.

To form the hole injecting and transporting layer, the light emitting layer, and the electron injecting and transporting layer, it is preferable to use a vacuum evaporation technique which enables a homogeneous thin film to be obtained. According to the vacuum evaporation process, it is possible to obtain homogeneous thin films in an amorphous state or with a crystal grain diameter of at most 0.1 μm. The use of a thin film having a crystal grain diameter exceeding 0.1 μm results in non-uniform light emission. To avoid this, it is required to increase the driving voltage of the device; however, there is a striking drop of hole injection efficiency.

No particular limitation is imposed on vacuum evaporation conditions. However, an evaporation rate of the order of 0.01 to 1 nm/sec. is preferably applied at a degree of vacuum of up to $10^{-5}$ Torr ($10^{-4}$ Pa). It is also preferable to form the layers continuously in vacuum. If the layers are continuously formed in vacuum, high properties are then obtained because the adsorption of impurities on the interface between the adjacent layers can be avoided. In addition, the driving voltage of the device can be lowered while the growth and occurrence of dark spots are inhibited.

When the vacuum evaporation process is used to form the layers, each containing a plurality of compounds, it is preferable to carry out co-evaporation while boats charged with the compounds are individually placed under temperature control.

The EL device of the invention is generally of the DC drive type while it may be of the AC or pulse drive type. The applied voltage is generally of the order of 2 to 20 volts.

EXAMPLE

The present invention are explained more specifically with reference to some synthesis examples and examples.

Synthesis Example 1

Synthesis of N,N'-diphenyl-N,N'-bis[N-phenyl-N-3-tolyl(4-aminophenyl)]benzidine
(HIM33: compound No. 3)

In a 200 ml reaction vessel 26 grams of N,N-diphenyl-1,4-phenylenediamine and 22 grams of 3-iodotoluene were heated together with 0.3 grams of activated copper powders, 50 grams of potassium carbonate and 50 ml of decalin at an oil bath temperature of 200° C. for 24 hours in an Ar atmosphere. After the completion of the reaction, the reaction solution was filtrated with the addition of 100 ml of toluene thereto, thereby removing insolubles. The filtrate was washed with water, and dried over sodium sulfate. Following this, the solvent was removed by distillation from the filtrate, and the residue was purified twice by means of a silica gel column (using a mixed solvent of n-hexane and toluene as a developing solvent), thereby obtaining 17 grams of N,N'-diphenyl-N-(3-tolyl)-1,4-phenylenediamine.

Then, in a 200 ml reaction vessel 10 grams of N,N'-diphenyl-N-(3-tolyl)-1,4-phenylenediamine obtained as mentioned above and 4.6 grams of 4,4'-diiodobiphenyl were heated together with 0.3 grams of activated copper powders, 8.0 grams of potassium carbonate and 100 ml of decalin at an oil bath temperature of 220° C. for 40 hours in an Ar atmosphere. After the completion of the reaction, the reaction solution was filtrated with the addition of 200 ml of toluene thereto, thereby removing insolubles. The filtrate was washed with water, and dried over sodium sulfate. Following this, the solvent was removed by distillation from the filtrate, and the residue was purified four times by means of a silica gel column (using a mixed solvent of n-hexane and toluene as a developing solvent), thereby obtaining 7 grams of N,N'-diphenyl-N,N-bis[N-phenyl-N-3-tolyl(4-aminophenyl)]benzidine, 2 grams of which were purified by sublimation to obtain 1.8 grams of a slightly pale yellow glassy compound emitting strong blue fluorescence. This compound has a structure mentioned below as HIM33.

Synthesis Example 2

Synthesis of N,N'-diphenyl-N,N'-bis[N-phenyl-N-4-tolyl(4-aminophenyl)]benzidine (HIM34: compound No. 2)

N,N'-diphenyl-N,N'-bis[N-phenyl-N-4-tolyl(4-aminophenyl)]benzidine referred to below as HIM34 was obtained as in synthesis example 1 with the exception that 4-iodotoluene was used in place of 3-iodotoluene.

HIM33

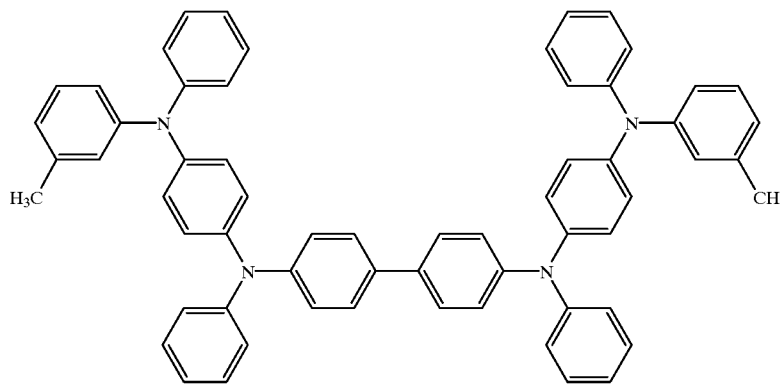

Figure 2:
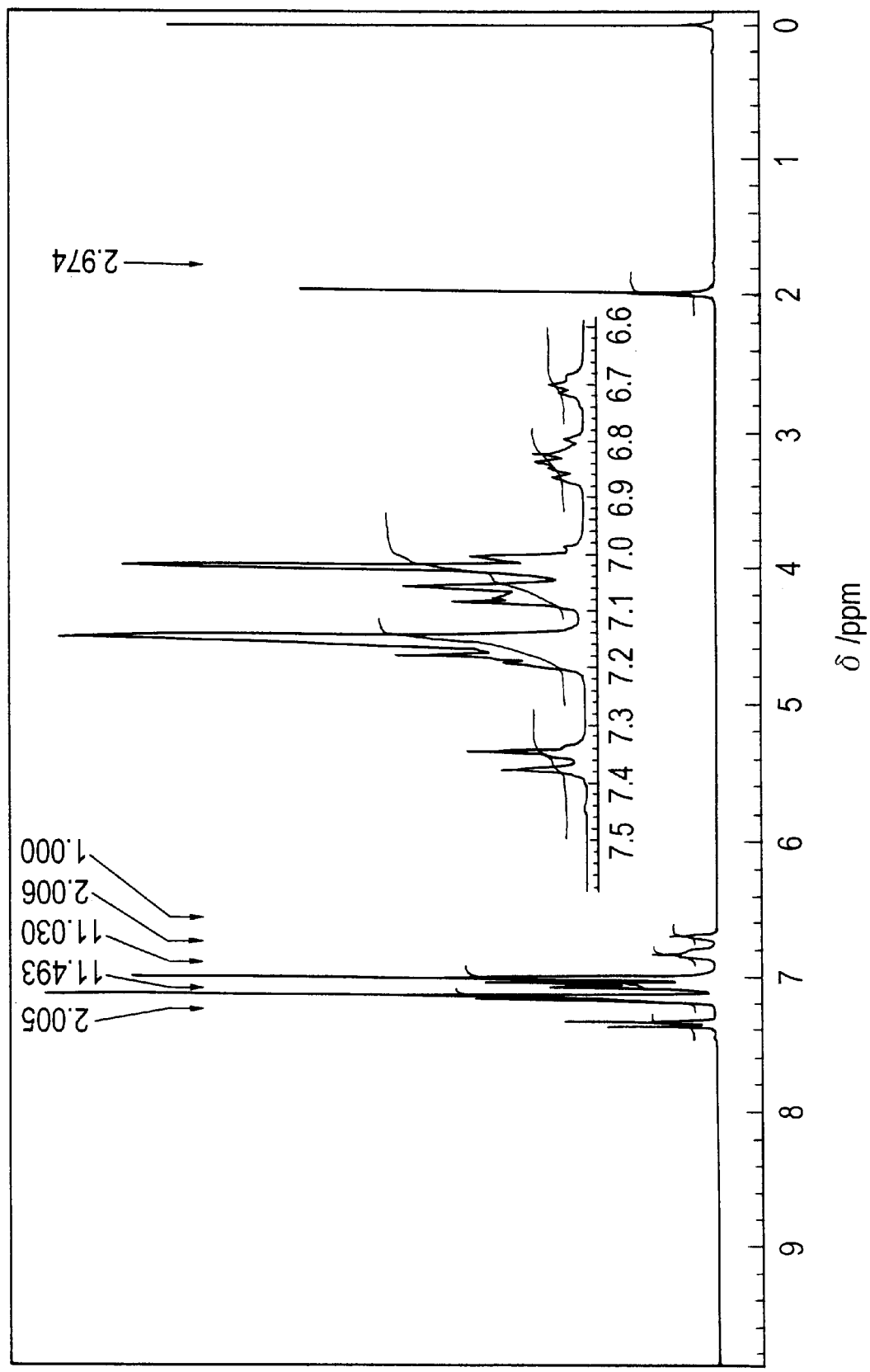
FIG. 2 is a $^1$H-NMR spectral diagram for synthesis example 1.
Figure 3:
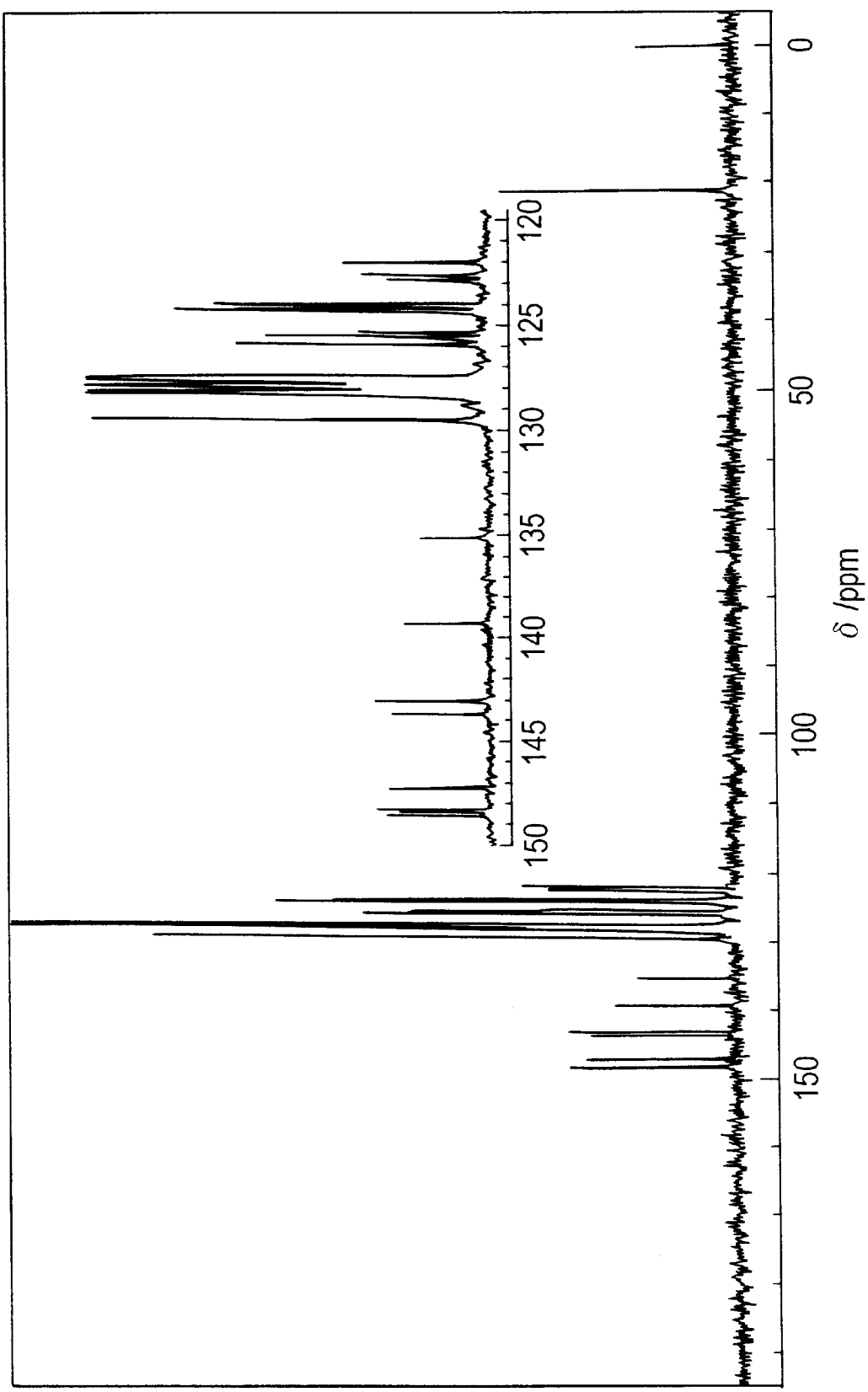
FIG. 3 is a $^{13}$C-NMR spectral diagram for synthesis example 1.

Mass spectrometry: m/e 850(M$^+$)
$^1$H-NMR spectra are shown in FIG. 2.
$^{13}$C-NMR spectra are shown in FIG. 3.

HIM34

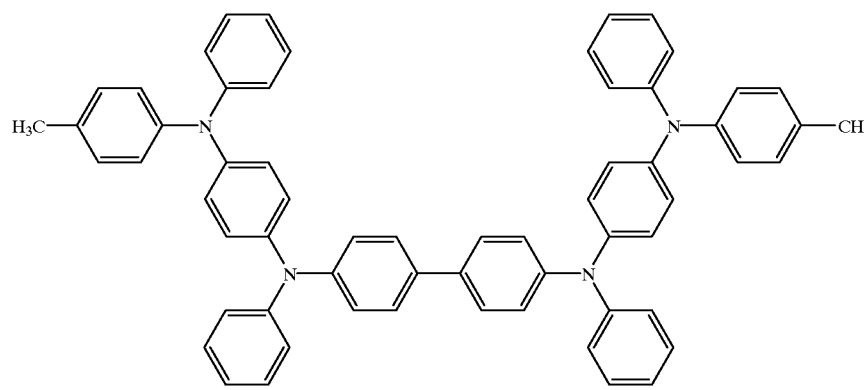

Figure 4:
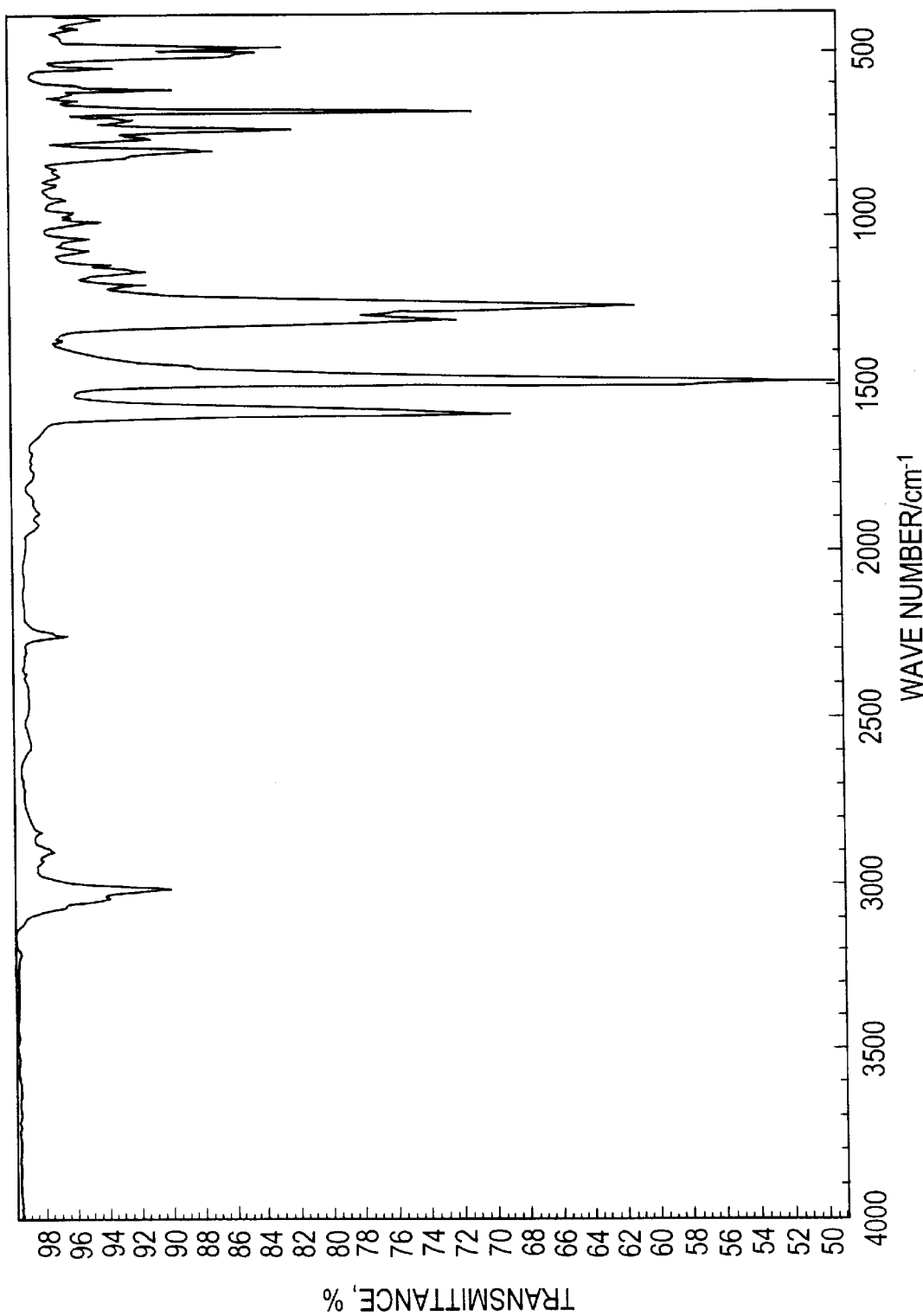
FIG. 4 is an infrared absorption spectral diagram for synthesis example 1.

Infrared absorption spectra are shown in FIG. 4.
Differential scanning calorimetry (DSC)
Melting point: 234° C. (partially amorphous)
Glass transition temperature (DSC): 99° C.

Figure 5:
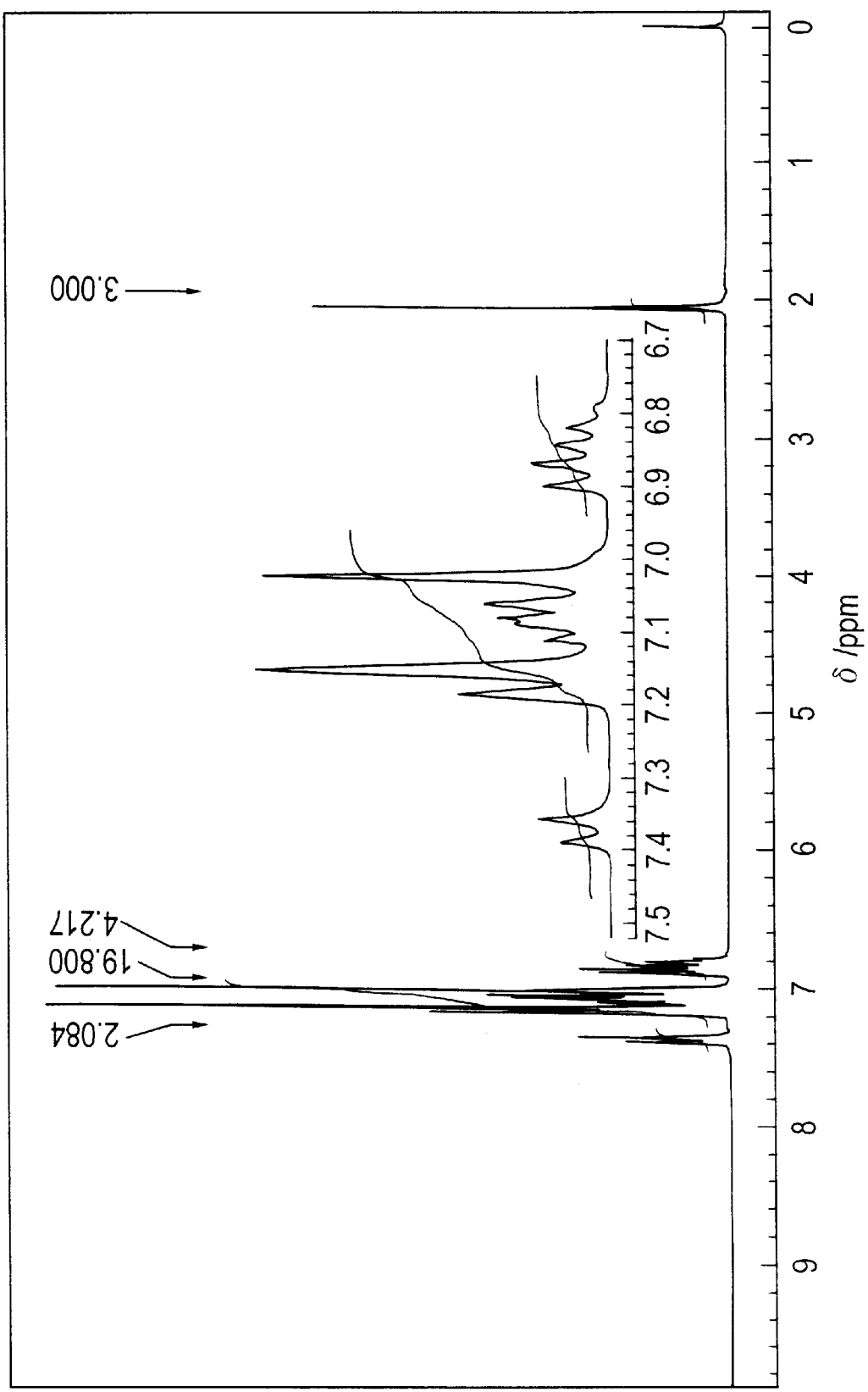
FIG. 5 is a $^1$H-NMR spectral diagram for synthesis example 2.
Figure 6:
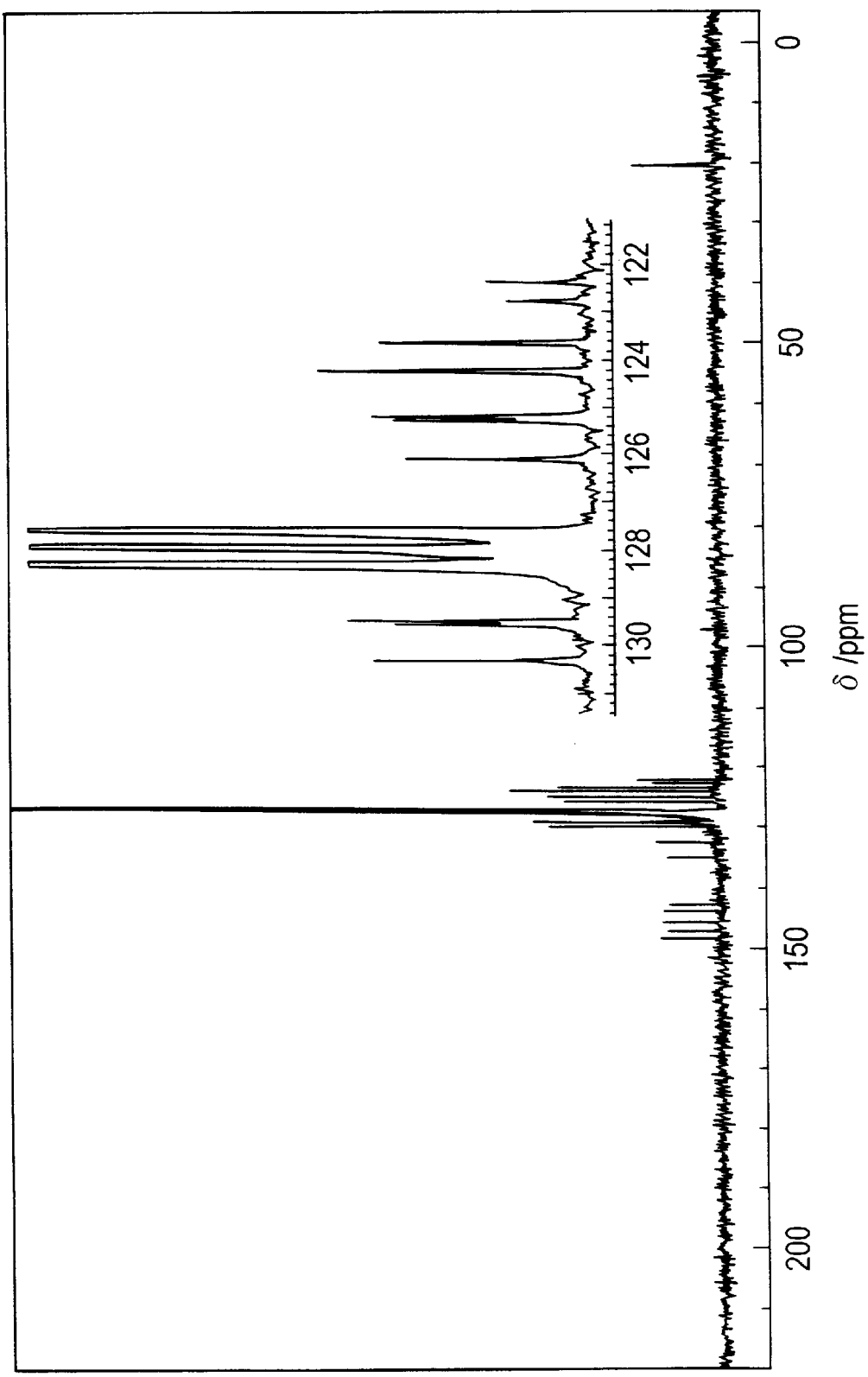
FIG. 6 is a $^{13}$C-NMR spectral diagram for synthesis example 2.
Figure 7:
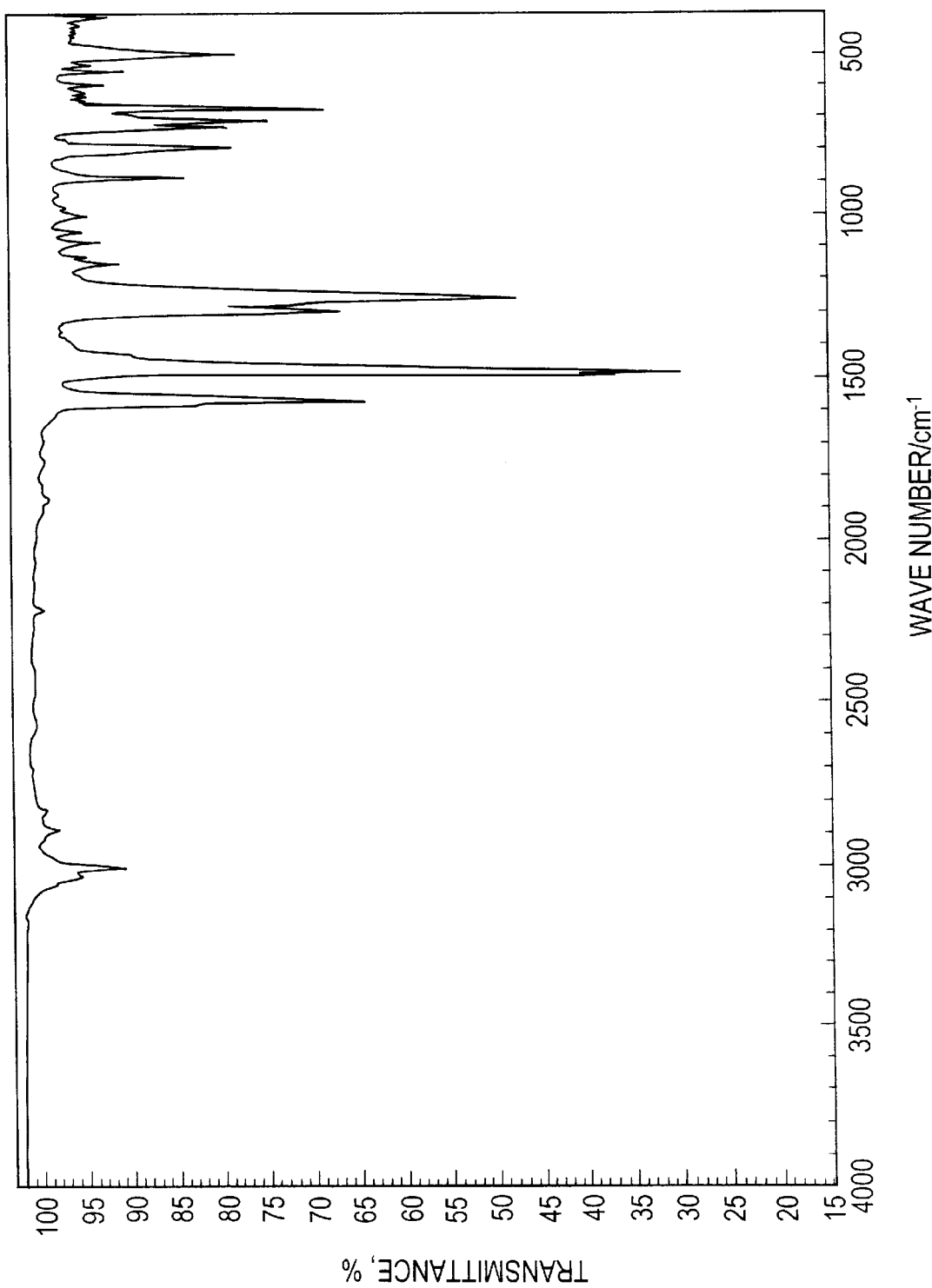
FIG. 7 is an infrared absorption spectral diagram for synthesis example 2.

Mass spectrometry: m/e 850(M$^+$)
$^1$H-NMR spectra are shown in FIG. 5.
$^{13}$C-NMR spectra are shown in FIG. 6.
Infrared absorption spectra are shown in FIG. 7.

Differential scanning calorimetry (DSC)
Melting point: unmeasurable because of amorphism
Glass transition temperature (DSC): 107° C.

Synthesis Example 3

Synthesis of N,N'-diphenyl-N,N'-bis[N-phenyl-N-4-tolyl(4-aminophenyl)]benzidine
(HIM38: compound No. 16)

N,N'-diphenyl-N,N'-bis[N-phenyl-N-4-tolyl(4-aminophenyl)]benzidine referred to below as HIM38 was obtained as in synthesis example 1 with the exception that 4-iodonaphthalene was used in place of 3-iodotoluene.

HIM38

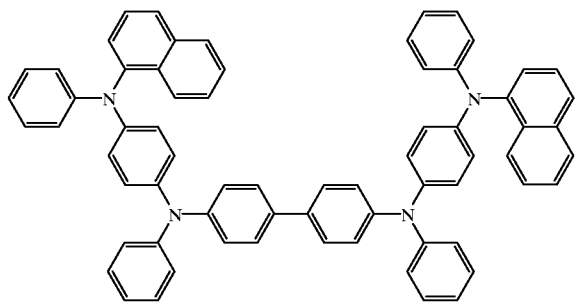

Figure 8:
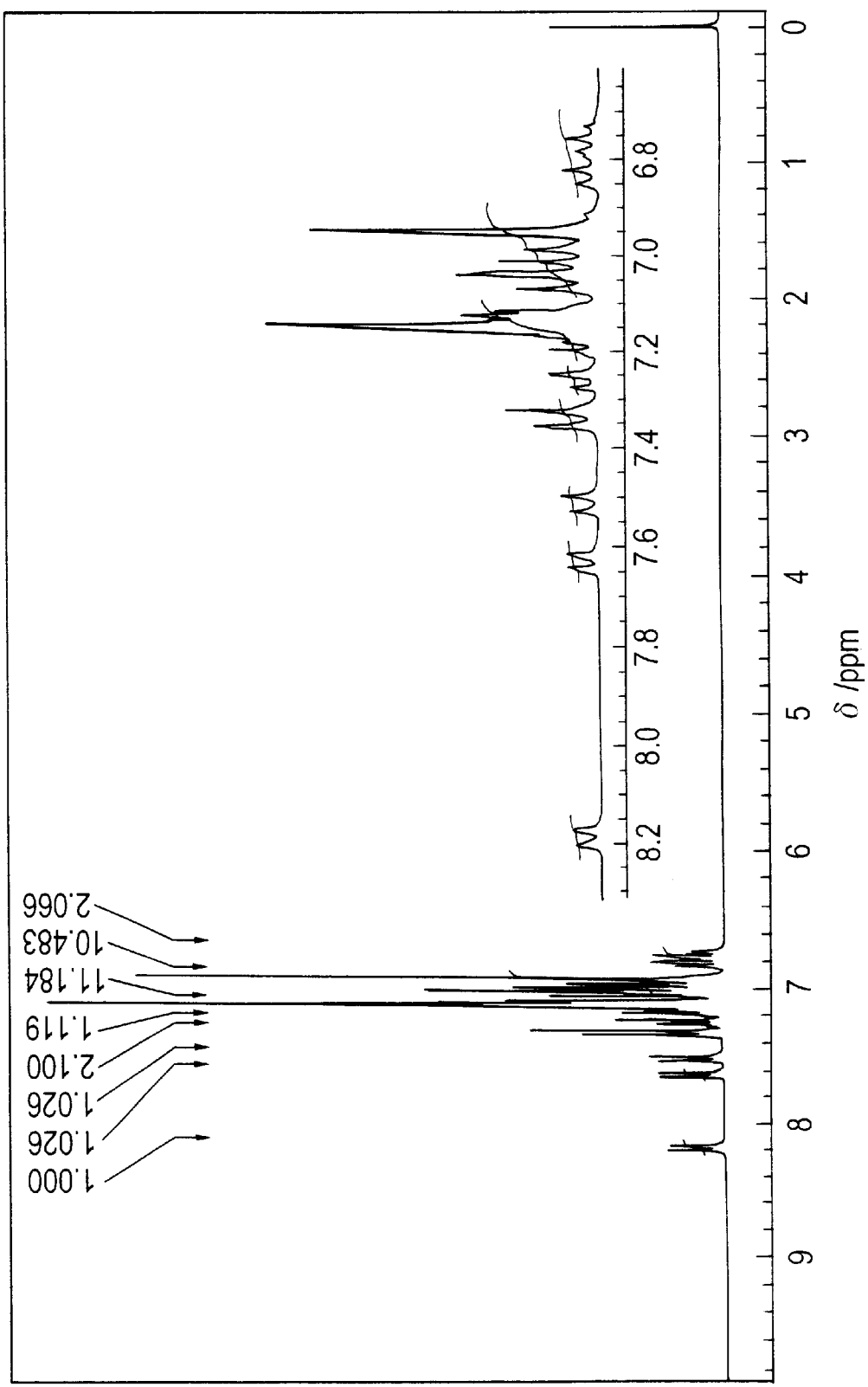
FIG. 8 is a $^1$H-NMR spectral diagram for synthesis example 3.
Figure 9:
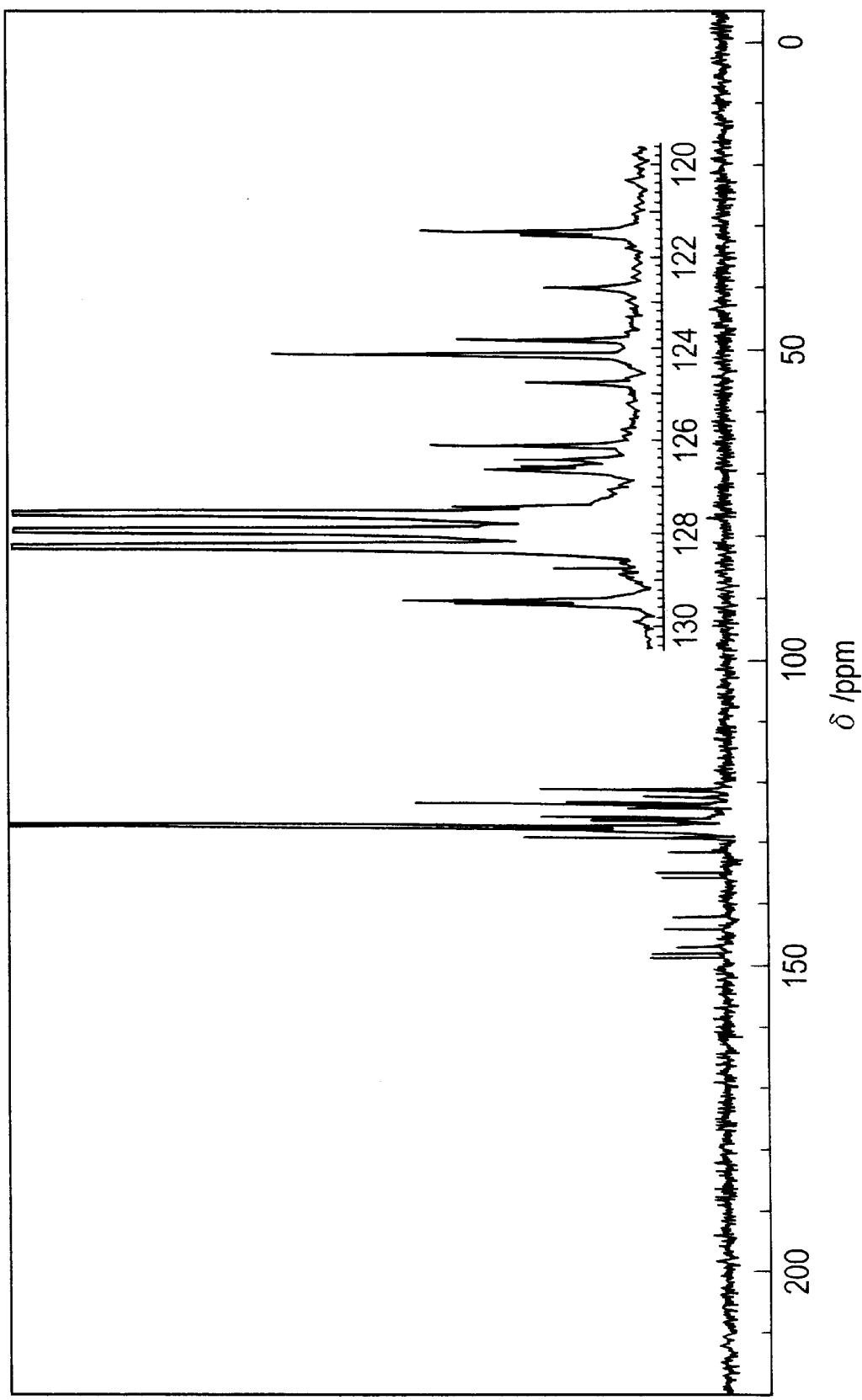
FIG. 9 is a $^{13}$C-NMR spectral diagram for synthesis example 3.
Figure 10:
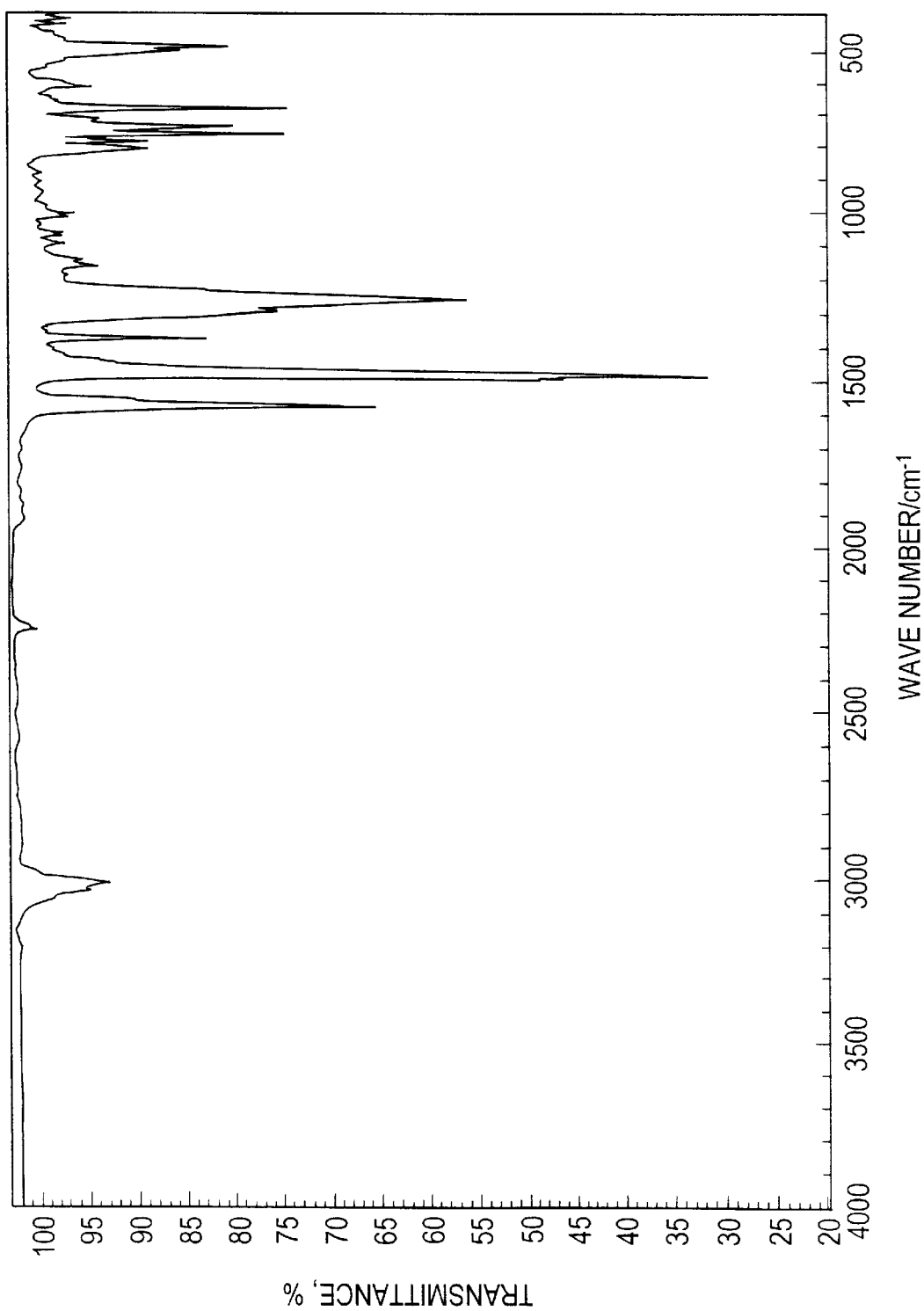
FIG. 10 is an infrared absorption spectral diagram for synthesis example 3.

Mass spectrometry: m/e 922(M$^+$)
$^1$H-NMR spectra are shown in FIG. 8.
$^{13}$C-NMR spectra are shown in FIG. 9.
Infrared absorption spectra are shown in FIG. 10.
Differential scanning calorimetry (DSC)
Melting point: unmeasurable because of amorphism
Glass transition temperature (DSC): 125° C.

Synthesis Example 4

Synthesis of N,N'-diphenyl-N,N'-bis[N-phenyl-N-4-tolyl(4-aminophenyl)]benzidine
(HIM35: compound No. 10)

N,N'-diphenyl-N,N'-bis[N-phenyl-N-4-tolyl(4-aminophenyl)]benzidine referred to below as HIM35 was obtained as in synthesis example 1 with the exception that 3-iodobiphenyl was used in place of 3-iodotoluene.

Mass spectrometry: m/e 974(M$^+$)
Differential scanning calorimetry (DSC)
Melting point: unmeasurable because of amorphism
Glass transition temperature (DSC): 120° C.

Synthesis Example 5

Synthesis of N,N'-diphenyl-N,N'-{N-phenyl-N-[N-3-tolyl-N-phenyl(4-aminophenyl)](4-aminophenyl)}benzidine (HIM73: compound No. 26)

As in synthesis example 1, N,N'-diphenyl-N-(3-tolyl)-1,4-phenylenediamine was obtained.

In a 200 ml reaction vessel 17.5 grams of N,N'-diphenyl-N-3-tolylphenylenediamine and 32 grams of 1,4-diiodobenzene were heated together with 0.3 grams of activated copper powders, 50 grams of potassium carbonate and 50 ml of decalin at an oil bath temperature of 200° C. for 24 hours in an Ar atmosphere. After the completion of the reaction, the reaction solution was filtrated with the addition of 100 ml of toluene thereto, thereby removing insolubles. The filtrate was washed with water, and dried over sodium sulfate. Following this, the solvent was removed by distillation from the filtrate. The residue was washed with acetone, and then purified twice by means of a silica gel column (using a mixed solvent of n-hexane and toluene as a developing solvent), thereby obtaining 20 grams of N,N'-diphenyl-N-3-tolyl-N'-4-(iodophenyl)-1,4-phenylenediamine.

Then, in a 200 ml reaction vessel 13.8 grams of N,N'-diphenyl-N-(3-tolyl)-N'-4-(iodophenyl)-1,4-phenylenediamine and 4.28 grams of N,N'-diphenylbenzidine were heated together with 0.3 grams of activated copper powders, 26 grams of potassium carbonate and 50 ml of decalin at an oil bath temperature of 200° C. for 40 hours in an Ar atmosphere. After the completion of the reaction, the reaction solution was filtrated with the addition of 100 ml of toluene thereto, thereby removing insolubles. The filtrate was washed with water, and dried over sodium sulfate. Following this, the solvent was removed by distillation from the filtrate, and the residue was purified twice by means of a silica gel column (using a mixed solvent of n-hexane and toluene as a developing solvent), thereby obtaining 8 grams of N,N'-diphenyl-N,N'-bis{N-phenyl-N-[3-tolyl-N-phenyl(4-amino-phenyl)}benzidine, 2 grams of which were purified by sublimation to obtain 1.8 grams of a slightly pale yellow glassy compound emitting strong blue

HIM35

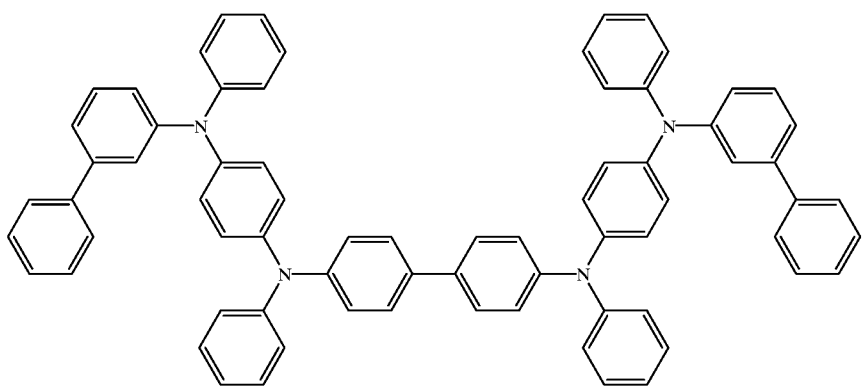

fluorescence. This compound has such a structure referred to below as HIM73.

Figure 14:
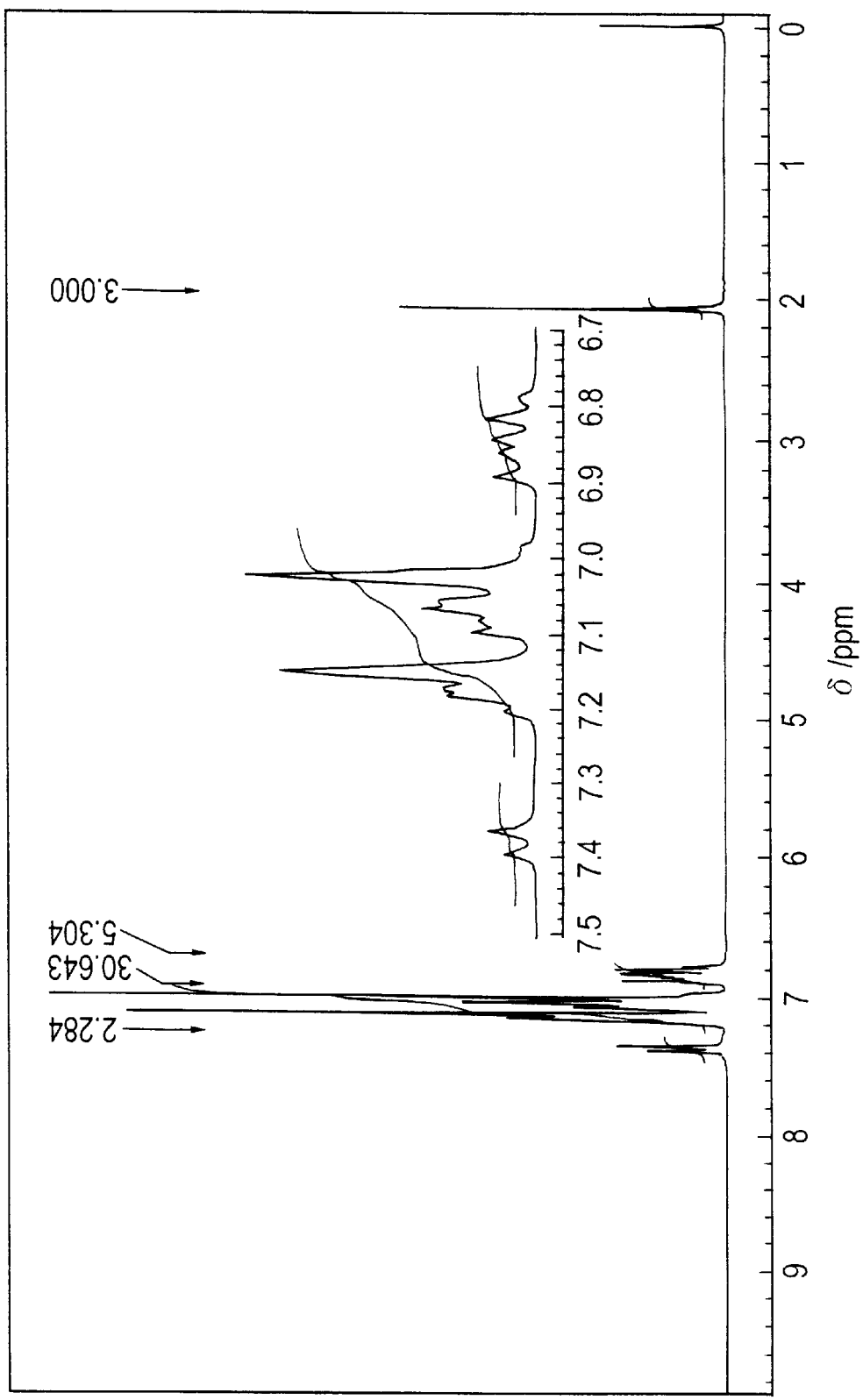
FIG. 14 is a $^1$H-NMR spectral diagram for synthesis example 6.

Mass spectrometry: m/e 1184(M⁺)
$^1$H-NMR spectra are shown in FIG. 14.

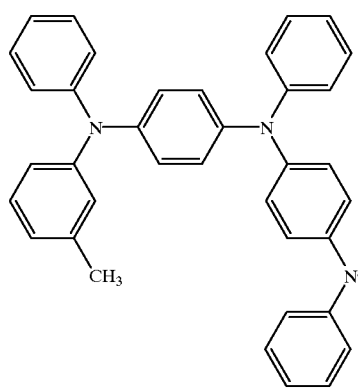

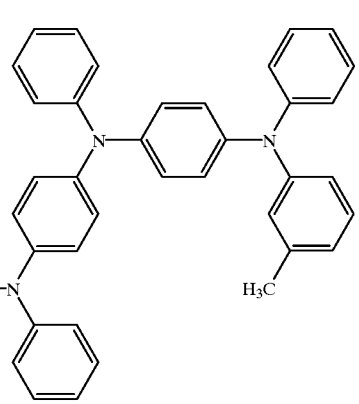

HIM73

Figure 11:
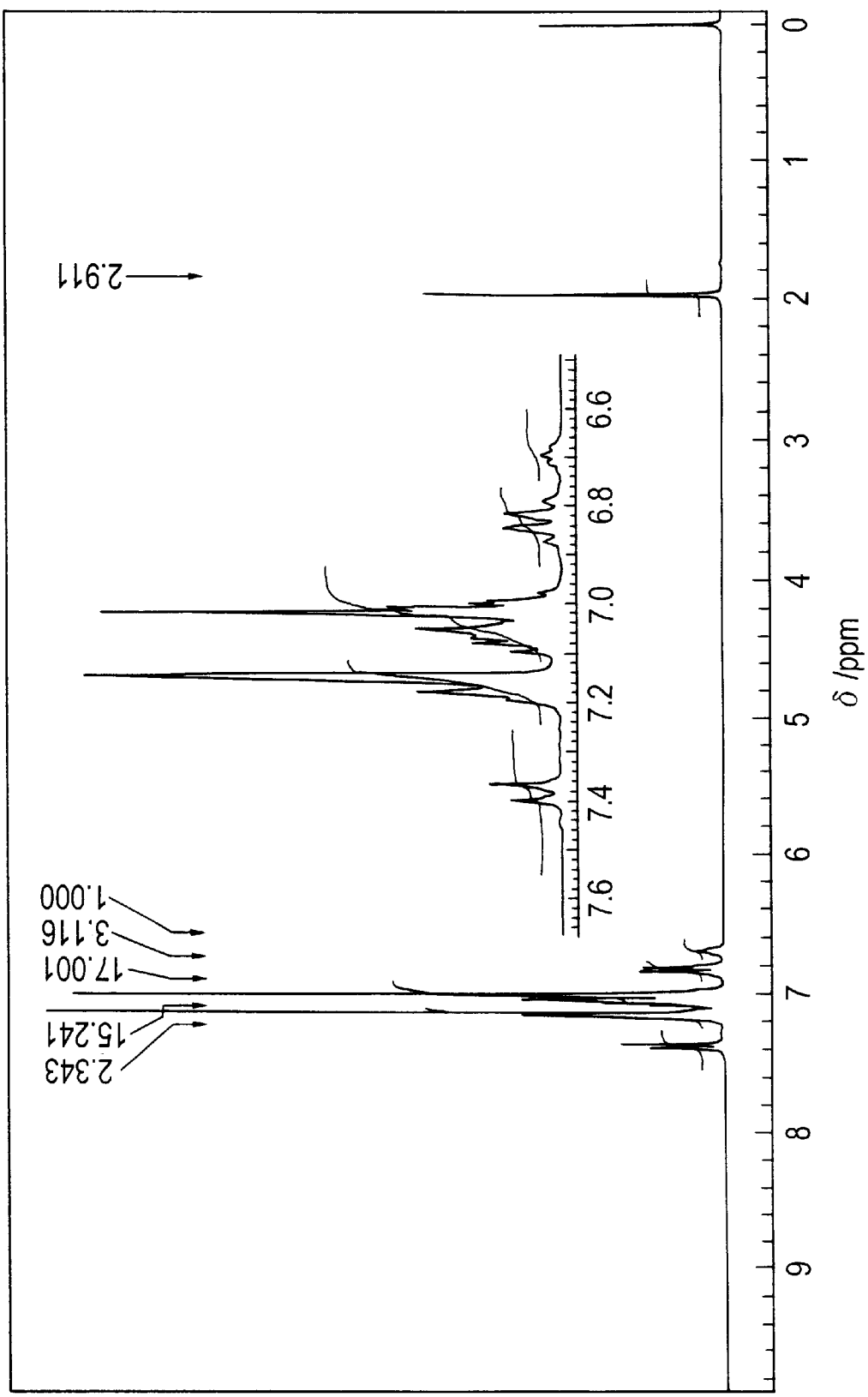
FIG. 11 is a $^1$H-NMR spectral diagram for synthesis example 5.
Figure 12:
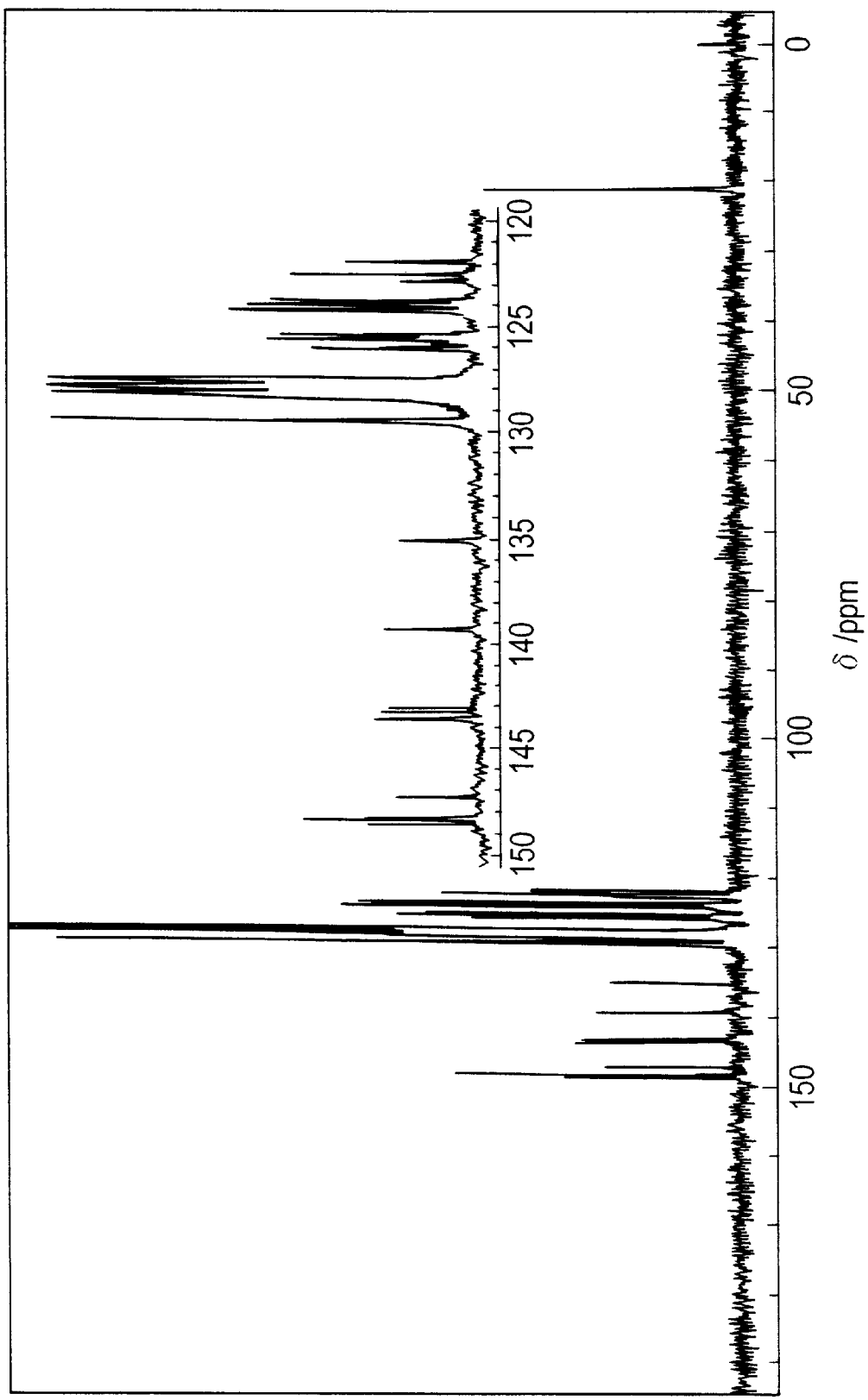
FIG. 12 is a 13C-NMR spectral diagram for synthesis example 5.
Figure 13:
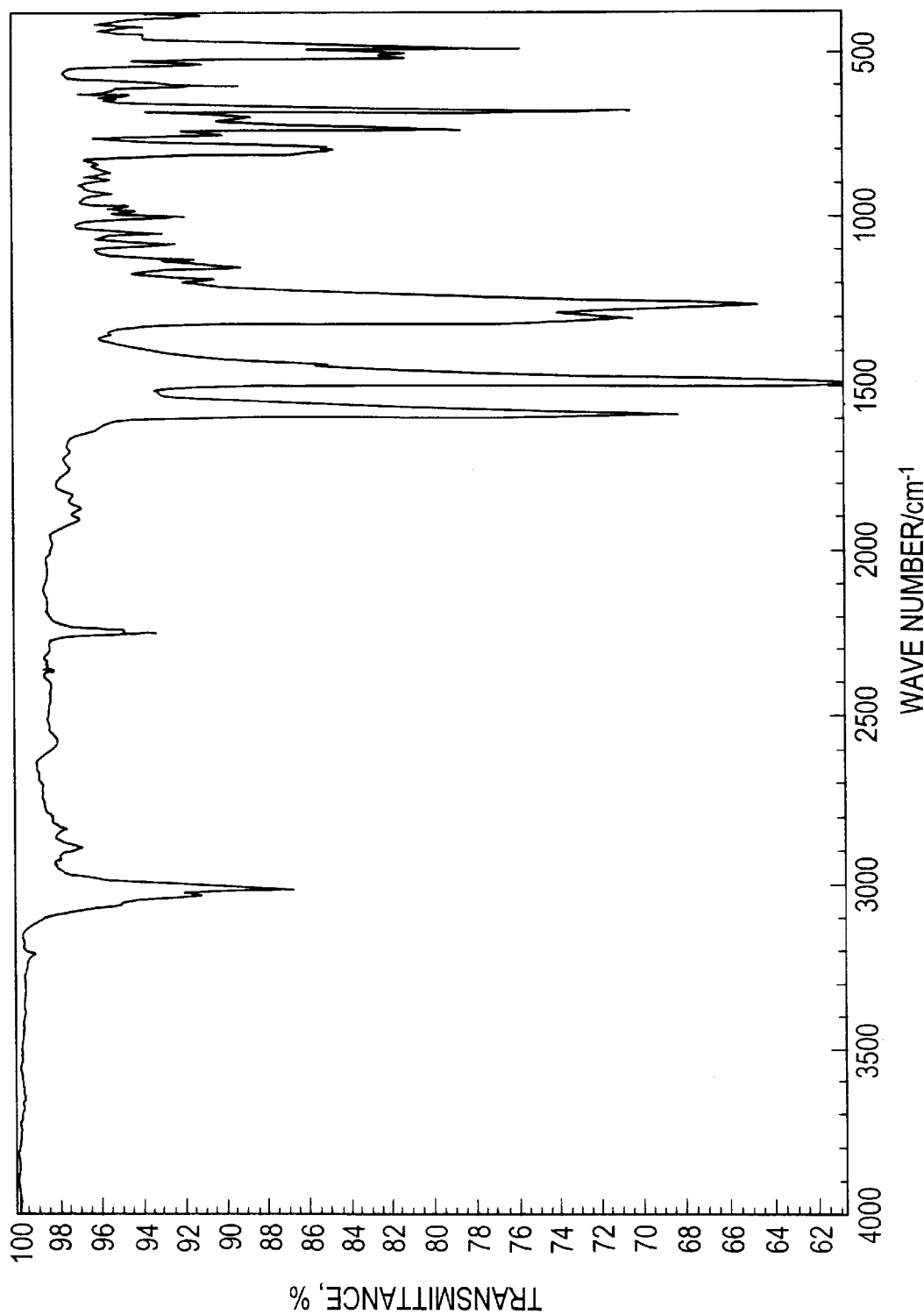
FIG. 13 is an infrared absorption spectral diagram for synthesis example 5.

Mass spectrometry: m/e 1184(M⁺)
$^1$H-NMR spectra are shown in FIG. 11.
$^{13}$C-NMR spectra are shown in FIG. 12.
Infrared absorption spectra are shown in FIG. 13.
Differential scanning calorimetry (DSC)
Melting point: unmeasurable because of amorphism
Glass transition temperature (DSC): 122° C.

Figure 15:
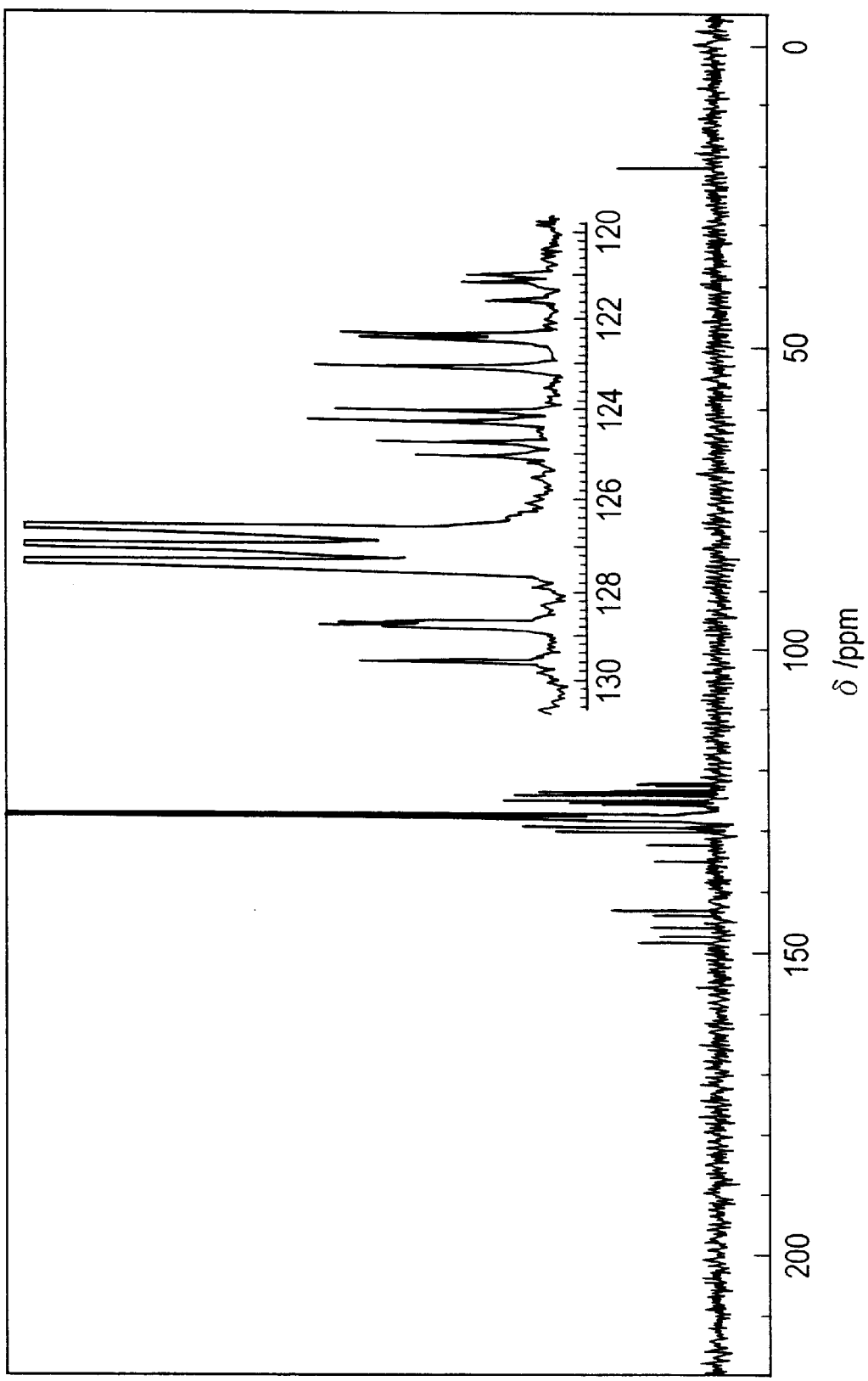
FIG. 15 is a 13C-NMR spectral diagram for synthesis example 6.
Figure 16:
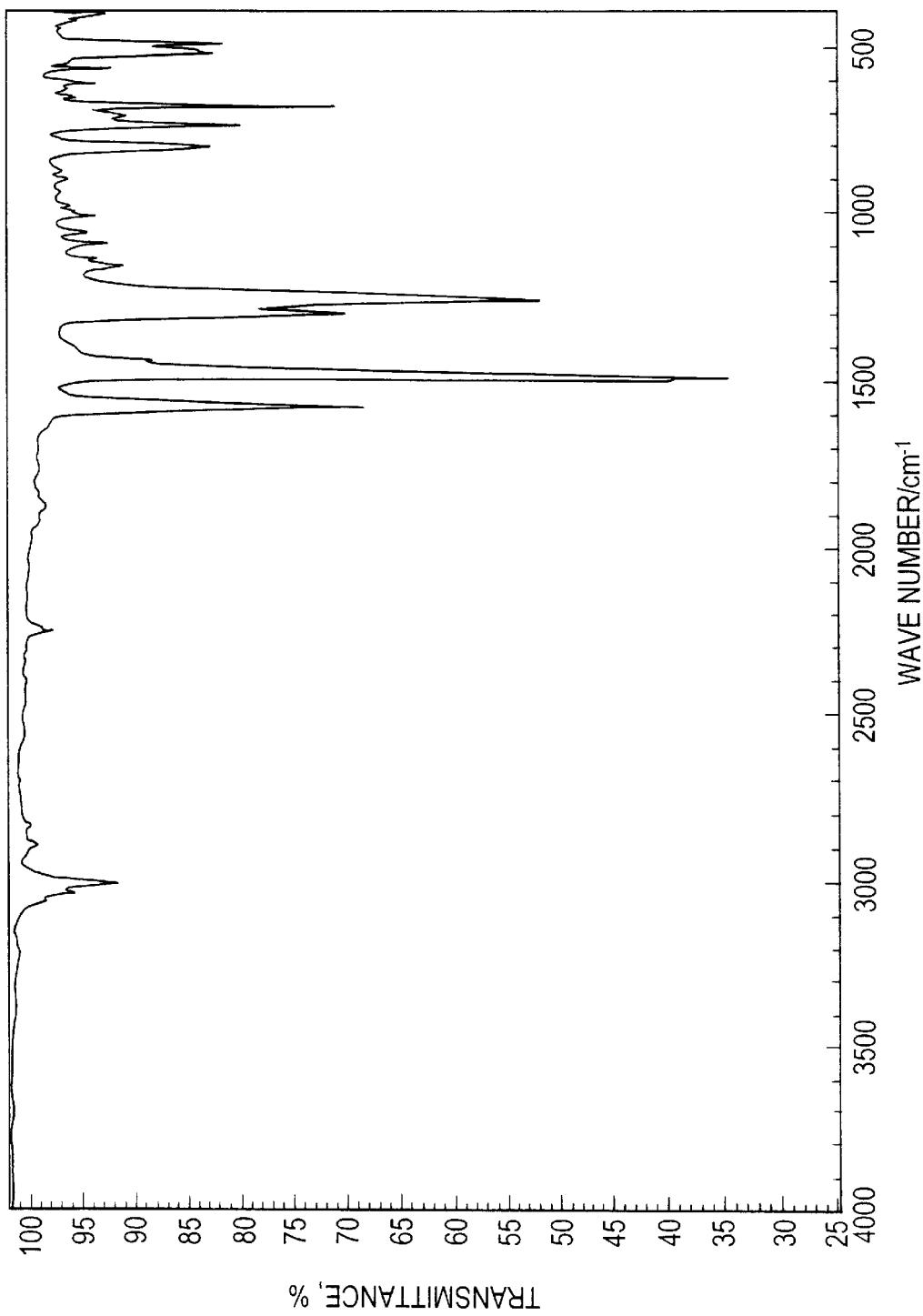
FIG. 16 is an infrared absorption spectral diagram for synthesis example 6.

$^{13}$C-NMR spectra are shown in FIG. 15.
Infrared absorption spectra are shown in FIG. 16.
Differential scanning calorimetry (DSC)
Melting point: unmeasurable because of amorphism
Glass transition temperature (DSC): 126° C.

Synthesis Example 6

Synthesis of N,N'-diphenyl-N,N'-bis{N-phenyl-N-[N-phenyl-N-4-tolyl(4-aminophenyl)](4-aminophenyl)}benzidine
(HIM74: compound No. 25)

N,N'-diphenyl-N,N'-bis[N-phenyl-N-[N-phenyl-N-4-tolyl(4-aminophenyl)](4-aminophenyl)]benzidine referred to below as HIM74 was obtained as in synthesis example 5 with the exception that 4-iodotoluene was used instead of 3-iodotoluene.

Synthesis Example 7

Synthesis of N,N'-diphenyl-N,N'-bis{N-phenyl-N-[N-phenyl-N-1-naphthyl(4-aminophenyl)](4-aminophenyl)}benzidine
(HIM78: compound No. 40

N,N'-diphenyl-N,N'-bis{N-phenyl-N-[N-phenyl-N-1-naphthyl (4-aminophenyl)](4-aminophenyl)}benzidine referred to below as HIM 78 was obtained as in synthesis example 5 with the exception that 1-iodonaphthalene was used instead of 3-iodotoluene.

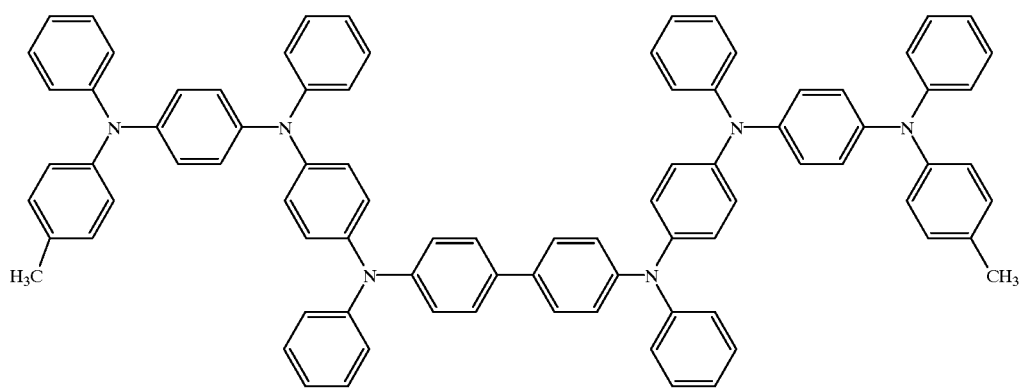

HIM74

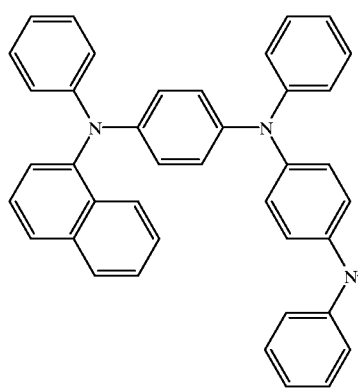
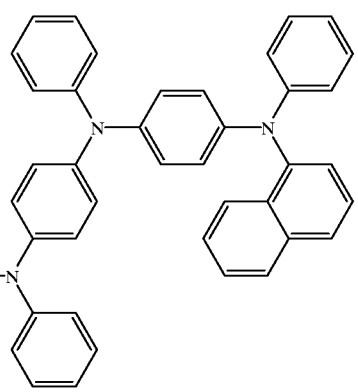

HIM78

Mass spectrometry: m/e 1256(M⁺)

Figure 17:
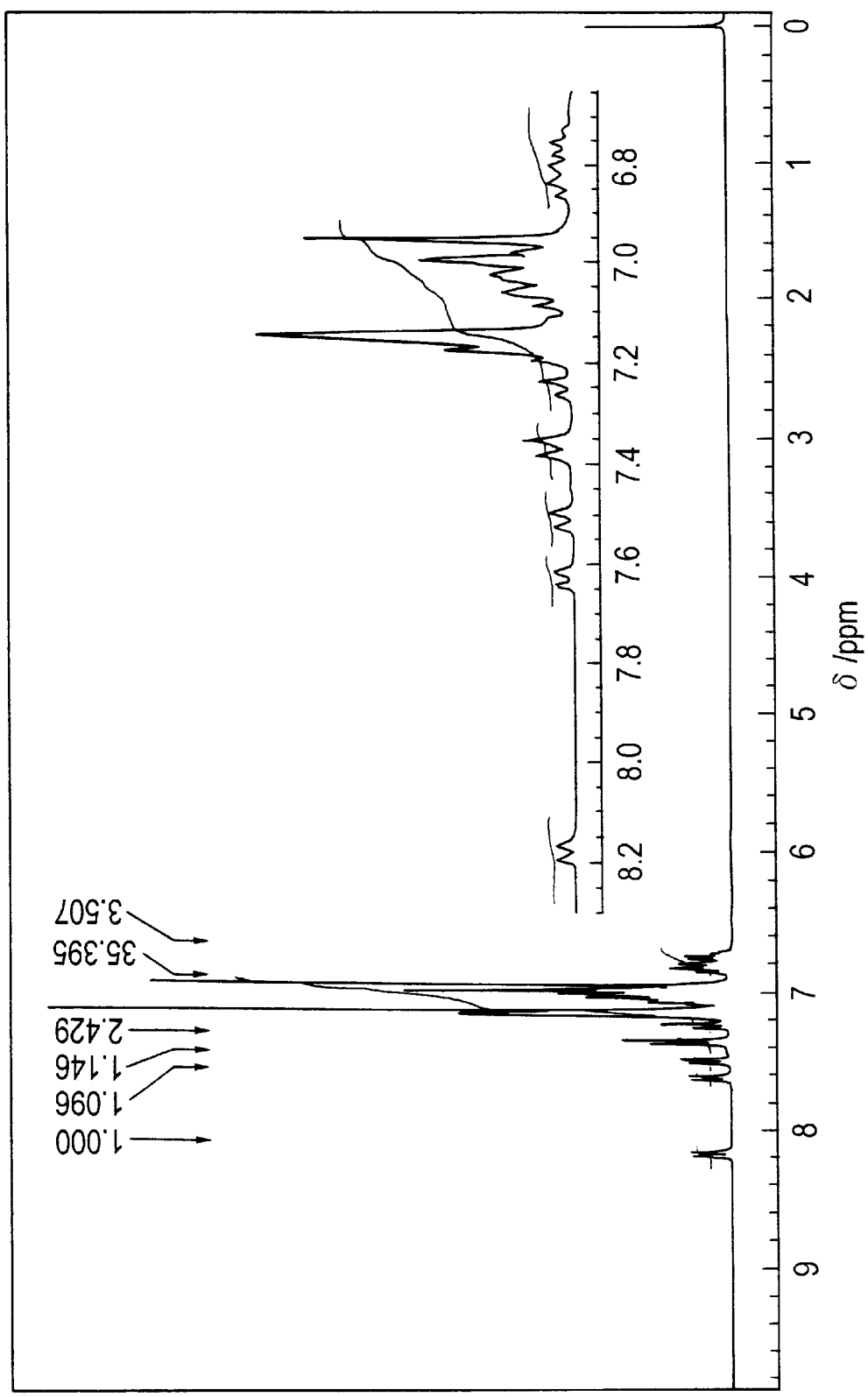
FIG. 17 is a $^1$H-NMR spectral diagram for synthesis example 7.

$^1$H-NMR spectra are shown in FIG. 17.

Figure 18:
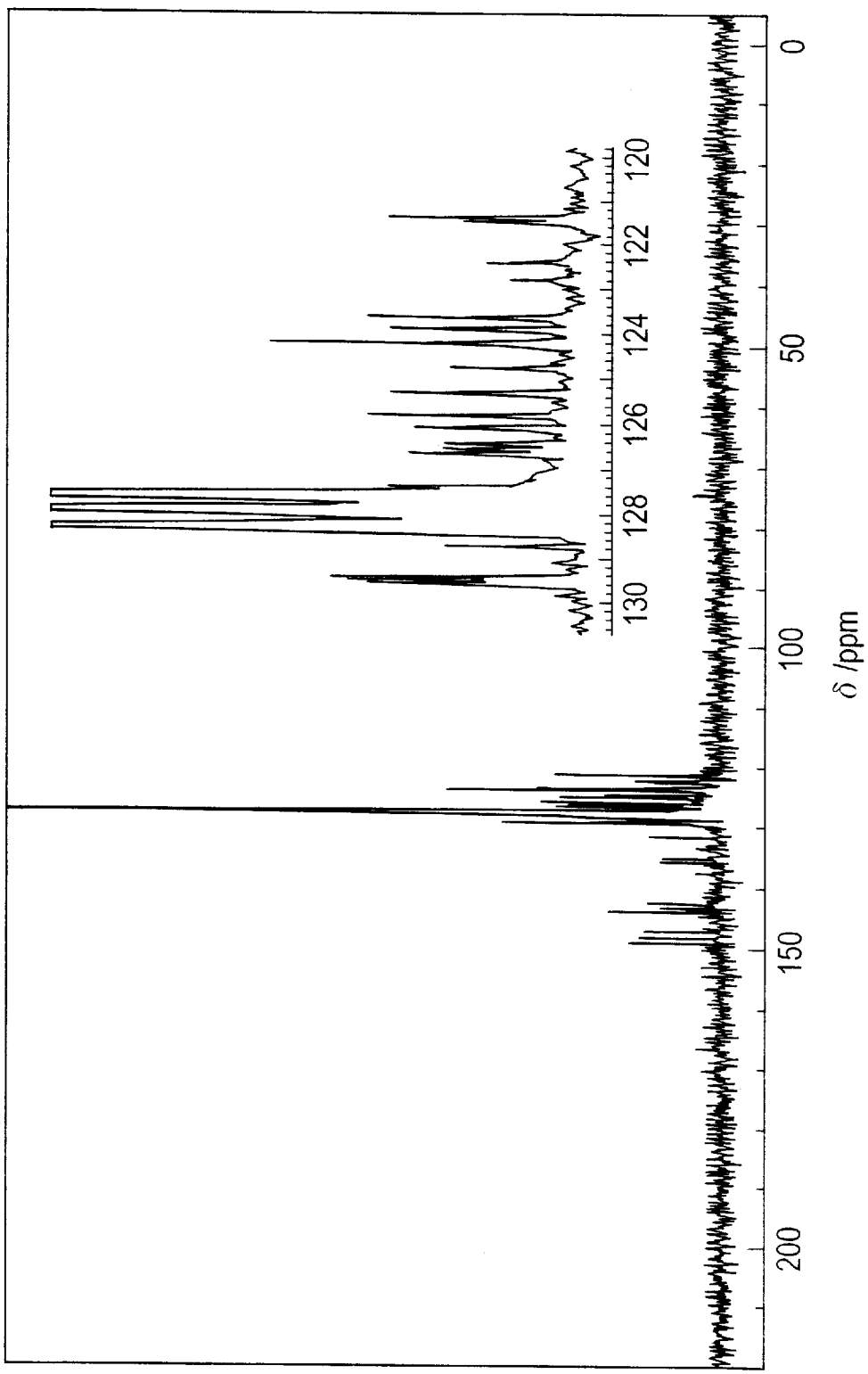
FIG. 18 is a $^{13}$C-NMR spectral diagram for synthesis example 7.

$^{13}$C-NMR spectra are shown in FIG. 18.

Figure 19:
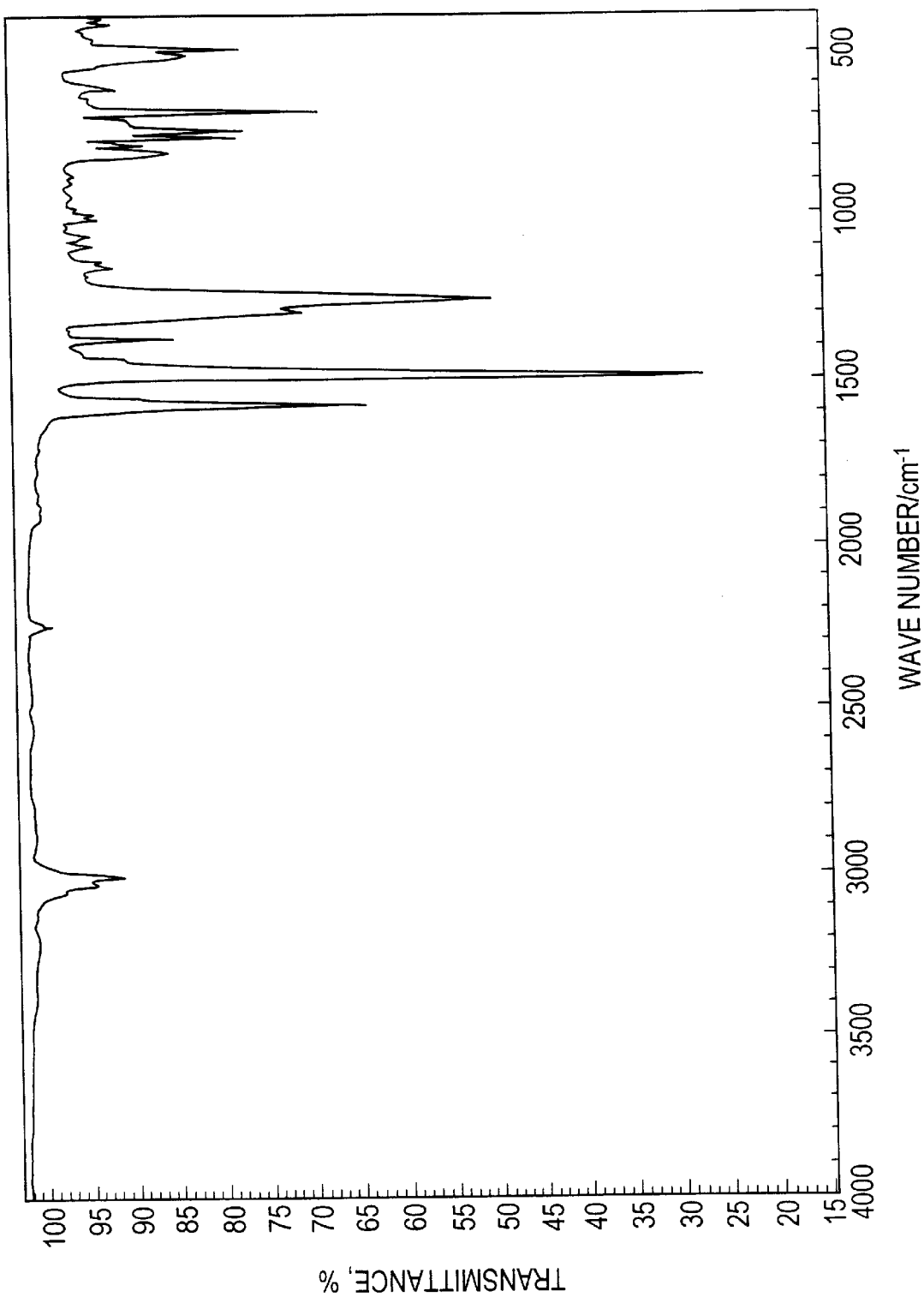
FIG. 19 is an infrared absorption spectral diagram for synthesis example 7.

Infrared absorption spectra are shown in FIG. 19.

Differential scanning calorimetry (DSC)

Melting point: unmeasurable because of amorphism

Glass transition temperature (DSC): 138° C.

Synthesis Example 8

Synthesis of N,N"-diphenyl-N,N"-bis[N-phenyl-N-3-tolyl(4-aminophenyl)]-1,1"-terphenyl-4,4"-diamine (HTL103: compound No. 359)

In a 1,000 ml reaction vessel 26 grams of 4,4"-diamino-p-terphenyl were suspended in 200 ml of pure water and 100 ml of concentrated hydrochloric acid for stirring. Then, the vessel was immersed in an ice bath and cooled therein down to 5° C. or lower. Following this, an aqueous solution of 15 grams of sodium nitrite dissolved in 200 ml of pure water was slowly added dropwise to the suspension, which was in turn brought up to room temperature for a 2-hour stirring. An organic layer was extracted from the reaction solution with ethyl acetate; followed by washing and drying. The obtained brown liquid was purified three times by means of a silica gel column to obtain 30 grams of 4,4"-diiodo-p-terphenyl.

In a 200 ml reaction vessel 21 grams of N,N'-diphenyl-N-3-tolylphenylenediamine and 10 grams of 4,4"-diiodo-p-terphenyl were heated together with 0.3 grams of activated copper powders, 50 grams of potassium carbonate and 50 ml of decalin at an oil bath temperature of 200° C. for 24 hours in an Ar atmosphere. After the completion of the reaction, the reaction solution was filtrated with the addition of 100 ml of toluene thereto for removal of insolubles, and the filtrate was washed with water and dried over sodium sulfate. Following this, the solvent was removed by distillation from the filtrate, and the residue was purified twice by means of a silica gel column (using a mixed solvent of n-hexane and toluene as a developing solvent), thereby obtaining 15 grams of N,N"-diphenyl-N,N"-bis[N-phenyl-N-3-tolyl(4-aminophenyl)]-1,1"-terphenyl-4,4"-diamine referred to below as HTL103.

HTL103

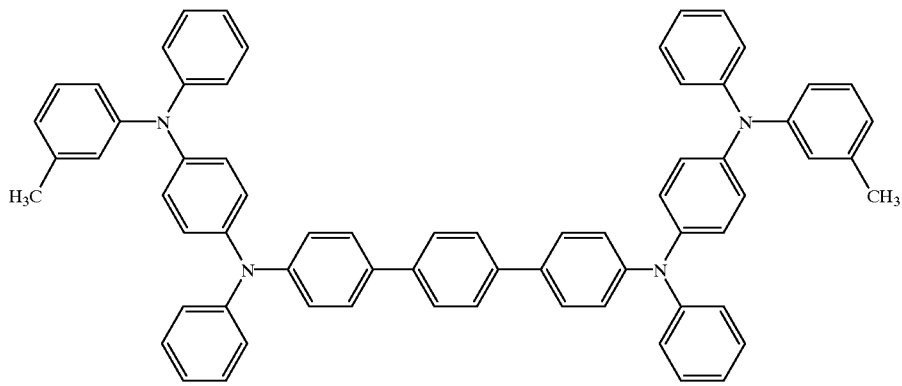

Mass spectrometry: m/s 926(M⁺)

Synthesis Example 9

Another synthesis of N,N'-dipenyl-N,N"-bis(N,N-diphenylaminophenyl)benzidine (HIM30: compound No. 1)

In synthesis example 1, iodobenzene was used instead of 3-iodotoluene.

Mass spectrometry: m/e 822(M⁺)

Differential scanning calorimetry (DSC)
Melting point: 246° C.
Glass transition temperature (DSC): 107° C.
Crystallization temperature: 212° C.

The crystallinity of this compound is somewhat higher than those of the compounds of synthesis examples 1 to 8. However, this compound yielded a film of amorphous physical properties upon evaporation.

Example 1

A glass substrate having a 100 nm-thick ITO transparent electrode (a hole injecting electrode) was ultrasonically washed with neutral detergent, acetone, and ethanol, and then pulled up from boiling ethanol, followed by drying. This substrate was cleaned with UV/$O_3$, and fixed to a substrate holder in a vacuum evaporation system, which was evacuated to a vacuum of $1 \times 10^{-6}$ Torr ($10^{-4}$ Pa).

Then, the aforesaid N,N'-diphenyl-N,N'-bis[N-phenyl-N-3-tolyl(4-aminophenyl)]benzidine (HIM33: compound No. 3) was evaporated at a deposition rate of 0.2 nm/sec. to a thickness of 50 nm to form a hole injecting layer.

N,N,N',N'-tetrakisbis-(-3-biphenyl-1-yl)benzidine (TPD) having such a structure as given below and rubrene were co-evaporated at a weight ratio of 10:1 and a deposition rate of 0.2 nm/sec. to a thickness of 20 nm to form a emitting hole transporting layer.

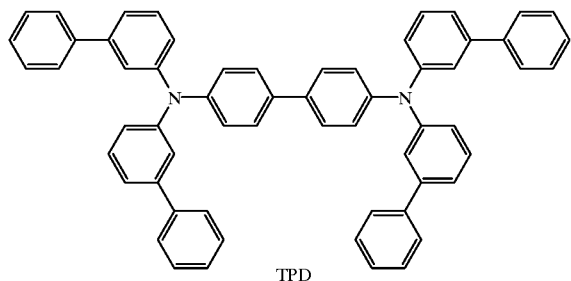

TPD

With the vacuum still kept, tris(quinolinolato)aluminum (Alq$^3$) was evaporated at a deposition rate of 0.2 nm/sec. to a thickness of 50 nm to form a light emitting and electron injecting/transporting layer.

With the vacuum still kept, MgAg (having a weight ratio of 10:1) was evaporated at a deposition rate of 0.2 nm/sec. to a thickness of 200 nm to form an electron injecting electrode. Finally, Al was evaporated to a thickness of 100 nm to form a protective layer, thereby obtaining an organic EL device.

Voltage was applied across this organic EL device so that a current was passed therethrough. Consequently, the device was found to emit yellow light of 25,200 cd/m$^2$ (with a light emission maximum wavelength λmax=565 nm and chromaticity coordinates of x=0.47 and y=0.51) at 12 V and 850 mA/cm$^2$. This light emission remained stable over a period of 10,000 hours or longer in a dry argon atmosphere. Nowhere in the device were the occurrence and growth of local non-emitting spots observed. When the device was driven with a constant current of 30 mA/cm$^2$, the half life of luminance was 500 hours (with an initial luminance of 2,030 cd/m$^2$, an initial driving voltage of 6.55 V, and a driving voltage increase of 3.5 V).

In another test run, a similarly fabricated device was allowed to stand alone in a high temperature vessel of 85° C., and 100° C. The light emitting surface was found to be free of any variation even after the lapse of 500 hours. Nowhere in the device were the occurrence and growth of dark spots of 0.1 mm or greater observed.

Example 2

A device was prepared as in example 1 with the exception that N,N'-diphenyl-N,N'-bis[N-phenyl-N-4-tolyl(4-aminophenyl)]benzidine (HIM34: compound No. 2) was used in place of the aforesaid HIM33 (compound No. 3).

Voltage was applied across this organic EL device so that a current was passed therethrough. Consequently, the device was found to emit yellow light of 26,000 cd/m$^2$ (with a light emission maximum wavelength λmax=565 nm and chromaticity coordinates of x=0.47 and y=0.51) at 12 V and 720 mA/cm$^2$. This light emission remained stable over a period of 10,000 hours or longer in a dry nitrogen atmosphere. Nowhere in the device were the occurrence and growth of local non-emitting spots observed. When the device was driven with a constant current of 30 mA/cm$^2$, the half life of luminance was 800 hours.(with an initial luminance of 2,040 cd/m$^2$, an initial driving voltage of 6.59 V, and a driving voltage increase of 3.0 V).

In another test run, a similarly fabricated device was allowed to stand alone in a high temperature vessel of 85° C., and 100° C. The light emitting surface was found to be free of any variation even after the lapse of 500 hours. Nowhere in the device were the occurrence and growth of dark spots of 0.1 mm or greater observed.

Example 3

A device was prepared as in example 1 with the exception that N,N'-diphenyl-N,N'-bis[N-phenyl-N-4-tolyl(4-aminophenyl)]benzidine (HIM38: compound No. 16) was used in place of the aforesaid HIM33 (compound No. 3).

Voltage was applied across this organic EL device so that a current was passed therethrough. Consequently, the device was found to emit yellow light of 26,000 cd/m$^2$ (with a light emission maximum wavelength λmax=565 nm and chromaticity coordinates of x=0.48 and y=0.50) at 12 V and 825 mA/cm$^2$. This light emission remained stable over a period of 10,000 hours or longer in a dry nitrogen atmosphere. Nowhere in the device were the occurrence and growth of local non-emitting spots observed. When the device was driven with a constant current of 30 mA/cm$^2$, the half life of luminance was 1,600 hours (with an initial luminance of 1,923 cd/m$^2$, an initial driving voltage of 6.59 V, and a driving voltage increase of 1.5 V).

In another test run, a similarly fabricated device was allowed to stand alone in a high temperature vessel of 85° C., and 100° C. The light emitting surface was found to be free of any variation even after the lapse of 500 hours. Nowhere in the device were the occurrence and growth of dark spots of 0.1 mm or greater observed.

Example 4

A device was prepared as in example 1 with the exception that N,N'-diphenyl-N,N'-bis{N-phenyl-N-[N-3-tolyl-N-phenyl(4-aminophenyl)](4-aminophenyl)}benzidine (HIM73: compound No 26) was used for the aforesaid HIM 33 (compound No. 3).

Voltage was applied across this organic EL device so that a current was passed therethrough. Consequently, the device was found to emit yellow light of 24,800 cd/m$^2$ (with a light emission maximum wavelength λmax=565 nm and chromaticity coordinates of x=0.49 and y=0.50) at 13 V and 1,155 mA/cm². This light emission remained stable over a period of 10,000 hours or longer in a dry nitrogen atmosphere. Nowhere in the device were the occurrence and growth of local non-emitting spots observed. When the device was driven with a constant current of 30 mA/cm², the half life of luminance was 1,000 hours (with an initial luminance of 1,841 cd/m², an initial driving voltage of 6.76 V, and a driving voltage increase of 2.5 V).

In another test run, a similarly fabricated device was allowed to stand alone in a high temperature vessel of 85° C., and 120° C. The light emitting surface was found to be free of any variation even after the lapse of 500 hours. Nowhere in the device were the occurrence and growth of dark spots of 0.1 mm or greater observed.

Example 5

A device was prepared as in example 1 with the exception that N,N'-diphenyl-N,N'-bis{N-phenyl-N-[N-phenyl-N-4-tolyl(4-aminophenyl)](4-aminophenyl)}benzidine (HIM74: compound No. 25) was used for the aforesaid HIM33 (compound No. 3).

Voltage was applied across this organic EL device so that a current was passed therethrough. Consequently, the device was found to emit yellow light of 24,800 cd/m² (with a light emission maximum wavelength λmax=564 nm and chromaticity coordinates of x=0.49 and y=0.50) at 13 V and 1,155 mA/cm². This light emission remained stable over a period of 10,000 hours or longer in a dry nitrogen atmosphere. Nowhere in the device were the occurrence and growth of local non-emitting spots observed. When the device was driven with a constant current of 30 mA/cm², the half life of luminance was 1,000 hours (with an initial luminance of 1,841 cd/m², an initial driving voltage of 6.76 V, and a driving voltage increase of 1.5 V).

In another test run, a similarly fabricated device was allowed to stand alone in a high temperature vessel of 85° C., and 120° C. The light emitting surface was found to be free of any variation even after the lapse of 500 hours. Nowhere in the device were the occurrence and growth of dark spots of 0.1 mm or greater observed.

Example 6

A device was prepared as in example 1 with the exception that N,N'-diphenyl-N,N'-bis[N-phenyl-N-4-tolyl(4-aminophenyl)]benzidine (HIM35: compound No. 10) or N,N'-diphenyl-N,N'-bis{N-phenyl-N-[N-phenyl-N-1-naphthyl(4-aminophenyl)](4-aminophenyl)}benzidine (HIM78: compound No. 40) was used in place of the aforesaid HIM33 (compound No. 3). Equivalent results as in example 1 were obtained. Even with other exemplified compounds, equivalent results were obtained.

Example 7

A device was prepared as in example 1. Instead of the emitting hole transporting layer of example 1, however, a emitting hole transporting and light emitting layer was formed by mixing a hole transporting material TPD, rubrene, i.e., a light emitting material having such a structure as given below and aluminum quinolinol (Alq³), i.e., an electron injecting material having such a structure as given below at a weight mixing ratio of 5:5:1 to form a mixed layer of 40 nm in thickness by means of triple co-evaporation. Thereafter, aluminum quinolinol (Alq³) was evaporated to a thickness of 30 nm.

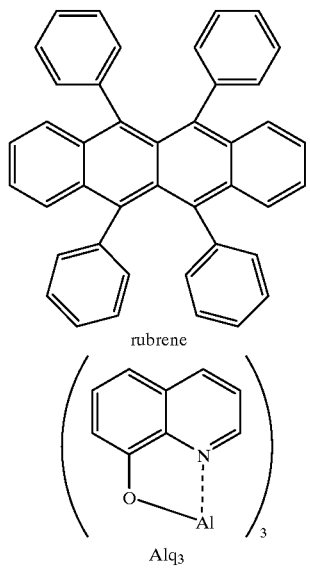

Voltage was applied across this organic EL device so that a current was passed therethrough. Consequently, the device was found to emit yellow light of 26,300 cd/m² (with a light emission maximum wavelength λmax=565 nm and chromaticity coordinates of x=0.49 and y=0.51) at 13 V and 980 mA/cm². This light emission remained stable over a period of 10,000 hours or longer in a dry nitrogen atmosphere. Nowhere in the device were the occurrence and growth of local non-emitting spots observed. When the device was driven with a constant current of 30 mA/cm², the half life of luminance was 30,000 hours (2,350 cd/m² and a driving voltage increase of 1.0 V), and the half life was 10,000 hours or longer when the initial luminance was 300 cd/m².

In another test run, a similarly fabricated device was allowed to stand alone in a high temperature vessel of 85° C. The light emitting surface was found to be free of any variation even after the lapse of 500 hours. Nowhere in the device were the occurrence and growth of dark spots of 0.1 mm or greater observed.

Example 8

The emitting hole transporting layer of example 1 was formed of TPD alone, the thickness of the Alq³ light emitting layer was changed to 10 nm, and a tetraphenylethene or phenylanthracene layer of 30 nm in thickness was interleaved between the hole transporting layer and the light emitting layer. Consequently, equivalent results as mentioned above were obtained.

Comparative Example 1

A device was prepared as in example 1 with the exception that 4,4',4"-tris[-N-(-3-methylphenyl)-N-phenylamino] triphenylamine (MTDATA) having such a structure as given below was used in place of HIM33 (compound No. 3).

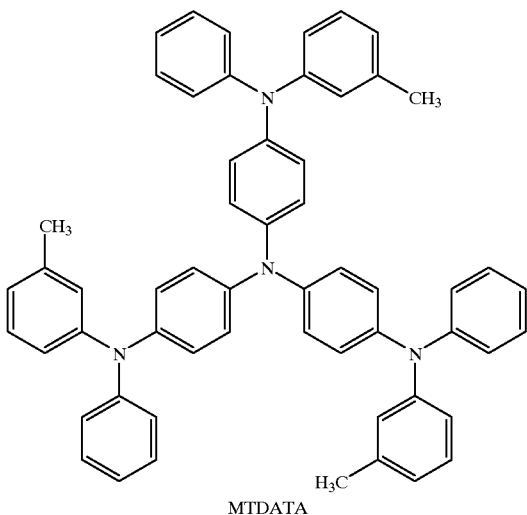

MTDATA

Voltage was applied across this organic EL device so that a current was passed therethrough. Consequently, the device was found to emit yellow light of 21,400 cd/m² (with a light emission maximum wavelength λmax=565 nm and chromaticity coordinates of x=0.48 and y=0.50) at 14 V and 767 mA/cm². This light emission remained stable over a period of 10,000 hours or longer in a dry nitrogen atmosphere. When the device was driven with a constant current of 30 mA/cm², the half life of luminance was 400 hours (2,120 cd/m², an initial driving voltage of 7.9 V, and a driving voltage increase of 4.5 V).

In another test run, a similarly fabricated device was allowed to stand alone in a high temperature vessel of 85° C. Variations in the light emitting surface were already observed after the lapse of 10 hours. Dark spots occurred and continued to grow.

Comparative Example 2

A device was prepared as in example 1 with the exception that copper phthalocyanine having such a structure as given below and a thickness of 10 nm was used for HIM33 (compound No. 3).

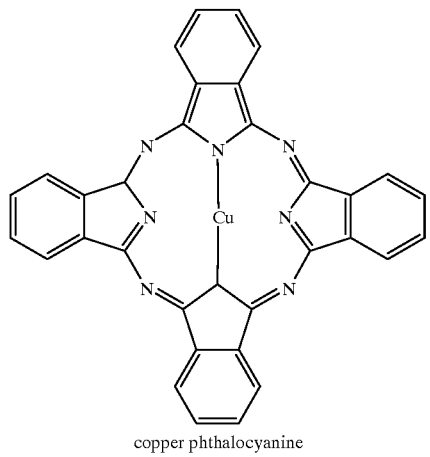

copper phthalocyanine

Voltage was applied across this organic EL device so that a current was passed therethrough. Consequently, the device was found to emit yellow light of 21,000 cd/m² (with a light emission maximum wavelength λmax=565 nm and chromaticity coordinates of x=0.49 and y=0.50) at 14 V and 532 mA/cm². When the device was driven with a constant current of 30 mA/cm², the half life of luminance was found to be 200 hours (1,873 cd/m², an initial driving voltage of 6.50 V, and a driving voltage increase of 8.0 V). Thereafter, no precise luminance could be measured due to growing dark spots.

In another test run, a similarly fabricated device was allowed to stand alone in a high temperature vessel of 85° C. Variations in the light emitting surface were already observed after the lapse of 10 hours. Dark spots occurred and continued to grow.

Example 9

A glass substrate having a 100 nm-thick ITO transparent electrode (a hole injecting electrode) was ultrasonically washed with neutral detergent, acetone, and ethanol, and then pulled up from boiling ethanol, followed by drying. This substrate was cleaned with UV/O$_3$, and fixed to a substrate holder in a vacuum evaporation system, which was evacuated to a vacuum of $1\times10^{-6}$ Torr ($10^{-4}$ Pa).

Then, the aforesaid N,N'-diphenyl-N,N'-bis[N-phenyl-N-4-tolyl(4-aminophenyl)]benzidine (HIM34: compound No. 2) was evaporated at a deposition rate of 2 nm/sec. to a thickness of 200 nm.

With the vacuum still kept, Al was evaporated at a deposition rate of 2 nm/sec. to a thickness of 200 nm to form an electron injecting electrode, thereby obtaining a single layer device.

Upon the application of voltage to this device, a current of 100 mA/cm² was passed at 5 V through it. When the device was driven with a constant current of 100 mA/cm², the current flowed in a stable manner over 1,000 hours. In the meantime, a voltage increase was 0.5 V. Furthermore, the voltage vs. current density characteristics of this device were measured. The results are shown in FIG. 20.

After the lamination on the device of the aforesaid N,N'-diphenyl-N,N'-bis[N-phenyl-N-4-tolyl(4-aminophenyl)]benzidine (HIM34: compound No. 2), the Hole mobility was found to be $2.7\times10^{31\ 3}$ cm²/Vs as measured by the time-of-flight method. This value is at least twice as high as that of a general hole injecting and transporting material TPD, i.e., N,N'-bis(3-methylphenyl)-N,N'-diphenyl-1,1'-biphenyl-4,4'-diamine.

Comparative Example 3

A device was obtained as in example 9 with the exception that the aforesaid MTDATA was used in place of HIM34.

Upon the application of voltage to this device, a current of barely 20 mA/cm² was passed at 5 V through it. When the device was driven with a constant current of 100 mA/cm², the current flowed in a stable manner over 1,000 hours. In the meantime, however, a voltage increase was as large as 3.1 V. Furthermore, the voltage vs. current density characteristics of the device were measured. The results are shown in FIG. 20.

As can be seen from FIG. 20, the device of the invention makes it possible to obtain a much higher current density at the same voltage because of its enhanced hole supply efficiency.

Example 10

An organic EL device was prepared as in example 2 with the exception that the thickness of the hole injecting layer containing N,N'-diphenyl-N,N'-bis[N-phenyl-N-4-tolyl(4-amino-phenyl)]benzidine (HIM34: compound No. 2) was changed from 50 nm to 300 nm.

Voltage was applied across this organic EL device so that a current was passed therethrough. Consequently, the device was found to emit yellow light of 24,500 cd/m$^2$ (with a light emission maximum wavelength λmax=565 nm and chromaticity coordinates of x=0.47 and y=0.51) at 13 V and 800 mA/cm$^2$. This light emission remained stable over a period of 10,000 hours or longer in a dry argon atmosphere. Nowhere in the device were the occurrence and growth of local non-emitting spots observed. When the device was driven with a constant current of 30 mA/cm$^2$, the half life of luminance was 1,500 hours (with an initial luminance of 1,800 cd/m$^2$, an initial driving voltage of 7.6 V, and a driving voltage increase of 3.0 V).

In another test run, a similarly fabricated device was allowed to stand alone in a high temperature vessel of 85° C. The light emitting surface was found to be free of any variation even after the lapse of 500 hours. Nowhere in the device were the occurrence and growth of dark spots of 0.1 mm or greater observed.

From the results mentioned above, it is understood that even when the layer containing the compound of the invention is thick, there is no substantial driving voltage increase.

APPLICABILITY OF THE INVENTION TO INDUSTRY

The organic EL device constructed using the compound of the invention is substantially free from a driving voltage increase or a luminance drop and a current leakage with neither development nor growth of local non-emitting spots while it is driven, and so is capable of emitting light with high luminance, and high reliability such as high heat resistance. According to the invention, the optimum work function can be imparted to a hole injecting electrode or an organic material combined therewith, so that a device emitting light continuously with high reliability can be achieved.

Furthermore, it is possible to achieve an organic EL device having high Hole mobility and ever higher current density.

What we claim is:

1. An organic EL device comprising a cathode, an anode, and at least one organic compound layer, wherein at least one said organic compound layer comprises an organic compound represented by formula (I):

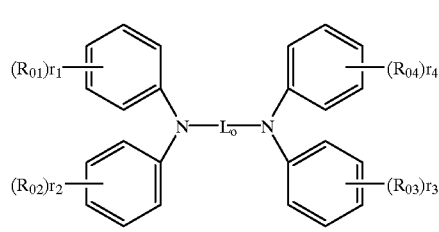

(I)

where $L_0$ is any one of o-, p-, and m-phenylene groups which have two, three or four rings and which have a substituent with the proviso that when $L_0$ is a phenylene group having four rings, the phenylene group may have an unsubstituted or substituted aminophenyl group somewhere therein, and $R_{01}$, $R_{02}$, $R_{03}$ and $R_{04}$ are any one of the following groups:

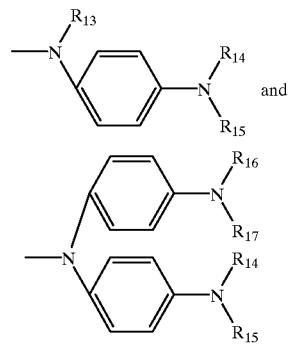

and where $R_{13}$, $R_{14}$, $R_{15}$, $R_{16}$ and $R_{17}$ are each a substituted or unsubstituted aryl group, and $r_1$, $r_2$, $r_3$ and $r_4$ are each an integer of 0 to 5 with the proviso that $r_1+r_2+r_3+r_4 \geq 1$.

2. The organic EL device of claim 1, wherein $L_0$ is a 4,4'-biphenylene group.

3. The organic EL device of claim 1, further comprising at least two organic compound layers, wherein said organic compound layer comprising an organic compound represented by formula (I) is a hole injecting and transporting layer.

4. The EL device of claim 3, wherein at least one of said organic compound layers is a light emitting layer containing a hole transporting compound and an electron transporting compound.

5. The organic EL device of claim 4, wherein said light emitting layer is disposed between an organic compound layer having a function of injecting holes and/or transporting holes and an organic layer having a function of transporting electrons and/or injecting electrons.

6. The organic EL device of claim 3 comprising a hole injecting electrode, at least one organic compound layer having a function of injecting and transporting holes, an organic compound layer having a function of transporting holes, a light emitting layer, and an electron injecting electrode laminated on said hole injecting electrode in the described order.

7. The organic EL device of claim 1 comprising three or more layers including at least one organic compound layer having a function of injecting holes and at least one organic compound layer having a function of transporting holes, wherein:
   the organic compound layer having said function of injecting holes comprises said compound of formula (I).

8. The organic EL device of claim 1 comprising a hole injecting electrode, at least one organic compound layer comprising said compound of formula (I), a light emitting layer, and an electron injecting electrode laminated on said hole injecting electrode in the described order.

9. The organic EL device of claim 1, wherein each of said at least one organic compound layer comprising said compound of formula (I) has a thickness of at least 100 nm.

10. The organic EL device of claim 1, wherein each said organic compound layer containing said organic compound represented by formula (I) has a Hole nobility of at least $1.0 \times 10^{-3}$ cm$^2$Vs.

* * * * *